United States Patent
Otsuka et al.

(10) Patent No.: US 10,643,976 B2
(45) Date of Patent: May 5, 2020

(54) ELECTRONIC COMPONENT, AND ELECTRONIC COMPONENT MANUFACTURING METHOD

(71) Applicant: NEC Corporation, Minato-ku, Tokyo (JP)

(72) Inventors: Yurika Otsuka, Tokyo (JP); Tsutomu Takeda, Tokyo (JP); Hironobu Ikeda, Tokyo (JP); Yuki Matsumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/893,944

(22) Filed: Feb. 12, 2018

(65) Prior Publication Data
US 2018/0261577 A1    Sep. 13, 2018

(30) Foreign Application Priority Data

Mar. 8, 2017    (JP) .................. 2017-043631

(51) Int. Cl.
*H01L 25/065*    (2006.01)
*H01L 23/538*    (2006.01)
(Continued)

(52) U.S. Cl.
CPC ...... *H01L 25/0657* (2013.01); *H01L 21/4846* (2013.01); *H01L 23/4985* (2013.01);
(Continued)

(58) Field of Classification Search
CPC ........... H01L 23/49827; H01L 25/0657; H01L 23/5387; H01L 25/0655; H01L 25/105;
H01L 23/49833; H01L 25/50; H01L 24/32; H01L 21/4846; H01L 23/49838; H01L 23/4985; H01L 2224/73253; H01L 2225/0652; H01L 2225/06555; H01L 2224/32145; H01L 2224/32225; H01L 2225/06593; H01L 2225/06527; H01L 2225/06572; H01L 2225/06589;
(Continued)

(56) References Cited

U.S. PATENT DOCUMENTS

2002/0196659 A1* 12/2002 Hurst ................ G11C 8/10
                                                          365/175
2003/0080438 A1   5/2003 Matsuura et al.
(Continued)

FOREIGN PATENT DOCUMENTS

JP    S52-128065 U    9/1977
JP    2003-036684 A    2/2003
(Continued)

OTHER PUBLICATIONS

Japanese Office Action for JP Application No. 2017-043631 dated Mar. 6, 2018 with English Translation.

*Primary Examiner* — Benjamin T Liu

(57) ABSTRACT

An electronic component includes: a plurality of first substrates that are connected in series along a coupling path; and a second substrate that is connected with one first substrate of the plurality of first substrates. The second substrate is in line with the one first substrate along a connection direction intersecting the coupling path, and the plurality of first substrates and the second substrate are configured to be foldable such that they are stacked.

11 Claims, 24 Drawing Sheets

(51) Int. Cl.
*H01L 25/10* (2006.01)
*H01L 23/498* (2006.01)
*H01L 21/48* (2006.01)
*H01L 23/00* (2006.01)
*H01L 25/00* (2006.01)

(52) U.S. Cl.
CPC .. *H01L 23/49833* (2013.01); *H01L 23/49838* (2013.01); *H01L 23/5387* (2013.01); *H01L 24/32* (2013.01); *H01L 25/0655* (2013.01); *H01L 25/105* (2013.01); *H01L 25/50* (2013.01); *H01L 23/49816* (2013.01); *H01L 2224/32145* (2013.01); *H01L 2224/32225* (2013.01); *H01L 2224/73253* (2013.01); *H01L 2225/0652* (2013.01); *H01L 2225/06527* (2013.01); *H01L 2225/06555* (2013.01); *H01L 2225/06572* (2013.01); *H01L 2225/06589* (2013.01); *H01L 2225/06593* (2013.01); *H01L 2924/1435* (2013.01)

(58) Field of Classification Search
CPC ....... H01L 23/49816; H01L 2924/1435; H01L 24/81; H01L 24/83; H01L 2224/81139; H01L 2224/83139; H01L 24/17; H01L 2224/17181; H01L 2224/81801; H01L 2224/83851; H01L 24/13; H01L 24/16; H01L 2224/13101; H01L 2224/16225; H01L 2224/16145; H01L 2924/1434; H01L 2924/14
See application file for complete search history.

(56) References Cited

U.S. PATENT DOCUMENTS

| | | | |
|---|---|---|---|
| 2004/0099938 A1* | 5/2004 | Kang ................ | H01L 23/5387 257/686 |
| 2006/0057866 A1 | 3/2006 | Mirsky et al. | |
| 2007/0230154 A1* | 10/2007 | Nakayama ......... | H01L 23/5385 361/810 |
| 2009/0166838 A1 | 7/2009 | Gokan et al. | |
| 2009/0208167 A1 | 8/2009 | Hodono | |

FOREIGN PATENT DOCUMENTS

| | | |
|---|---|---|
| JP | 2003-133518 A | 5/2003 |
| JP | 2006-508534 A | 3/2006 |
| JP | 2007-266240 A | 10/2007 |
| JP | 2009-158856 A | 7/2009 |
| JP | 2009-192818 A | 8/2009 |

* cited by examiner

ELECTRONIC COMPONENT, AND ELECTRONIC COMPONENT MANUFACTURING METHOD

This application is based upon and claims the benefit of priority from Japanese patent application No. 2017-043631, filed on Mar. 8, 2017, the disclosure of which is incorporated herein in its entirety by reference.

BACKGROUND OF THE INVENTION

Field of the Invention

The present invention relates to a substrate, a circuit substrate, an electronic component, an electronic component assembly, and an electronic component manufacturing method.

Description of Related Art

Among electronic components, there is known a configuration in which a plurality of electronic devices are arranged in a stacked arrangement manner (hereinbelow called a stacked-type electronic component). Among such stacked-type electronic components, many are of the type in which a plurality of electronic devices are mounted on a foldable substrate (for example, refer to Japanese Unexamined Patent Application Publication No. 2009-158856 (hereinbelow Patent Document 1) and Japanese Unexamined Patent Application Publication No. 2003-133518 (hereinbelow Patent Document 2).

Examples of a stacked-type electronic device in which electronic devices are arranged in a multi-layer manner without being mounted on a foldable substrate include for example Japanese Unexamined Patent Application Publication No. 2003-36684 (hereinbelow Patent Document 3).

SUMMARY OF THE INVENTION

In the configurations disclosed in Patent Documents 1 and 2, a substrate prior to folding is extended in one direction, with electronic devices arranged spaced apart in the extending direction of this substrate.

A stacked-type electronic device manufactured using such a substrate is mounted on a wiring substrate via electrodes exposed at the lowest layer of the stacked component. For this reason, the wiring path from the electronic device on the substrate to the electrodes becomes longer as the height of the electronic device in the stacked state increases. The longest wiring length becomes the length equivalent to the length in the long dimension direction of the substrate.

For this reason, the transmission speed of the electronic device with the longest wiring length decreases, and there is the risk of communication noise easily mixing in. Also, since electrical resistance also increases as the wiring length becomes longer, there is also the risk of a rise in heat generation.

Moreover, since the wires on the substrate become more numerous the closer to the electrodes at the lower portion of the stacked-type electronic component, there is also the problem of the number of electronic devices that can be stacked being limited by the surface area at the lower portion of the substrate. Although it is conceivable to increase the surface area of the substrate disposed near the electrodes, doing so leads to an increase in the mounting area of the stacked-type electronic component. As a result, the space-saving effect afforded by adopting a stacked-type substrate is lost.

In the case of a foldable substrate not being employed as disclosed in Patent Document 3, after a plurality of electronic devices are positioned on circuit substrates and arranged in a multi-layer manner, the numerous connection terminals of the devices must be connected to each other. For this reason, manufacture entails considerable time and labor.

An exemplary object of the present invention is to provide an electronic component, and an electronic component manufacturing method that can solve these problems.

According to a first exemplary aspect of the present invention, an electronic component includes: a plurality of first substrates that are connected in series along a coupling path; and a second substrate that is connected with one first substrate of the plurality of first substrates. The second substrate is in line with the one first substrate along a connection direction intersecting the coupling path, and the plurality of first substrates and the second substrate are configured to be foldable such that they are stacked.

According to a second exemplary aspect of the present invention, an electronic component includes: a plurality of first substrates that are capable of being unfolded in a single straight line shape; a second substrate that is connected with any one first substrate among the plurality of first substrates; and an electronic device that is mounted on the first substrate. The plurality of first substrates and the second substrate are folded so as to be stacked. The plurality of first substrates are folded so as to constitute a first layered body. The second substrate constitutes a second layered body that is stacked with the first layered body by being connected extending from the one first substrate so as to follow a first side surface of the first layered body. At least one layer-shaped gap is formed in the first layered body, opens to a second side surface of the first layered body differing from the first side surface, and is sandwiched by layered portions, the layered portions comprising portions of the first layered body or a portion of the first layered body and the second layered body.

According to a third exemplary aspect of the present invention, a method for manufacturing an electronic component includes: preparing a circuit substrate, the a circuit substrate including a plurality of first substrates and a second substrate, the plurality of first substrates being connected in series along a coupling path, an electronic device being arranged on at least one of the plurality of first substrates, and the second substrate being connected with one first substrate of the plurality of first substrates and being in line with the one first substrate along a connection direction intersecting the coupling path; forming a first layered body in which the plurality of first substrates are stacked in a stacking direction by rotating each of the plurality of first substrates about a first axis that intersects the coupling path; bending the second substrate about a second axis that intersects the connection direction and extending the second substrate along a side surface of the first layered body; forming a second layered body by stacking a distal end portion of the second substrate which is extended along the side surface, at one end of the first layered body in the stacking direction; and electrically connecting the first layered body and the second layered body to each other.

According to the electronic component, and the electronic component manufacturing method of an exemplary embodiment of the present invention, it is possible to achieve a mounting space savings even if the mounted quantity of electronic devices is increased, and manufacturing is also easy.

EXEMPLARY EMBODIMENT

Figure 1:
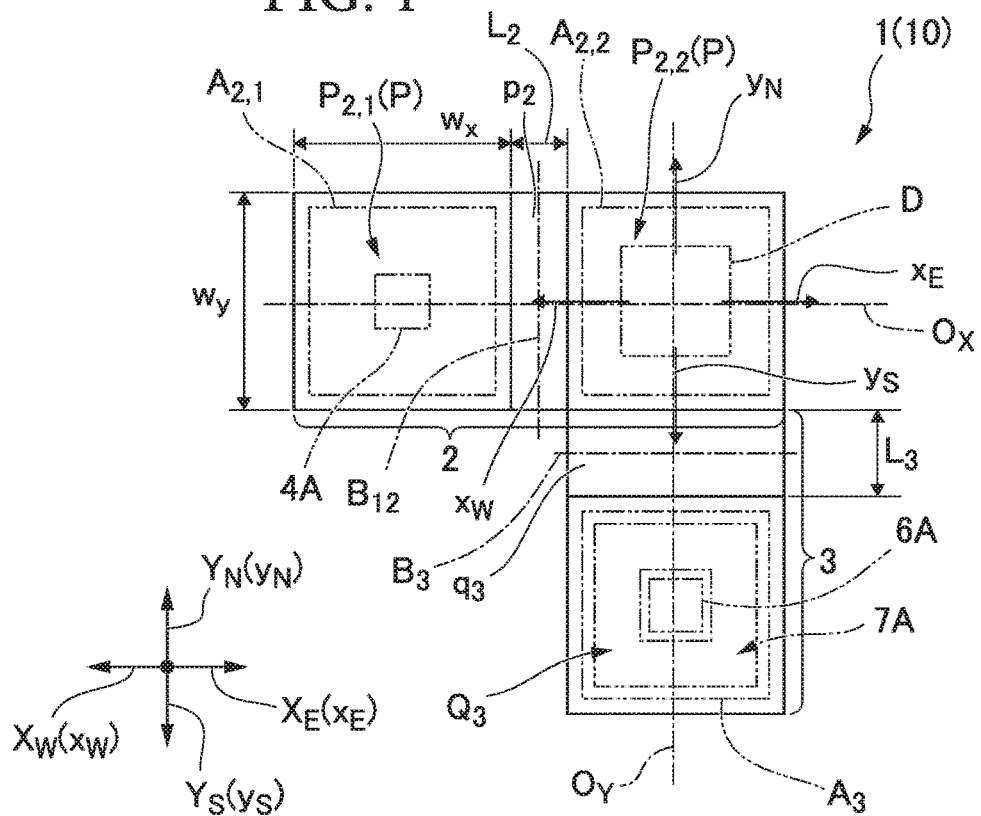
FIG. 1 is a schematic plan view showing an example of the substrate of the first exemplary embodiment of the present invention.

Hereinbelow, exemplary embodiments of the present invention are described with reference to the appended drawings. In all the drawings, even if the exemplary embodiment differs, the same or corresponding members are denoted by the same reference numerals, and hence common description is omitted.

First Exemplary Embodiment

The substrate according to the first exemplary embodiment of the present invention will be described.

Figure 2:
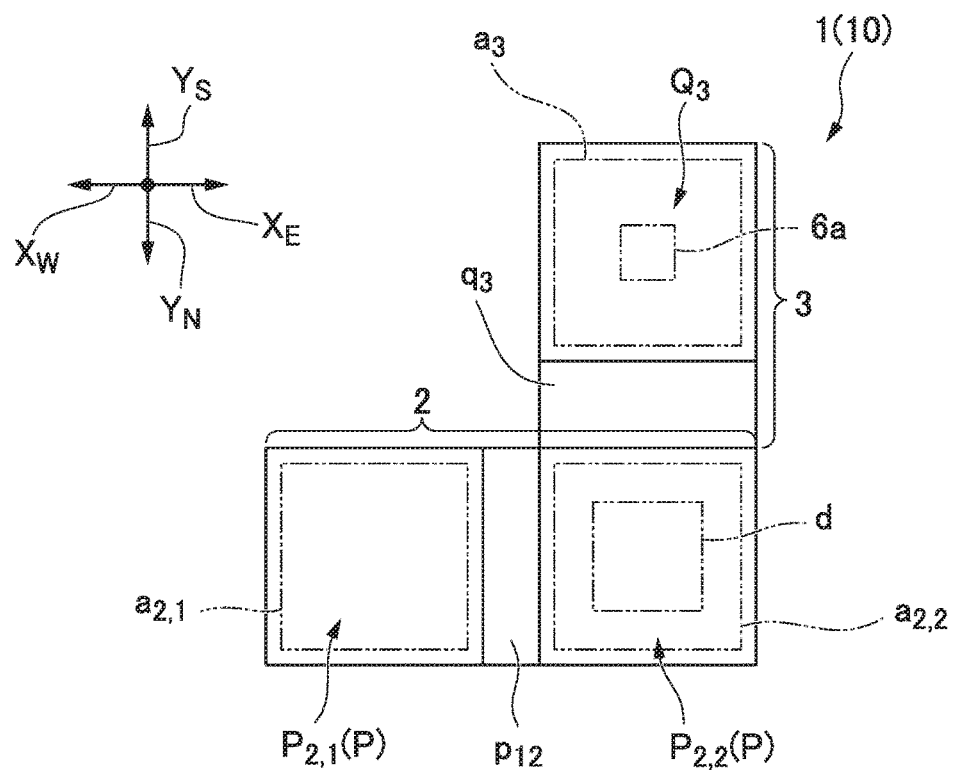
FIG. 2 is a schematic rear view showing an example of the substrate of the first exemplary embodiment of the present invention.
Figure 3:
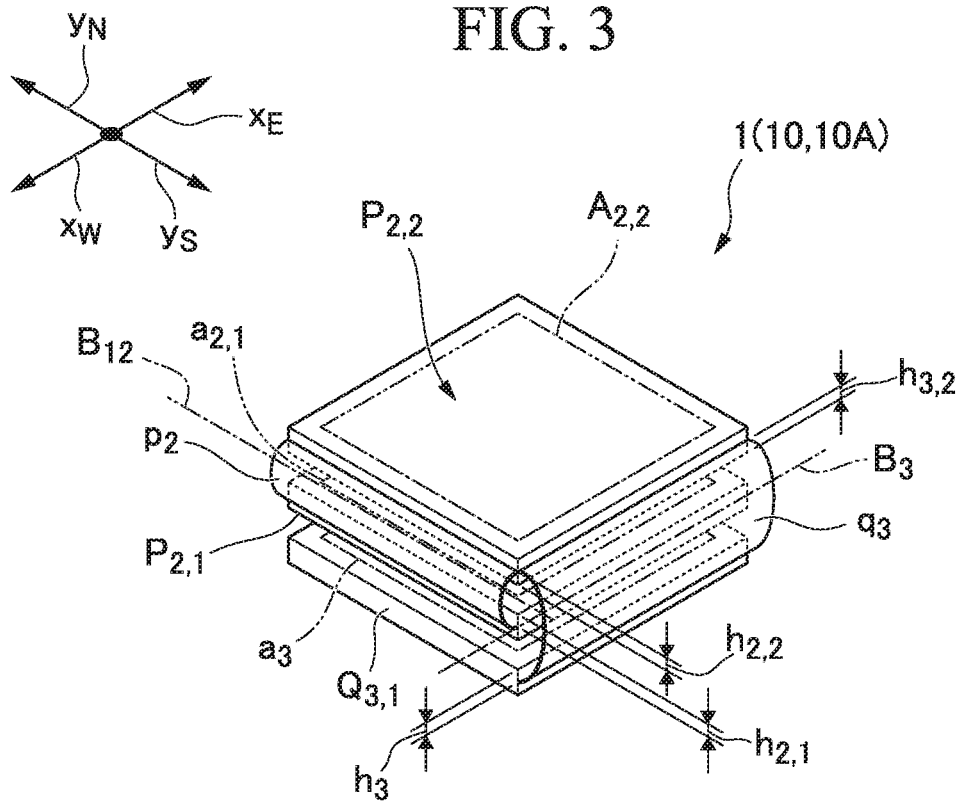
FIG. 3 is a schematic perspective view showing an example of the folded state of the substrate of the first exemplary embodiment of the present invention.

FIG. 1 is a schematic plan view showing an example of the substrate of the first exemplary embodiment of the present invention. FIG. 2 is a schematic rear view of the same. FIG. 3 is a schematic perspective view showing an example of the folded state of the substrate of the first exemplary embodiment of the present invention.

As the drawings are schematics, the shapes and dimensions therein are exaggerated (with the same being true for the subsequent drawings).

As shown in FIGS. 1 and 2, a substrate 1 of the present exemplary embodiment includes a first substrate portion 2 and a second substrate portion 3. As described below, the substrate 1 is constituted to be foldable.

FIGS. 1 and 2 illustrate the substrate 1 in the state of being unfolded (hereinbelow called the unfolded state) in plan view.

The first substrate portion 2 includes first substrates $P_{2,1}$, $P_{2,2}$, and a first coupling portion $p_2$.

The shapes in plan view of the first substrates $P_{2,1}$, $P_{2,2}$ are not particularly limited. For example, the shapes in plan view of the first substrates $P_{2,1}$, $P_{2,2}$ may be appropriate polygons. In the plan view of the first substrates $P_{2,1}$, $P_{2,2}$, a convex portion or concave portion may be provided at the outer shape of each appropriate polygon. In the plan view of the first substrates $P_{2,1}$, $P_{2,2}$, a through hole may be provided in the interior of each.

An electrically conductive pattern, not illustrated, for forming a circuit is formed in the first substrates $P_{2,1}$, $P_{2,2}$.

In the example shown in FIG. 1, the shapes in plan view of the first substrates $P_{2,1}$, $P_{2,2}$ are both rectangular.

The sizes of the outer shapes in plan view of the first substrates $P_{2,1}$, $P_{2,2}$ may differ from each other. In the example shown in FIG. 1, the outer shapes in plan view of the first substrates $P_{2,1}$, $P_{2,2}$ are mutually joined. For this reason, in the example shown in FIG. 1, the sizes of the outer shapes in plan view of the first substrates $P_{2,1}$, $P_{2,2}$ are mutually equivalent.

Hereinbelow, the example with be described of the first substrates $P_{2,1}$, $P_{2,2}$ each including a rectangular substrate with side lengths $w_x$ and $w_y$, and thickness $t_2$ ($t_2 < w_x$, $t_x < w_y$).

Hereinbelow, for simplicity, when not distinguishing between the first substrates $P_{2,1}$, $P_{2,2}$, the subscripted numerals may at times be omitted, resulting in the expression "first substrate P" being used at times. When generally referring to the first substrates P in the substrate 1, an expression such as "first substrates P" is used at times.

As the material of the first substrate P, a suitable substrate material fit for mounting of electronic devices is used. For example, mutually different materials may be used as the materials of the first substrates P. For example, a single-layer printed substrate or multi-layer printed substrate may be used as the material of the first substrate. For example, a foldable flexible substrate may also be used as the material of the first substrate P.

Hereinbelow, the surfaces of the first substrates $P_{2,1}$, $P_{2,2}$ in FIG. 1 are denoted as first substrate regions $A_{2,1}$, $A_{2,2}$, respectively. As shown in FIG. 2, the surfaces of the first substrates $P_{2,1}$, $P_{2,2}$ on the reverse side of the first substrate regions $A_{2,1}$, $A_{2,2}$ are denoted as second substrate regions $a_{2,1}$, $a_{2,2}$, respectively.

Hereinbelow, for simplicity, when not distinguishing between the first substrate regions $A_{2,1}$, $A_{2,2}$ (the second substrate regions $a_{2,1}$, $a_{2,2}$), the subscripted numerals may at times be omitted, resulting in the expression "first substrate region $A_2$ (second substrate region $a_2$)" being used at times. When generally referring to the first substrate regions $A_2$ (second substrate regions $a_2$), an expression such as "first substrate regions P (second substrate regions $a_2$)" is used at times.

A first electrode 4A that is wired to a circuit in the first substrate $P_{2,2}$ may be arranged in the first substrate region $A_{2,1}$ of the first substrate $P_{2,1}$. An electrode (not illustrated) on which a suitable electronic device can be mounted may be formed in the second substrate region $a_{2,1}$ of the first substrate $P_{2,1}$. However, in the present exemplary embodiment, an electrode is not provided in the second substrate region $a_{2,1}$. For this reason, the second substrate region $a_{2,1}$ of the present exemplary embodiment is configured as a non-electrically conductive flat surface.

An electrode (not illustrated) on which for example an electronic device D can be mounted may be formed in the first substrate region $A_{2,2}$ of the first substrate $P_{2,2}$.

An electrode (not illustrated) on which for example an electronic device d can be mounted may be formed in the second substrate region $a_{2,2}$ of the first substrate $P_{2,2}$.

In the case of an electronic device D (d) being mounted, the type of electronic device D (d) is not limited. As the electronic device D (d), a suitable large-scale integrated circuit (LSI) or other circuit element may be used as needed. For example, the electronic device D (d) may be a random access memory (RAM).

The first substrates $P_{2,1}$, $P_{2,2}$ are arranged side by side in this order heading from the left side to the right side of the figure. The side of length $w_x$ of the first substrates P extends in the horizontal direction of the figure. The side of length $w_y$ of the first substrates P extends in the vertical direction of the figure. The length of the gap in the horizontal direction between the first substrates $P_{2,1}$, $P_{2,2}$ is $L_2$.

The first coupling portion $p_2$ connects the first substrates $P_{2,1}$, $P_{2,2}$ that are mutually adjacent. Moreover, the first coupling portion $p_2$ is constituted to be foldable so that the second substrate region $a_{2,1}$ of the first substrate $P_{2,1}$ and the second substrate region $a_{2,2}$ of the first substrate $P_{2,2}$ oppose each other.

Wiring for electrical connection with circuits in the first substrates $P_{2,1}$, $P_{2,2}$ may be provided in the first coupling portion $p_2$.

The first coupling portion $p_2$ may deform elastically by being folded. Provided a disconnection or the like does not occur in internal wiring, the first coupling portion $p_2$, may plastically deform when folded.

For example, a flexible substrate that can be folded as described above may be used as the material of the first coupling portion $p_2$.

In the case of the first coupling portion $p_2$ being constituted with a material that differs from the first substrate P, the first coupling portion $p_2$ may be joined with the first substrate P by an electrically conductive adhesive, soldering, copper wire, or a substrate coupling body such as a copper plate.

The connection positions of the first coupling portion $p_2$ with the first substrates P in the thickness direction is not limited. For example, the first coupling portion $p_2$ may be connected at the first substrate region $A_2$ or the second substrate region $a_2$. The first coupling portion $p_2$ may also for example be connected to the side surface portion of the first substrate P between the first substrate region $A_2$ and the second substrate region $a_2$.

When the first coupling portion $p_2$ is constituted with the same material as the first substrate P, the first coupling portion $p_2$ may be integrally formed with the first substrate P.

The length in the direction $X_E$ of the first coupling portion $p_2$ between the first substrates $P_{2,1}$, $P_{2,2}$ is $L_2$.

In the case of an electronic device d being mounted in the second substrate region $a_{2,2}$ of the first substrate $P_{2,2}$, the length $L_2$ is a length that enables the first substrate $P_{2,1}$ and the first substrate $P_{2,2}$ to be arranged in parallel. The length $L_2$ is longer than the sum of the mounting height $h_d$ of the electronic device d from the second substrate region $a_{2,\,2}$, and connection heights $h_{2,\,1}$, $h_{2,\,2}$ ($0 \le h_{2,\,1} \le t_2$, $0 \le h_{2,\,2} \le t_2$, refer to FIG. 3).

Here, the connection height $h_{2,\,1}$ ($h_{2,\,2}$) is the distance of the connection position of the first coupling portion $p_2$ from the second substrate region $a_{2,\,1}$ ($a_{2,\,2}$) in the thickness direction of the first substrate $P_{2,\,1}$ (first substrate $P_{2,\,2}$).

The width of the first coupling portion $p_2$ in the direction $Y_N$ is not limited, provided it is equal to or less than $w_y$. FIG. 1 illustrates the example of the case of the width of the first coupling portion $p_2$ in the direction $Y_S$ being $w_y$.

In this way, in the unfolded state of the substrate 1, as shown in FIG. 1, the first substrates $P_{2,\,1}$, $P_{2,\,2}$ of the first substrate portion 2 are connected in series in this order by the first coupling portion $p_2$ along a coupling path corresponding to the linear axis $O_X$ extending horizontally in the figure.

Hereinbelow, in FIG. 1, the direction heading from the left side in the figure to the right side (from the right side to the left side) is denoted as direction $X_E$ ($X_W$), and the direction heading from the lower side in the figure to the upper side (from the upper side to lower side) is denoted as direction $Y_N$ ($Y_S$).

In correspondence with the directions $X_E$, $X_W$, $Y_N$, $Y_S$ in the unfolded state shown in FIG. 1, the directions heading from the center of the first substrate P to each side are hereinbelow denoted as directions $x_E$, $x_W$, $y_N$, $y_S$, respectively. The directions $X_E$, $x_W$, $y_N$, $y_S$ are respectively unique directions in each first substrate P.

According to these expressions, the axial line $O_X$ is a straight line that extends parallel to the directions $X_E$, $X_W$. The first substrate $P_{2,\,1}$, is connected via the first coupling portion $p_2$ in the $x_E$ direction of the first substrate $P_{2,\,1}$.

The second substrate 3 is connected with the first substrate $P_{2,\,2}$ at the side portion thereof positioned in the direction $y_S$ of the first substrate $P_{2,\,2}$, in the first substrate portion 2. That is, the second substrate portion 3 is connected to the first substrate $P_{2,\,2}$ with the direction $y_S$ along the linear axis $O_Y$ that is perpendicular with the axis $O_X$ in the first substrate $P_{2,\,2}$ serving as the connection direction. The intersection angle of the axes $O_X$, $O_Y$ is not limited. FIG. 1, as an example, illustrates the case of the intersection angle being 90°.

The second substrate portion 3 includes a second coupling portion $q_3$ and a second substrate $Q_3$.

The second coupling portion $q_3$ connects with the side portion positioned in the direction $y_S$ of the first substrate $P_{2,\,2}$. Moreover, the second coupling portion $q_3$ is constituted to be foldable so that, in the state of the first coupling portion $p_2$ being folded, the second substrate $Q_3$ described below opposes the first substrate $P_{2,\,2}$, sandwiching the first substrate $P_{2,\,1}$ therebetween.

Wiring for electrically connecting with circuits in the first substrates P may be provided in the second coupling portion $q_3$.

The second coupling portion $q_3$ is constituted with the same material as the first coupling portion $p_2$. For example, the second coupling portion $q_3$ may be constituted with a flexible substrate.

The second coupling portion $q_3$ is extended along the axis $O_Y$ in the unfolded state. The length of the second coupling portion $q_3$ in direction $Y_S$ is $L_3$ ($L_3 > L_2$). The width of the second coupling portion $q_3$ in direction $X_E$ is equal to or less than $w_x$. FIG. 1 illustrates the example of the width of the second coupling portion $q_3$ in direction $X_E$ being $w_x$.

The length $L_3$ is a length that enables connection when the second substrate region $a_3$ of the second substrate $Q_3$ and the first substrate region $A_{2,\,1}$ of the first substrate $P_{2,\,1}$ oppose each other in the case of an electronic device d being mounted on the second substrate region $a_{2,\,2}$ of the first substrate $P_{2,\,2}$. The length $L_3$ is greater than the value of adding the connection heights $h_3$, $h_{3,\,2}$ ($0 \le h_3 \le t_2$, $0 \le h_{3,\,2} \le t_2$, refer to FIG. 3) to the sum of the aforementioned mounting height $h_d$ and the thickness $t_2$ of the first substrate $P_{2,\,1}$.

Here, the connection height $h_3$ is the distance of the connection position of the second coupling portion $q_3$ from the second substrate region $a_3$ in the thickness direction of the second substrate $Q_3$. The connection height $h_{3,\,2}$ is the distance of the connection position of the second coupling portion $q_3$ from the second substrate region $a_{2,\,2}$ in the thickness direction of the first substrate $P_{2,\,2}$.

The second substrate $Q_3$ is connected to the distal end of the second coupling portion $q_3$ in the extension direction thereof.

The shape in plan view of the second substrate $Q_3$ is not particularly limited, similarly to the first substrates P. In the example shown in FIG. 1, the outer shape in plan view of the second substrate $Q_3$ is mutually joined with the first substrates P. The example is described of the second substrate $Q_3$ including a rectangular substrate with the side length along the direction $X_E$ being $w_x$, the side length along the direction $Y_S$ being $w_y$, and the thickness being $t_3$ ($t_3 < w_x$, $t_3 < w_y$). The thickness $t_3$ may be different from the thickness $t_2$.

As the material of the second substrate $Q_3$, a suitable substrate material that is connectable with the first substrate $P_{2,\,1}$ may be used. For example, as the material of the second substrate $Q_3$, a single-layer printed substrate, a multi-layer printed substrate and a flexible substrate may be used, similarly to the first substrate P.

Hereinbelow, the surface of the second substrate $Q_3$ in FIG. 1 is denoted as first substrate region $A_3$. As shown in FIG. 2, the surface of the second substrate $Q_3$ on the reverse side of the first substrate region $A_3$ is denoted as the second substrate region $a_3$.

As shown in FIG. 2, when a first electrode 4A (refer to FIG. 1) is arranged in the first substrate region $A_{2,\,1}$ of the first substrate $P_{2,\,1}$, a first electrode $6a$ that is connectable with this electrode may be arranged in the second substrate region $a_3$.

As shown in FIG. 1, a first electrode 6A that is electrically conductive with the first electrode $6a$ and a second electrode 7A that is wired to a circuit in the first substrate $P_{2,\,2}$ may be arranged in the first substrate region $A_3$. FIG. 1 illustrates the example of the first electrode 6A being arranged in the center portion of the first substrate region $A_3$, and the second electrode 7A being arranged in the peripheral portion thereof. It should be noted that the relation of the arrangement positions of the first electrode 6A and the second electrode 7A is not limited thereto.

Next, the substrate 1 in the folded state will be described. FIG. 3 shows the substrate 1 in the folded state.

In the substrate 1 in the folded state, the first substrates $P_{2,\,2}$, $P_{2,\,1}$ and the second substrate $Q_3$ are layered in this order from the top to the bottom in the figure. The second substrate region $a_{2,\,2}$, not illustrated, of the first substrate $P_{2,\,2}$, opposes the second substrate region $a_{2,\,1}$, of the first substrate $P_{2,\,1}$. The first substrate region $A_{2,\,1}$, not illustrated, of the first substrate $P_{2,\,1}$ opposes the second substrate region $a_3$ of the second substrate $Q_3$.

For this reason, in the substrate 1 in the folded state, the first substrate region $A_{2,\,2}$ of the first substrate $P_{2,\,2}$ is exposed upward in the figure. In the substrate 1 in the folded state, the first substrate region $A_3$, not illustrated, of the second substrate $Q_3$ is exposed downward in the figure.

The folded first coupling portion $p_2$ is curved so as to protrude to the outside from the side surface facing the direction $x_W$ of the first substrate $P_{2,2}$.

The folded second coupling portion $q_3$ is curved so as to protrude to the outside from the side surface facing the direction $y_S$ of the first substrate $P_{2,2}$.

In order to form such a folded state, the first substrate $P_{2,1}$ is folded toward the far side of the paper surface about the axis $B_{12}$ extending in the direction $Y_N$ in the unfolded state shown in FIG. 1. When the first substrate $P_{2,1}$ has rotated 180°, the positions of the first substrate $P_{2,1}$ and the first substrate $P_{2,2}$ are aligned in plan view. For example the outer shapes in plan view of the first substrate $P_{2,1}$ and the first substrate $P_{2,2}$ may be aligned so as to be overlapped.

Subsequently, in the unfolded state, the second substrate $Q_3$ is folded toward the far side of the paper surface about the axis $B_3$ extending in the direction $X_E$ in the unfolded state. When the second substrate $Q_3$ has rotated 180°, the positions of the second substrate $Q_3$ and the first substrate $P_{2,2}$ are aligned in plan view. For example the outer shapes in plan view of the second substrate $Q_3$ and the first substrate $P_{2,1}$ may be aligned so as to be overlapped. When the first electrode 4A is formed in the first substrate $P_{2,1}$, the first electrode 6a in the second substrate Q3 is aligned at a position to be electrically connectable with the first electrode 4A.

When constituting a circuit substrate 10 using the substrate 1 by for example mounting the electronic device D (d) on the first substrate region $A_{2,2}$ (second substrate region $a_{2,2}$), the circuit substrate 10 can also be folded in the abovedescribed manner similarly to the substrate 1.

According to the substrate 1 and the circuit substrate 10 described above, the first substrates $P_{2,1}$, $P_{2,2}$ and the second substrate $Q_3$ are foldably connected. By putting the substrate 1 and the circuit substrate 10 in the folded state described above, the first substrates $P_{2,1}$, $P_{2,2}$ and the second substrate $Q_3$ are layered.

In the circuit substrate 10 in a folded state, by electrically connecting the first electrode 4A and the first electrode 6a, the electronic component 10A is manufactured.

The number of wires increases particularly when mounting both the electronic devices D and d in such a circuit substrate 10 and electronic component 10A. However, by the use of the substrate 1 of the present exemplary embodiment, it is possible to divide into two the routes of the wires from the electronic devices D, d in the circuit substrate 10 and electronic component 10A. Moreover, some of the wiring that is disposed in two wiring routes is electrically connected to the first electrode 6A and the second electrode 7A on the second substrate $Q_3$, via the first substrate $P_{2,1}$. By the wiring route being divided in this way, the wiring layout in the substrate 1 is simplified, and manufacture of the substrate 1 is easy.

Even with two wiring routes and the electrode being divided into two, the electronic component 10A can be mounted on another substrate within the range of the size of the second substrate Q3.

For this reason, according to the substrate 1, the circuit substrate 10, and the electronic component 10A, even when the quantity of electronic devices mounted is increased, it is possible to achieve a mounting space savings, and manufacturing is also easy.

Second Exemplary Embodiment

The substrate, the circuit substrate and the electronic component of the second exemplary embodiment of the present invention will be described.

Figure 4:
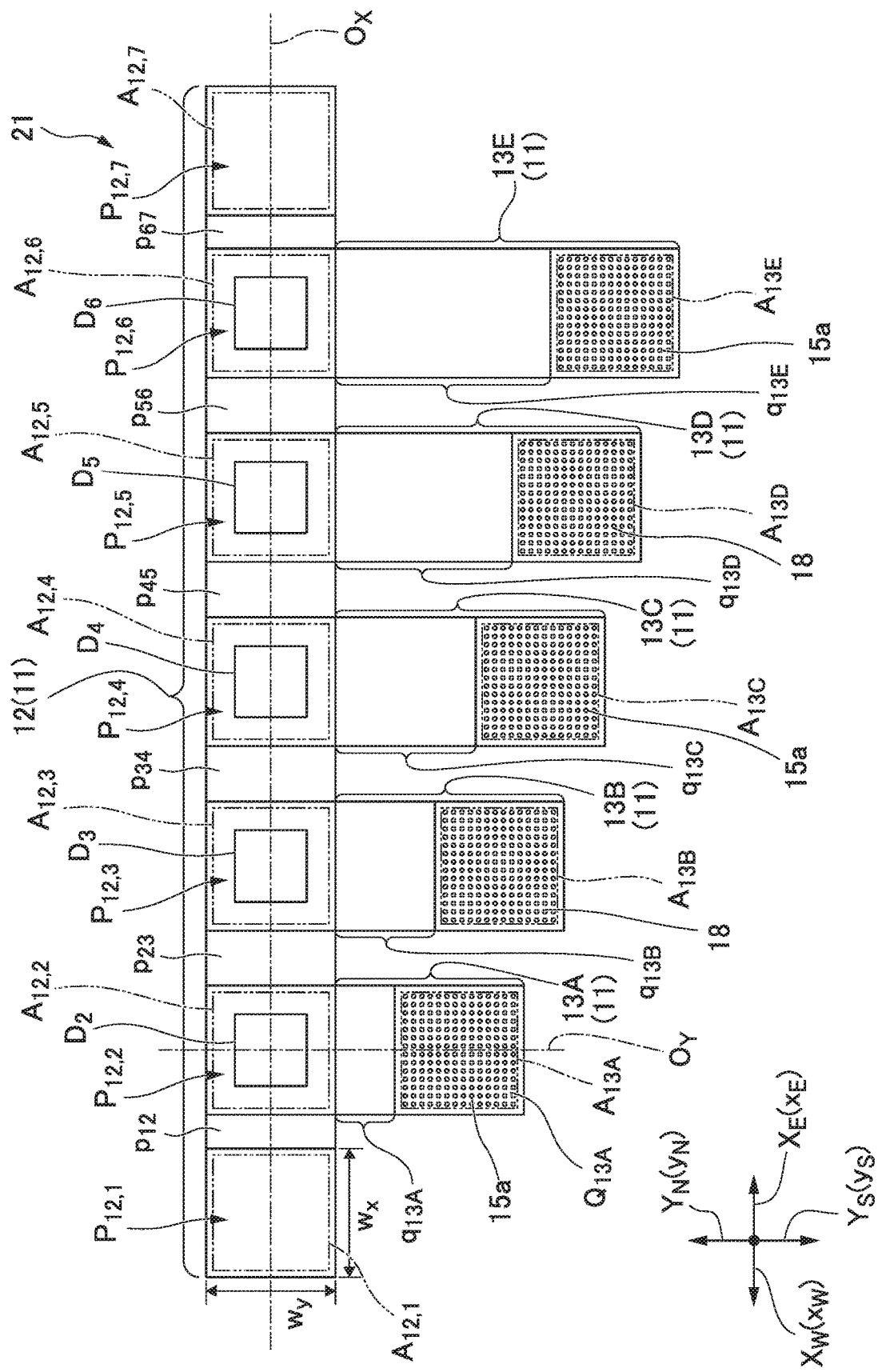
FIG. 4 is a schematic plan view showing an example of the circuit substrate of the second exemplary embodiment of the present invention.
Figure 5:
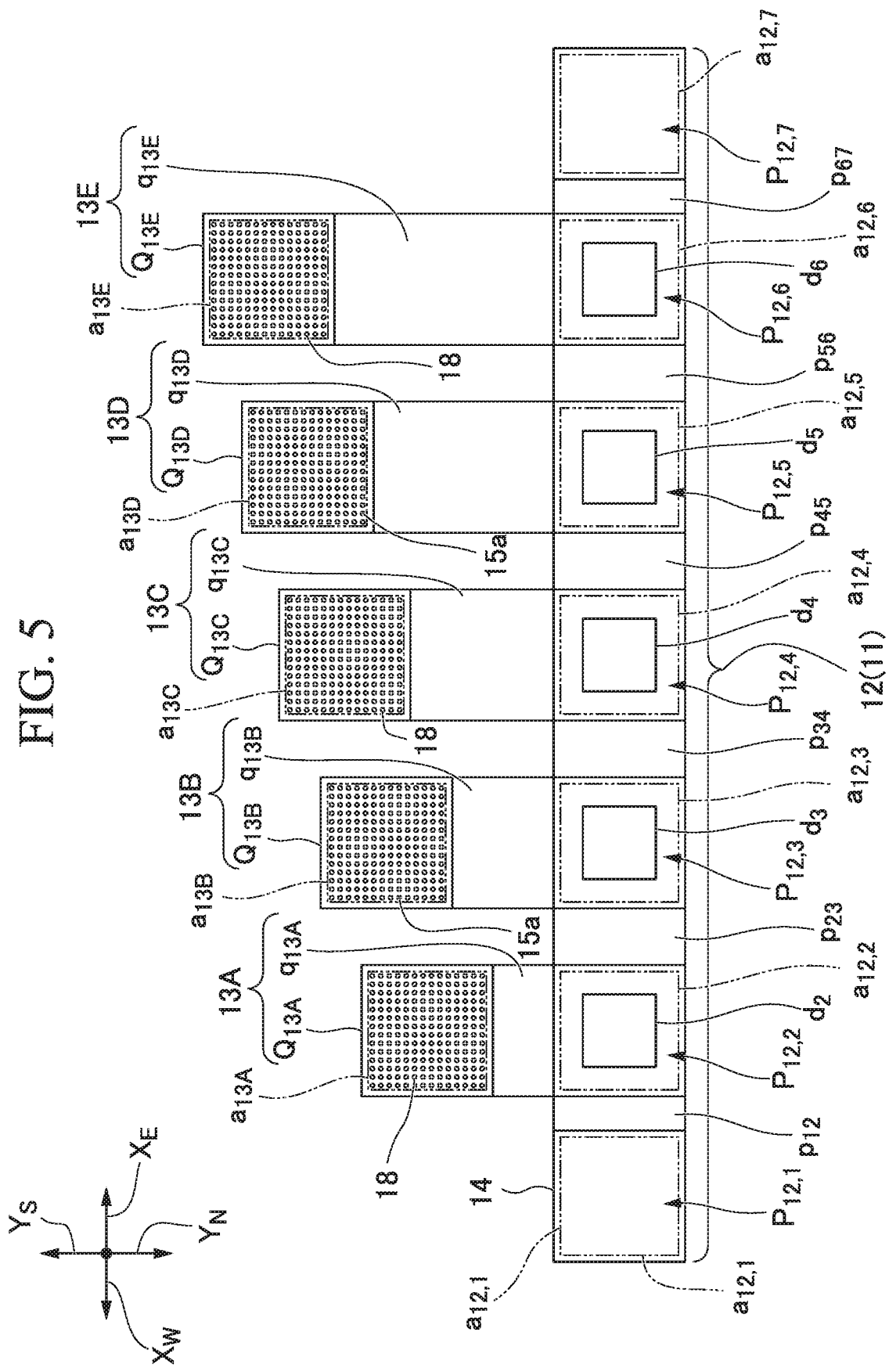
FIG. 5 is a schematic rear view showing an example of the circuit substrate of the second exemplary embodiment of the present invention.
Figure 6A:
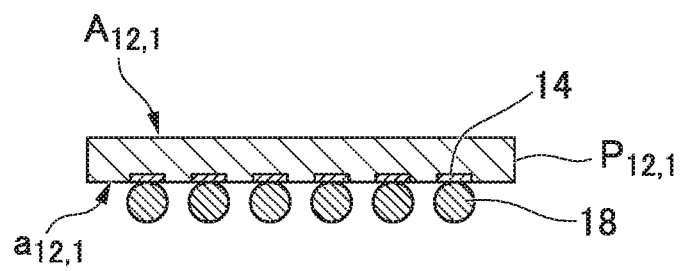
FIG. 6A is a schematic cross-sectional view of the electrode portion of the first substrate and the electrode portion of the second substrate in the example of the circuit substrate of the second exemplary embodiment of the present invention.
Figure 6B:
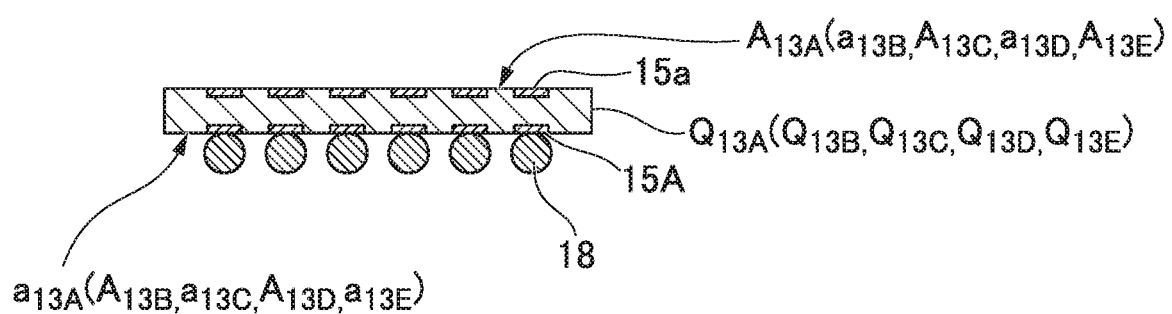
FIG. 6B is a schematic cross-sectional view of the electrode portion of the first substrate and the electrode portion of the second substrate in the example of the circuit substrate of the second exemplary embodiment of the present invention.

FIG. 4 is a schematic plan view showing an example of the circuit substrate of the second exemplary embodiment of the present invention. FIG. 5 is a schematic rear view of the same. FIGS. 6A and 6B are schematic cross-sectional views of the first substrate electrode portion and the second substrate electrode portion in the example of the circuit substrate of the second exemplary embodiment of the present invention.

As shown in FIGS. 4 and 5, a circuit substrate 21 of the present exemplary embodiment includes a substrate 11 and electronic devices $D_k$, $d_k$ (k=2, . . . , 6. The same applies hereinbelow.) This notation is similarly applied to other symbols in which the subscript changes from 2 to 6.

Substrate 11 of the present exemplary embodiment is provided to be foldable similarly to the substrate 1 of the first exemplary embodiment. The substrate 11 in the unfolded state is shown in FIGS. 4 and 5. Hereinbelow, unless otherwise stated, the configuration of the substrate 11 in the unfolded state is described. In order to express the relative positions of the substrate 11 in the unfolded state, the illustrated directions $X_E$, $X_W$, $Y_N$, $Y_S$, $x_E$, $x_W$, $y_N$, and $y_S$ are used similarly to the first exemplary embodiment.

The substrate 11 includes the first substrate portion 12 and the second substrate portions 13A, 13B, 13C, 13D, 13E in place of the first substrate portion 2 and the second substrate portion 3 of substrate 1 of the first exemplary embodiment.

For simplicity, the second substrate portions 13A, 13B, 13C, 13D, 13E are at times denoted as second substrate portions 13A to 13E.

The first substrate portion 12 includes first substrates $P_{12,i}$ (i=1, 2, . . . , 7. The same applied hereinbelow.) in place of the respective substrates P in the first exemplary embodiment. This notation is similarly applied to other symbols in which the subscript changes from 1 to 7.

The first substrates $P_{12,i}$ are constituted with the same shape and material as the first substrates P in the first exemplary embodiment. In the example shown in FIG. 4, the first substrates $P_{12,i}$ have a rectangular shape in plan view. The first substrates $P_{12,i}$ are arrayed in the order in which the subscript i increases in the direction $X_E$. The orientation of the first substrates $P_{12,i}$ is the orientation in which the side of length $w_x$ is parallel with the directions $x_W$ and $x_E$.

The surface of the first substrate $P_{12,i}$ in FIG. 4 is denoted as first substrate region $A_{12,i}$. As shown in FIG. 5, the surface of the first substrate $P_{12,i}$ on the reverse side of the first substrate region $A_{12,i}$ is denoted as second substrate region $A_{12,i}$.

The first substrate $P_{12,1}$ includes the same constitution as the first substrate $P_{2,1}$ in the first exemplary embodiment. As shown in FIG. 6A, electrodes 14 are arranged on the second substrate region $a_{12,1}$ of the first substrate $P_{12,1}$. The number of electrodes 14 corresponds to the number of wires to be connected to the first substrate $P_{2,1}$. In FIG. 6A, the wires connected to the electrodes 14 are not illustrated.

The arrangement region of the electrodes 14 is not particularly limited, provided the region is located on the second substrate region $a_{12,1}$.

In the present exemplary embodiment, a solder ball 18 is joined to each electrode 14.

In contrast to this, electrodes are not provided on the first substrate region $A_{12,1}$ of the first substrate $P_{12,1}$. For this reason, the first substrate region $A_{12, 1}$ is configured as a non-electrically conductive flat surface.

As shown in FIG. 4, an electronic device $D_k$ is mounted on the first substrate region $A_{12, k}$ of the first substrate $P_{12, k}$.

As shown in FIG. 5, an electronic device $d_k$ is mounted on the second substrate region $a_{12, k}$ of the first substrate $P_{12, k}$.

The mounting height $h_{Dk}$ ($h_{dk}$) of the electronic device $D_k$ ($d_k$) may differ from the mounting height $h_D$ ($h_d$) of the electronic device D (d) of the first exemplary embodiment. When a joining layer 20 described below is provided, the mounting height $h_{Dk}$ ($h_{dk}$) of the electronic device $D_k$ ($d_k$) is the height including the thickness of the joining layer 20.

As the electronic device $D_k$ ($d_k$), a suitable large-scale integrated circuit (LSI) or other circuit element may be used as needed, similarly to the electronic device D (d) in the first exemplary embodiment.

Hereinbelow, an example of the case of the electronic device $D_k$ ($d_k$) being RAM will be described.

The first substrate $P_{12, 7}$ has the same outer shape as the first substrate $P_{2, 1}$ in the first exemplary embodiment. Suitable electronic devices may be mounted on the first substrate region $A_{12, 7}$ and the second substrate region $a_{12, 7}$. In the example shown in FIGS. 4 and 5, electronic devices are not mounted on the first substrate region $A_{12, 7}$ and the second substrate region $a_{12, 7}$. For this reason, the first substrate region $A_{12, 7}$ and the second substrate region $a_{12, 7}$ are constituted to be non-electrically conductive flat surfaces.

As shown in FIG. 4, a first coupling portion $p_{mM}$ is arranged between the first substrates $P_{12, m}$ and $P_{12, M}$ (m=1, 2, . . . , 6, and M=m+1. The same applies hereinbelow.) This notation is similarly applied to other symbols in which the subscript changes from 1 to 6 and the subscript changes from 2 to 7.

The first coupling portion $p_{mM}$ mutually connects the first substrates $P_{12, m}$ and $P_{12, M}$. Moreover, the first coupling portion $p_{mM}$ is constituted to be foldable so that the first substrates $P_{12, m}$ and $P_{12, m}$ mutually overlap and oppose each other.

As the material of the first coupling portion $p_{mM}$, the same material as the first coupling portion $p_2$ in the first exemplary embodiment may be used.

The first coupling portion $p_{12}$ is foldable so that the first substrate region $A_{12, 1}$ of the first substrate $P_{12, 1}$ and the first substrate region $A_{12, 2}$ of the first substrate $P_{12, 2}$ are opposed.

The length between the first substrate $P_{12, 1}$ and the first substrate $P_{12, 2}$ in the direction $X_E$ of the first coupling portion $p_{12}$ is $L_{12}$.

The length $L_{12}$ is longer than the sum of the connection heights $H_{12, 1}$, $H_{12, 2}$ in the first substrates $P_{12, 1}$, $P_{12, 2}$ of the first coupling portion $p_{12}$ and the mounting height $h_{D2}$ of the electronic device $D_2$.

Figure 9:
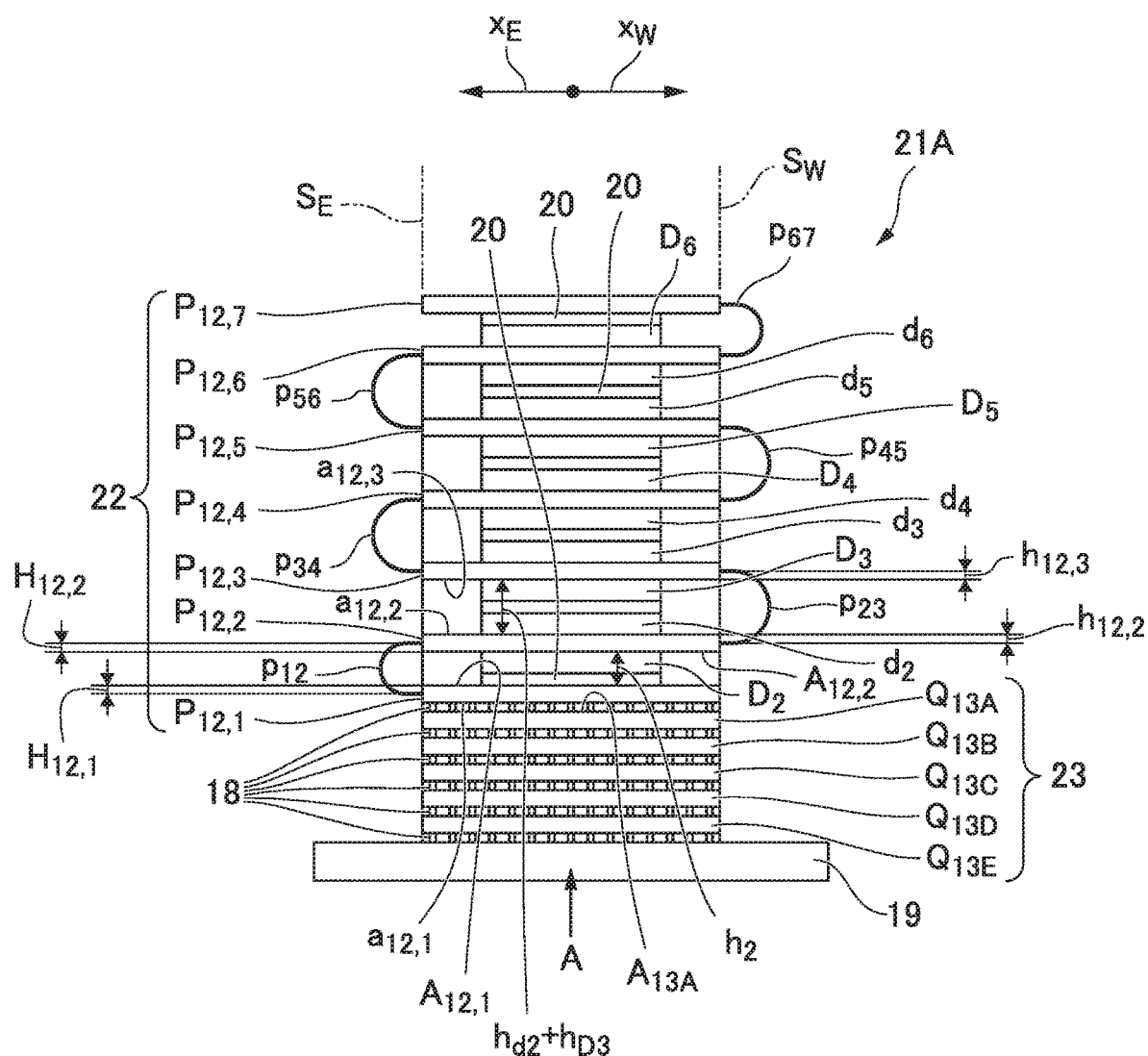
FIG. 9 is a schematic front view showing an example of the electronic component of the second exemplary embodiment of the present invention.

Here, the connection heights $H_{12, 1}$, $H_{12, 2}$ are the distances of the connection position of the first coupling portion $p_{12}$ from the first substrate regions $A_{12, 1}$, $A_{12, 2}$ in the thickness direction of the first substrates $P_{12, 1}$, $P_{12, 2}$ (refer to FIG. 9).

The connection heights $H_{12, 1}$, $H_{12, 2}$ are both equal to or greater than 0 and equal to or less than $t_2$.

The first coupling portion $p_{23}$ ($p_{45}$) is capable of folding so that the second substrate region $a_{12, 2}$ ($a_{12, 4}$) of the first substrate $P_{12, 2}$ ($P_{12, 4}$) and the second substrate region $a_{12, 3}$ ($a_{12, 5}$) of the first substrate $P_{12, 3}$ ($P_{12, 5}$) are opposed.

The length between the first substrate $P_{12, 2}$ ($P_{12, 4}$) and the first substrate $P_{12, 3}$ ($P_{12, 5}$) in the direction $X_E$ of the first coupling portion $p_{23}$ ($p_{45}$) is $L_{23}$ ($L_{45}$).

The length $L_{23}$ ($L_{45}$) is longer than the sum of the connection heights $h_{12, 2}$, $h_{12, 3}$ ($h_{12, 4}$, $h_{12, 5}$) in the first substrate $P_{12, 2}$ ($P_{12, 4}$) and the first substrate $P_{12, 3}$ ($P_{12, 5}$) of the first coupling portion $p_{23}$ ($p_{45}$) and the mounting heights $h_{d2}$, $h_{d3}$ ($h_{d4}$, $h_{d5}$) of the electronic devices $d_2$, $d_3$ ($d_4$, $d_5$).

Here, the connection heights $h_{12, 2}$, $h_{12, 3}$ (refer to FIG. 9) ($h_{12, 4}$, $h_{12, 5}$) are the respective distances of the connection position of the first coupling portion $p_{23}$ ($p_{45}$) from the second substrate regions $a_{12, 2}$, $a_{12, 3}$ ($a_{12, 4}$, $a_{12, 5}$) in the thickness direction of the first substrates $P_{12, 2}$, $P_{12, 3}$ ($P_{12, 4}$, $P_{12, 5}$).

The connection heights $h_{12, 2}$, $h_{12, 3}$ ($h_{12, 4}$, $h_{12, 5}$) are both equal to or greater than 0 and equal to or less than $t_2$.

The first coupling portion $p_{34}$ ($p_{56}$) is capable of folding so that the first substrate region $A_{12, 3}$ ($A_{12, 5}$) of the first substrate $P_{12, 3}$ ($P_{12, 5}$) and the first substrate region $A_{12, 4}$ ($A_{12, 6}$) of the first substrate $P_{12, 4}$ ($P_{12, 6}$) are opposed.

The length between the first substrate $P_{12, 3}$ ($P_{12, 5}$) and the first substrate $P_{12, 4}$ ($P_{12, 6}$) in the direction $X_E$ of the first coupling portion $p_{34}$ ($p_{56}$) is $L_{34}$ ($L_{56}$).

The length $L_{34}$ ($L_{56}$) is longer than the sum of the connection heights $H_{12, 3}$, $H_{12, 4}$ ($H_{12, 5}$, $H_{12, 6}$) in the first substrate $P_{12, 3}$ ($P_{12, 5}$) and the first substrate $P_{12, 4}$ ($P_{12, 6}$) of the first coupling portion $p_{34}$ ($p_{56}$) and the mounting heights $H_{D3}$, $H_{D4}$ ($H_{D5}$, $H_{D6}$) of the electronic devices $d_3$, $d_4$ ($d_5$, $d_6$).

Here, the connection heights $H_{12, 3}$, $H_{12, 4}$ ($H_{12, 5}$, $H_{12, 6}$) are the respective distances of the connection position of the first coupling portion $p_{34}$ ($p_{56}$) from the first substrate regions $A_{12, 3}$, $A_{12, 4}$ ($A_{12, 5}$, $A_{12, 6}$) in the thickness direction of the first substrates $P_{12, 3}$, $P_{12, 4}$ ($P_{12, 5}$, $P_{12, 6}$).

The connection heights $H_{12, 3}$, $H_{12, 4}$ ($H_{12, 5}$, $H_{12, 6}$) are both equal to or greater than 0 and equal to or less than $t_2$.

The first coupling portion $p_{67}$ is capable of folding so that the second substrate region $a_{12, 6}$ of the first substrate $P_{12, 6}$ and the second substrate region $a_{12, 7}$ of the first substrate $P_{12, 7}$ are opposed.

The length between the first substrates $P_{12, 6}$, $P_{12, 7}$ in the direction $X_E$ of the first coupling portion $p_{67}$ is $L_{67}$.

The length $L_{67}$ is longer than the sum of the connection heights $h_{12, 6}$, $h_{12, 7}$ in the first substrates $P_{12, 6}$, $P_{12, 7}$ of the first coupling portion $p_{67}$ and the mounting height $h_{d6}$ of the electronic device $d_6$.

Here, the connection heights $h_{12, 6}$, $h_{12, 7}$ are the respective distances of the connection position of the first coupling portion $p_{67}$ from the second substrate regions $a_{12, 6}$, $a_{12, 7}$ in the thickness direction of the first substrates $P_{12, 6}$, $P_{12, 7}$.

The connection heights $h_{12, 6}$, $h_{12, 7}$ are both equal to or greater than 0 and equal to or less than $t_2$.

In this way, in the unfolded state of the substrate 11, as shown in FIG. 4, the first substrates $P_{12, i}$ of the first substrate portion 12 are connected in series in this order along the coupling path corresponding to the axis $O_X$ by the first coupling portion $p_{mM}$.

The second substrate portion 13A is connected to the first substrate $P_{12, 2}$, with the direction $y_S$ along the axis $O_Y$ perpendicular with the axis $O_X$ of the first substrate $P_{12, 2}$ serving as the connection direction. The intersection angle of the axes $O_X$, $O_Y$ is not limited. FIG. 4, as an example, illustrates the case of the intersection angle being 90°.

The second substrate portion 13A includes a second coupling portion $q_{13A}$ and a second substrate $Q_{13A}$ in place of the second coupling portion $q_3$ and the second substrate $Q_3$ of the second substrate portion 3 of the first exemplary embodiment.

The second coupling portion $q_{13A}$ is constituted by connecting the second coupling portion $q_3$ of the first exemplary embodiment to the side portion of the first substrate $P_{12, 2}$ in the direction $y_S$. For this reason, the length $L_{13A}$ of the second coupling portion $q_{13A}$ in direction $Y_S$ is $L_3$, similarly to the second coupling portion q3 disclosed in the first exemplary embodiment.

However, as described below, the second coupling portion $q_{13A}$ has a second wire that electrically connects to a circuit in the first substrate $P_{12, 2}$.

Similarly to the second coupling portion $q_3$ of the first exemplary embodiment, the second coupling portion $q_{13A}$ is constituted to be foldable so that the second substrate $Q_{13}$ described below opposes the first substrate $P_{12, 2}$, sandwiching the first substrate $P_{12, 1}$ therebetween.

The second coupling portion $q_{13A}$ is extended along the axis $O_Y$ in the unfolded state.

The second substrate $Q_{13A}$ is connected to the distal end of the second coupling portion $q_{13A}$ in the extension direction thereof.

The outer shape and material of the second substrate $Q_{13A}$ are the same as the second substrate $Q_3$ of the first exemplary embodiment.

Hereinbelow, an example of the case of the second substrate $Q_{13A}$ being constituted with a printed substrate will be described.

Hereinbelow, the surface of the second substrate $Q_{13A}$ in FIG. 4 is denoted as first substrate region $A_{13A}$. As shown in FIG. 5, the surface of the second substrate $Q_{13A}$ on the reverse side of the first substrate region $A_{13A}$ is denoted as second substrate region $a_{13A}$. The corresponding surfaces of second substrate portions 13B, 13C, 13D, 13E described below are denoted by changing the alphabet subscript from A to B, C, D, E, respectively.

As shown in FIG. 6B, electrodes 15A are arranged on the first substrate region $A_{13A}$. The number of electrodes 15A is a number corresponding to the number of wires extending from the electronic devices $D_2$, $d_2$ mounted on the first substrate $P_{12, 2}$ to the second coupling portion $q_{13A}$, and the number of electrodes 14 in the first substrate $P_{12, 1}$. In FIG. 6B, the wires connected to the electrodes 15A are not illustrated.

The arrangement region of the electrodes 15A is not particularly limited, provided the region is located on the first substrate region $A_{13A}$.

In the present exemplary embodiment, a solder ball 18 is joined on each electrode 15A.

Electrodes 15a for electrically connecting to the electrodes 14 arranged on the second substrate region $a_{12, 1}$ of the first substrate $P_{12, 1}$ are arranged on the second substrate region $a_{13A}$. In FIG. 6B, the wires connected to the electrodes 15a are not illustrated.

As shown in FIGS. 4 and 5, the second substrate portion 13B includes a second coupling portion $q_{13B}$ and a second substrate $Q_{13B}$ in place of the second coupling portion $q_{13A}$ and the second substrate $Q_{13A}$ in the second substrate portion 13A.

The second coupling portion $q_{13B}$ differs from the second coupling portion $q_{13A}$ on the point of being connected to the first substrate $P_{12, 3}$ and on the point of the length in direction $Y_S$ being $L_{13B}$ ($L_{13B}>L_{13A}$). Moreover, the second coupling portion $q_{13B}$ has second wires that connect electrically to a circuit in the first substrate $P_{12, 3}$ as described below. The number of second wires in the second coupling portion $q_{13B}$ corresponds to the number of wires extending from the electronic devices $D_3$, $d_3$ mounted on the first substrate $P_{12, 3}$.

The second coupling portion $q_{13B}$ is connected to the first substrate $P_{12, 3}$ with the direction $y_S$ in the first substrate $P_{12, 3}$ as the connection direction.

The length $L_{13B}$ of the second coupling portion $q_{13B}$ is a length that enables the first substrate region $A_{13B}$ of the second substrate $Q_{13B}$ described below to oppose the first substrate region $A_{13A}$ of the second substrate $Q_{13A}$ in parallel in the folded state described below. Specifically, for example, the length $L_{13B}$ is the length obtained by adding the mounting heights $h_{d2}$, $h_{d3}$ of the electronic devices $d_2$, $d_3$ and the connection heights $h_{12, 2}$, $h_{13B}$ to the length $L_{13A}$.

Here, the connection height $h_{12, 2}$ is the distance of the connection position of the first coupling portion $p_{23}$ from the second substrate region $a_{12, 2}$ in the thickness direction of the first substrate $P_{12, 2}$. The connection height $h_{12, 2}$ is equal to or greater than 0, and equal to or less than $t_2$.

The connection height $h_{13B}$ is the distance of the connection position of the second coupling portion $q_{13B}$ from the second substrate region $a_{13B}$ in the thickness direction of the second substrate $Q_{13B}$. The connection height $h_{13B}$ is equal to or greater than 0, and equal to or less than $t_3$.

The second substrate $Q_{13B}$ is connected at the distal end of the second coupling portion $q_{13B}$ in the extension direction thereof.

As shown in FIG. 6B, electrodes 15A are arranged on the first substrate region $A_{13B}$. The number of electrodes 15A in the first substrate region $A_{13B}$ is a number obtained by adding the number of wires extending from the electronic devices $D_3$, $d_3$ mounted on the first substrate $P_{12, 3}$ to the second coupling portion $q_{13B}$ to the number of electrodes 15A in the second substrate $Q_{13A}$.

The arrangement region of the electrodes 15A is not particularly limited, provided the region is located on the first substrate region $A_{13B}$.

In the present exemplary embodiment, a solder ball 18 is joined on each electrode 15A.

Electrodes 15a for electrically connecting with the solder balls 18 on the second substrate $Q_{13A}$ are arranged in the second substrate region $a_{13B}$. The arrangement pattern of the electrodes 15a in the second substrate region $a_{13B}$ is an arrangement pattern that enables one-to-one opposition with the solder balls 18 on the second substrate $Q_{13A}$ in the folded state described below.

As shown in FIGS. 4 and 5, the second substrate portion 13C includes a second coupling portion $q_{13C}$ and a second substrate $Q_{13C}$ in place of the second coupling portion gin and the second substrate $Q_{13B}$ in the second substrate portion 13B.

The second coupling portion $q_{13C}$ differs from the second coupling portion $q_{13B}$ on the point of being connected to the first substrate $P_{12, 4}$ and on the point of the length in direction $Y_S$ being $L_{13C}$ ($L_{13C}>L_{13B}$). Moreover, the second coupling portion $q_{13C}$ has second wires that connect electrically to a circuit in the first substrate $P_{12, 4}$ as described below. The number of second wires in the second coupling portion $q_{13C}$ corresponds to the number of wires to be extending from the electronic devices $D_4$, $d_4$ mounted on the first substrate $P_{12, 4}$.

The second coupling portion $q_{13C}$ is connected to the first substrate $P_{12, 4}$ with the direction $y_S$ in the first substrate $P_{12, 4}$ as the connection direction.

The length $L_{13C}$ of the second coupling portion $q_{13C}$ is a length that enables the first substrate region $A_{13C}$ of the second substrate $Q_{13C}$ described below to oppose the first substrate region $A_{13B}$ of the second substrate $Q_{13B}$ in parallel in the folded state described below. Specifically, for example, the length $L_{13C}$ is the length obtained by adding the mounting heights $h_{D3}$, $h_{D4}$ of the electronic devices $D_3$, $D_4$ and the connection heights $H_{12, 3}$, $H_{13C}$ to the length $L_{13B}$.

Here, the connection height $H_{12, 3}$ is the distance of the connection position of the first coupling portion $p_{34}$ from the first substrate region $A_{12, 3}$ in the thickness direction of the first substrate $P_{12, 3}$. The connection height $H_{12, 3}$ is equal to or greater than 0, and equal to or less than $t_2$.

The connection height $H_{13C}$ is the distance of the connection position of the second coupling portion $q_{13C}$ from the first substrate region $A_{13C}$ in the thickness direction of the second substrate $Q_{13C}$. The connection height $H_{13C}$ is equal to or greater than 0, and equal to or less than $t_3$.

The second substrate $Q_{13C}$ is connected at the distal end of the second coupling portion $q_{13C}$ in the extension direction thereof.

As shown in FIG. 6B, electrodes 15A are arranged on the second substrate region $a_{13C}$. The number of electrodes 15A in the second substrate region $a_{13C}$ is a number obtained by adding the number of wires extending from the electronic devices $D_4$, $d_4$ mounted on the first substrate $P_{12, 4}$ to the second coupling portion $q_{13C}$ to the number of electrodes 15A in the second substrate $Q_{13B}$.

The arrangement region of the electrodes 15A is not particularly limited, provided the region is located on the second substrate region $a_{13C}$.

In the present exemplary embodiment, a solder ball 18 is joined on each electrode 15A.

Electrodes 15a for electrically connecting with the solder balls 18 on the second substrate $Q_{13B}$ are arranged in the first substrate region $A_{13C}$. The arrangement pattern of the electrodes 15a in the first substrate region $A_{13C}$ is an arrangement pattern that enables one-to-one opposition with the solder balls 18 on the second substrate $Q_{13B}$ in the folded state described below.

As shown in FIGS. 4 and 5, the second substrate portion 13D includes a second coupling portion $q_{13D}$ and a second substrate $Q_{13D}$ in place of the second coupling portion $q_{13C}$ and the second substrate $Q_{13C}$ in the second substrate portion 13C.

The second coupling portion $q_{13D}$ is connected to the first substrate $P_{12, 5}$ with the direction $y_S$ in the first substrate $P_{12, 5}$ as the connection direction. The length of the second coupling portion $q_{13D}$ is $L_{13D}$. The length $L_{13D}$ is a length that enables the second substrate region $a_{13D}$ of the second substrate $Q_{13D}$ described below to oppose the second substrate region $a_{13C}$ of the second substrate $Q_{13C}$ in parallel in the folded state described below.

As shown in FIGS. 6A and 6B, similarly to the second substrate $Q_{13B}$, the second substrate $Q_{13D}$ has the electrodes 15a on the second substrate region $a_{13D}$ and has the electrodes 15A and the solder balls 18 on the first substrate region $A_{13D}$.

As shown in FIGS. 4 and 5, the second substrate portion 13E includes a second coupling portion $q_{13E}$ and a second substrate $Q_{13E}$ in place of the second coupling portion $q_{13D}$ and the second substrate $Q_{13D}$ in the second substrate portion 13D.

The second coupling portion $q_{13E}$ is connected to the first substrate $P_{12, 6}$ with the direction $y_S$ in the first substrate $P_{12, 6}$ as the connection direction. The length of the second coupling portion $q_{13E}$ is $L_{13E}$. The length $L_{13E}$ is a length that enables the first substrate region $A_{13E}$ of the second substrate $Q_{13E}$ described below to oppose the first substrate region $A_{13D}$ of the second substrate $Q_{13D}$ in parallel in the folded state described below.

As shown in FIGS. 6A and 6B, similarly to the second substrate $Q_{13C}$, the second substrate $Q_{13E}$ has the electrodes 15a on the first substrate region $A_{13E}$ and has the electrodes 15A and the solder balls 18 on the second substrate region $a_{13E}$.

With such a configuration, when the substrate 11 and the circuit substrate 21 are in the unfolded state, the second substrate portions 13A to 13E are extended in a linear shape to the same side in a direction perpendicular with the direction in which the first substrate portion 12 extends. The connection directions of the second substrate portions 13A to 13E are all the direction $y_S$ in the first substrate $P_{12, k}$.

The lengths $L_{13A}$, $L_{13B}$, $L_{13C}$, $L_{13D}$, $L_{13E}$ of the second coupling portions $q_{13A}$, $q_{13B}$, $q_{13C}$, $q_{13D}$, $q_{13E}$, in the second substrate portions 13A to 13E become longer in this order. That is, the lengths $L_{13A}$, $L_{13B}$, $L_{13C}$, $L_{13D}$, $L_{13E}$ change so as to gradually increase along the coupling path of the first substrate portion 12.

Next, the wiring in the circuit substrate 21 will be described.

Figure 7:
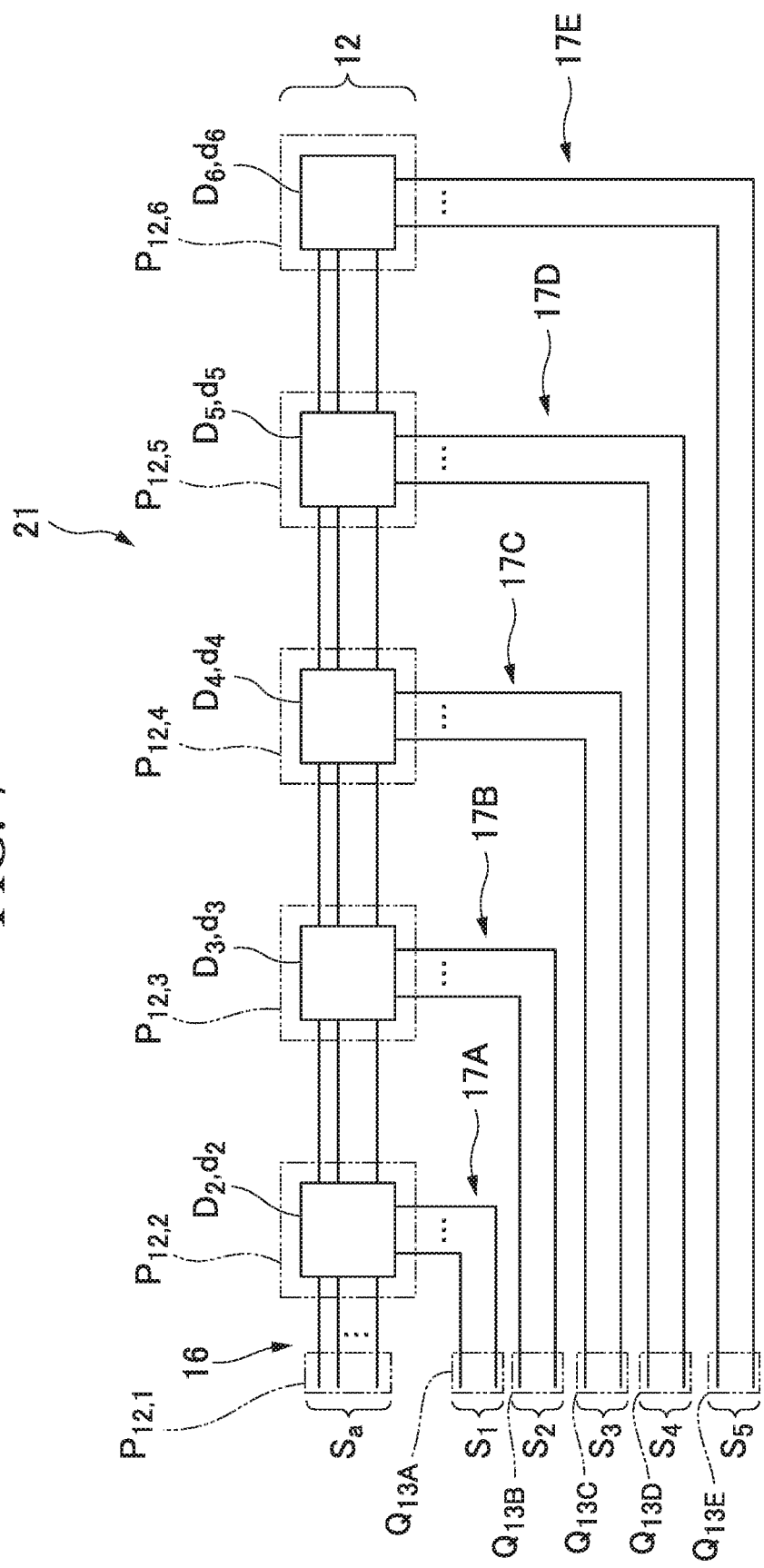
FIG. 7 is a schematic wiring diagram in the example of the circuit substrate of the second exemplary embodiment of the present invention.

FIG. 7 is a schematic wiring diagram in the example of the circuit substrate of the second exemplary embodiment of the present invention.

As shown in FIG. 7, the circuit substrate 21 includes a first wiring 16 and second wirings 17A, 17B, 17C, 17D, 17E. Hereinbelow, for simplicity the second wirings 17A, 17B, 17C, 17D, 17E are at times denoted as second wirings 17A to 17E.

The first wiring 16 is a wiring group that connects in a row the electronic devices $D_k$, $d_k$ mounted on the first substrates $P_{12, k}$. In the present exemplary embodiment, the first wiring 16 is provided in the first substrate $P_{12, 1}$, the first substrates $P_{12,k}$, and the first coupling portions $p_{mM}$ excluding the first coupling portion $p_{67}$.

Each terminal $S_a$ of the first wiring 16 is electrically connected to the electrode 14 (not illustrated in FIG. 7) in the first substrate $P_{12, 1}$.

The first wiring 16 transmits for example control signals such as commands, DM (data mask) signals, clock signals, and address signals. The control signals and address signals are signals common to the electronic devices $D_k$, $d_k$.

The second wiring 17A is a wiring group connected to the electronic devices $D_2$, $d_2$ mounted on the first substrate $P_{12, 2}$. In the present exemplary embodiment, the second wiring 17A is provided inside the first substrate $P_{12, 1}$ and the second coupling portion $q_{13A}$.

The terminal $S_1$ of the second wiring 17A is electrically connected to the electrodes 15A, not illustrated, of the second substrate $Q_{13A}$.

The second wiring 17A transmits data signals including data and data-strobe signals for performing data transmission with the electronic devices $D_2$, $d_2$ from outside.

Similarly, the second wiring 17B (17C, 17D, 17E) is a wiring group connected to the electronic devices $D_3$, $d_3$ ($D_4$, $d_4$; $D_5$, $d_5$; $D_6$, $d_6$) mounted on the first substrate $P_{12, 3}$ ($P_{12, 4}$, $P_{12, 5}$). In the present exemplary embodiment, the second wiring 17B (17C, 17D, 17E) is provided inside the first substrate $P_{12, 1}$ and the second coupling portion $q_{13B}$ ($q_{13C}$, $q_{13D}$, $q_{13E}$).

The terminal $S_2$ ($S_3$, $S_4$, $S_5$) of the second wiring 17B (17C, 17D, 17E) is electrically connected to the electrodes 15A, not illustrated, of the second substrate $Q_{13B}$ ($Q_{13C}$, $Q_{13D}$, $Q_{13D}$).

The second wiring 17B (17C, 17D, 17E) transmits data signals including data and data-strobe signals for performing data transmission with the electronic devices $D_3$, $d_3$ ($D_4$, $d_4$; $D_5$, $d_5$; $D_6$, $d_6$) from outside.

By such a wiring configuration, the wiring length of the first wiring 16 gradually extends heading from the terminal $S_a$ in the first substrate $P_{12, 1}$ to the electronic devices $D_6$, $d_6$ in the first substrate $P_{12, 6}$. The wiring length of the first wiring 16 is the sum of at least $5 \cdot w_x$ and $L_{12}, L_{23}, L_{34}, L_{45}, L_{56}$. For example, letting $w_x$ be 20 mm, the thickness of the first substrate $P_{12, k}$ be 3 mm, the mounting heights of the electronic devices $D_k$, $d_k$ each be 2.5 mm, the wiring length of the first wiring 16 is at least approximately 120 mm.

In contrast, since the second coupling portions $q_{13A}$, $q_{13B}$, $q_{13C}$, $C_{13D}$, $q_{13E}$ become longer in this order, the wiring length of the second wirings 17A to 17E also become longer in the same order. Among the second wirings 17A to 17E, the second wiring 17E has the longest wiring length.

The wiring length of the second wiring 17E can for example be estimated as equivalent to the length $L_{13E}$ of the second coupling portion $q_{13E}$. In the case of the above numerical example, in consideration of slack and the thickness of the solder, the wiring length of the second wiring 17E is between 50 mm and 60 mm in length, not exceeding 60 mm. For this reason, the second wiring 17E is found to be substantially shorter than the longest wiring length of the first wiring 16.

The terminal $S_a$ that is connected to the electrode 15A in the second substrate $Q_{13A}$ via the electrode 14 and the terminal $S_1$ are electrically connected. Moreover, the terminals $S_2$, $S_3$, $S_4$, $S_5$ are added at the second substrates $Q_{13B}$, $Q_{13C}$, $Q_{13D}$, $Q_{13E}$, respectively. For this reason, the number of electrodes 15A required in the second substrate $Q_{13E}$ is the total of terminals $S_a$, $S_1$, $S_2$, $S_3$, $S_4$, $S_5$. This maximum number of terminals 15A is distributed over the range of the second substrate region $a_{13E}$ in the second substrate $Q_{13E}$.

Next, the electronic component of the present exemplary embodiment will be described.

Figure 8:
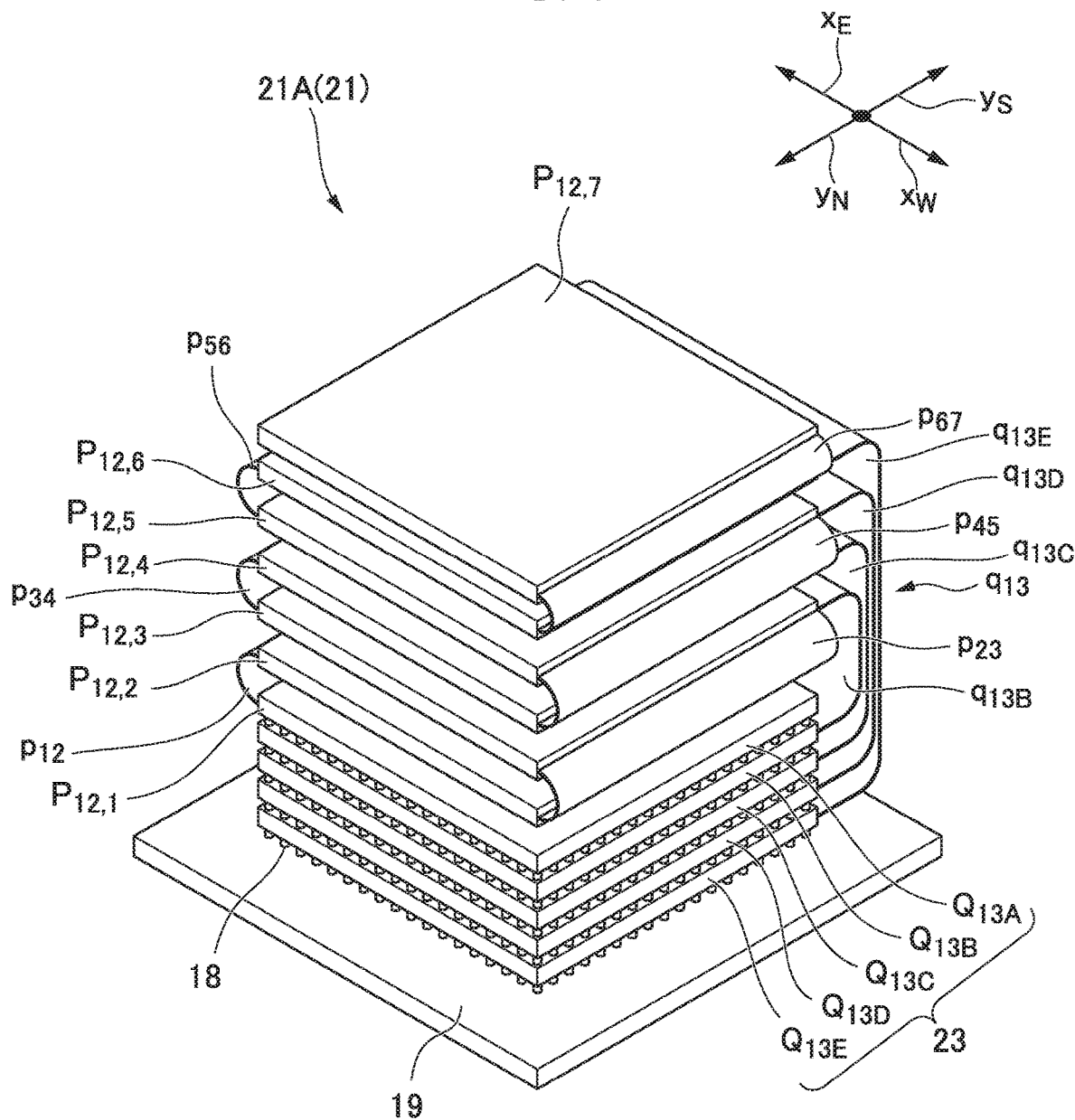
FIG. 8 is a schematic perspective view showing an example of the electronic component of the second exemplary embodiment of the present invention.
Figure 10:
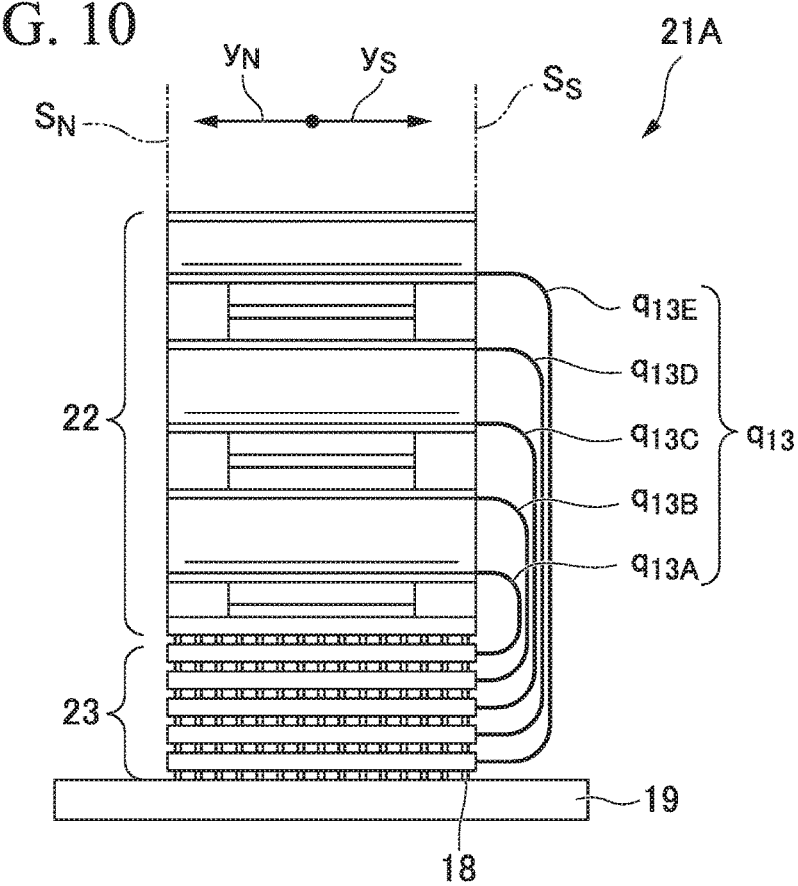
FIG. 10 is a schematic side view showing an example of the electronic component of the second exemplary embodiment of the present invention.
Figure 11:
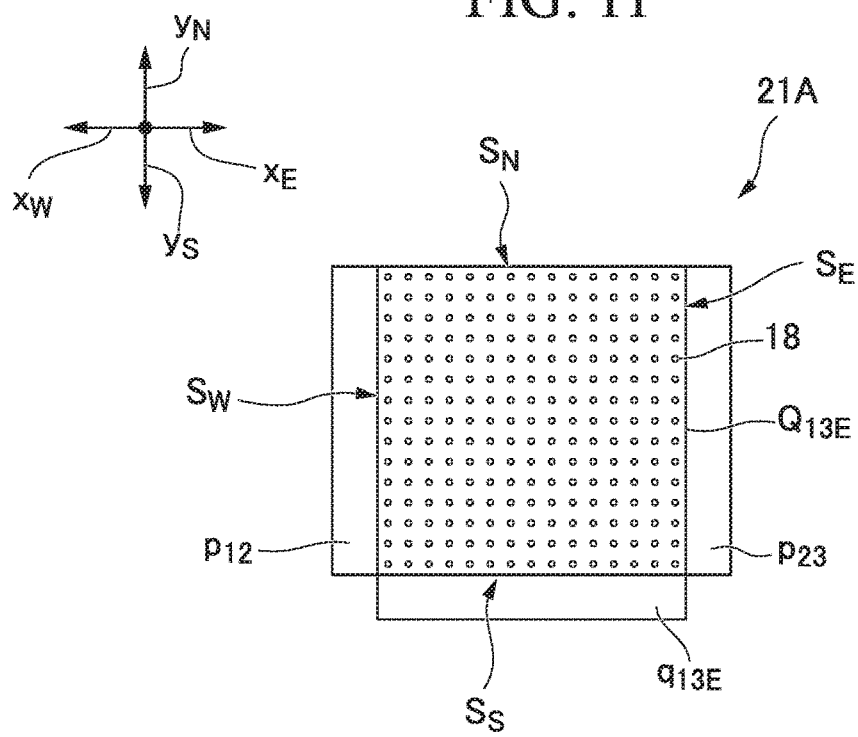
FIG. 11 is the view from A in FIG. 9.

FIG. 8 is a schematic perspective view showing an example of the electronic component of the second exemplary embodiment of the present invention. FIG. 9 is a schematic front view of the same. FIG. 10 is a schematic side view of the same. FIG. 11 is the view from A in FIG. 9.

As shown in FIG. 8, an electronic component 21A of the present exemplary embodiment is formed by folding the circuit substrate 21 of the present exemplary embodiment. Regarding the directions $x_E$, $x_W$, $y_N$, $y_S$ in FIG. 8, the directions in the first substrates $P_{12, 1}$, $P_{12, 3}$, and $P_{12, 5}$ are illustrated. In the case of referring to the directions in plan view in relation to the electronic component 21A, the directions $x_E$, $x_W$, $y_N$, $y_S$ in FIG. 8 are used.

In the electronic component 21A, the first substrates $P_{12, 2}$, $P_{12, 4}$, $P_{12, 6}$ are rotated 180° about the axis extending in direction $y_N$ from the unfolded state arrangement shown in FIG. 4. For this reason, directions $X_E$, $x_W$ of the unique directions for the first substrates $P_{12, 2}$, $P_{12, 4}$, $P_{12, 6}$ are the reverse of those indicated by the arrows.

In FIGS. 8, 9, 10, the manner in which the electronic component 21A is mounted on a master substrate 19 is depicted.

In the electronic component 21A, the second substrates $Q_{13E}$, $Q_{13D}$, $Q_{13C}$, $Q_{13B}$, $Q_{13A}$ are stacked in this order on the master substrate 19. In the present exemplary embodiment, the second substrates $Q_{13E}$, $Q_{13D}$, $Q_{13C}$, $Q_{13B}$, $Q_{13A}$ are arranged so that the outer shapes thereof overlap in plan view. The second substrates $Q_{13E}$, $Q_{13D}$, $Q_{13C}$, $Q^{13}B$, $Q_{13A}$ are soldered by the solder balls 18. Thereby, the second substrates $Q_{13E}$, $Q_{13D}$, $Q_{13C}$, $Q_{13B}$, $Q_{13A}$ are mutually connected electrically and the relative positions thereof are mutually fixed. For this reason, the second substrates $Q_{13E}$, $Q_{13D}$, $Q_{13C}$, $Q_{13B}$, $Q_{13A}$ as a whole constitute a second layered body 23 that as a whole has a rectangular parallelepiped shape.

The electronic component 21A is soldered to the electrodes, not illustrated, of the master substrate 19 by the solder balls 18 on the second substrate $Q_{13E}$ at the bottom end of the second layered body 23. Thereby, the circuit of the electronic component 21A is electrically connected to the circuit of the master substrate 19.

As shown in FIG. 9, a first layered body 22 in which the first substrates $P_{12, i}$ are stacked in the order of the subscript i from the lower side to the upper side is disposed on the upper part of the second layered body 23. In the present exemplary embodiment, the first substrates $P_{12, i}$ are arranged so that the mutual outer shapes may overlap in plan view. For this reason, the first layered body 22 as a whole is a rectangular parallelepiped. In the present exemplary embodiment, the first layered body 22 is disposed so as to overlap the outer shape of the second layered body 23 in plan view.

The first substrate $P_{12, 1}$ is arranged so that the second substrate region $a_{12, 1}$ is opposed to the first substrate region $A_{13A}$, which is located at the upper surface of the second layered body 23. The first substrate $P_{12, 1}$ is soldered to the electrodes 15a, not illustrated, on the second substrate $Q_{13A}$ by the solder balls 18 on the second substrate region $a_{12, 1}$. Thereby, the first substrate $P_{12, 1}$ and the second substrate $Q_{13A}$ are mutually connected electrically and the relative positions thereof are mutually fixed.

The first layered body 22 is formed by the first coupling portions $p_{12}$, $p_{23}$, $p_{34}$, $p_{56}$, $p_{67}$ being folded about axes parallel with the axis $O_Y$ in FIG. 4.

The electronic device $D_2$ on the first substrate $P_{12, 2}$ is joined via the joining layer 20 to the first substrate region $A_{12, 1}$ of the first substrate $P_{12, 1}$. Thereby, the first substrate $P_{12, 2}$ is stacked on the first substrate $P_{12, 1}$ in a state parallel with the first substrate $P_{12, 1}$.

The joining layer 20 may for example be formed by an adhesive agent or adhesive sheet. Since FIG. 9 is a schematic view, the thickness of the joining layer 20 is exaggerated. The joining layer 20 is thin compared to for example the mounting height of the electronic device $D_2$.

The electronic device $D_3$ on the first substrate $P_{12, 3}$ is joined via the joining layer 20 to the upper surface of the electronic device $d_2$ on the first substrate $P_{12, 2}$. Thereby, the first substrate $P_{12, 3}$ is stacked on the first substrate $P_{12, 2}$ in a state parallel with the first substrate $P_{12, 2}$.

Similarly, the first substrates $P_{12, 4}$, $P_{12, 5}$, $P_{12, 6}$ are stacked in this order on the first substrate $P_{12, 3}$.

The first substrate $P_{12, 7}$ is joined via the joining layer 20 to the upper surface of the electronic device $D_6$ on the first substrate $P_{12, 6}$. Thereby, the first substrate $P_{12, 7}$ is stacked on the first substrate $P_{12, 6}$ in a state parallel with the first substrate $P_{12, 6}$.

As shown in FIG. 9, the first coupling portions $p_{12}$, $p_{34}$, $p_{56}$ protrude from the side surface $S_E$ of the first layered body 22 on the direction $x_E$ side to the outside. The first coupling portions $p_{12}$, $p_{34}$, $p_{56}$ are arranged so as to face the side surface $S_E$.

The first coupling portions $p_{23}$, $p_{45}$, $p_{67}$ protrude from the side surface $S_W$ of the first layered body 22 on the direction $x_W$ side to the outside. The first coupling portions $P_{23}$, $P_{45}$, $p_{67}$ are arranged so as to face the side surface $S_W$.

As shown in FIG. 10, the second coupling portions $q_{13A}$, $q_{13B}$, $q_{13C}$, $q_{13D}$, $q_{13E}$, as the second coupling portion group $q_{13}$, protrude from the side surface $S_S$ of the first layered body 22 and the second layered body 23 on the direction $y_S$ side to the outside. The second coupling portions $q_{13A}$, $q_{13B}$, $q_{13C}$, $q_{13D}$, $a^{13E}$, are arranged so as to face the side surface $S_S$.

As shown in FIG. 11, none of the first coupling portions and second coupling portions face the side surface $S_N$ of the first layered body 22 and the second layered body 23 on the direction $y_N$ side.

Next, the method of manufacturing the electronic component of the present exemplary embodiment will be described with an example of the case of manufacturing the electronic component 21A.

Figure 12:
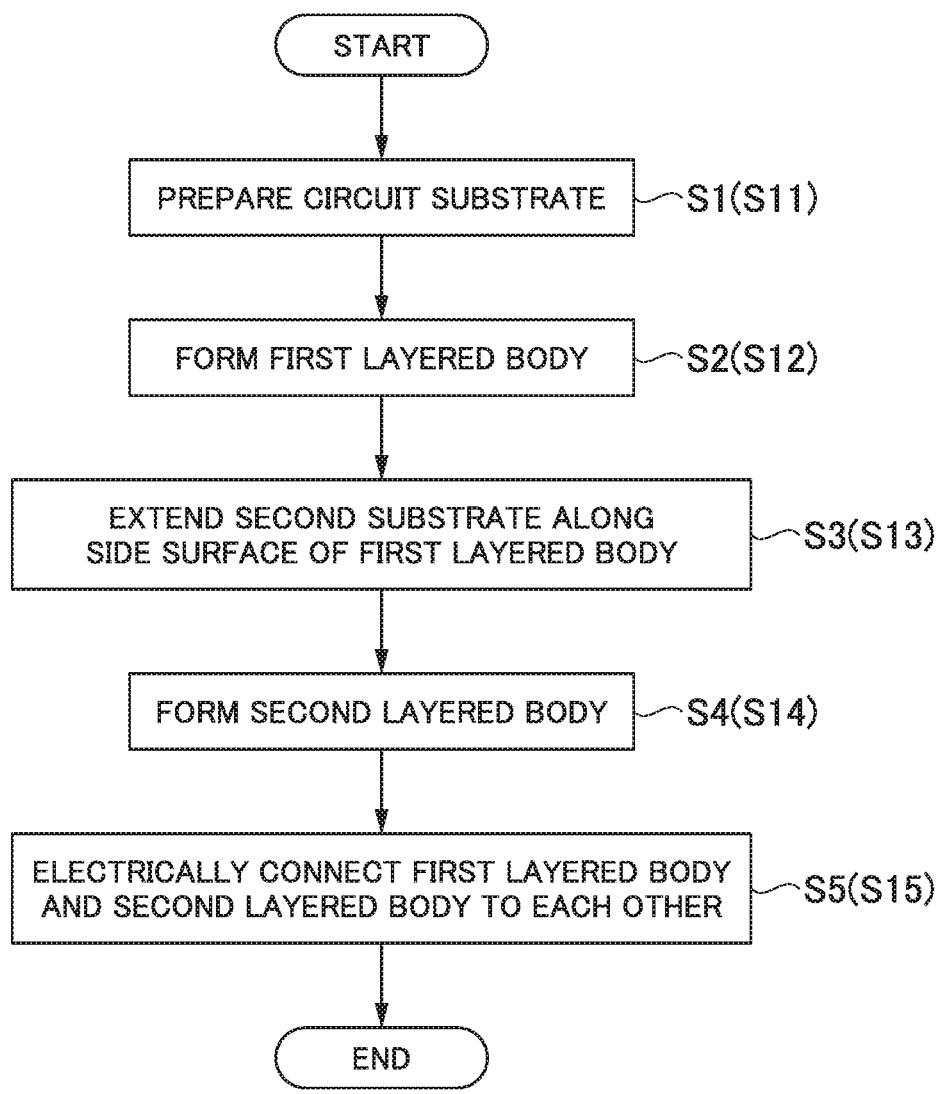
FIG. 12 is a flowchart showing an example of the method of manufacturing the electronic component of the second exemplary embodiment of the present invention.
Figure 13A:
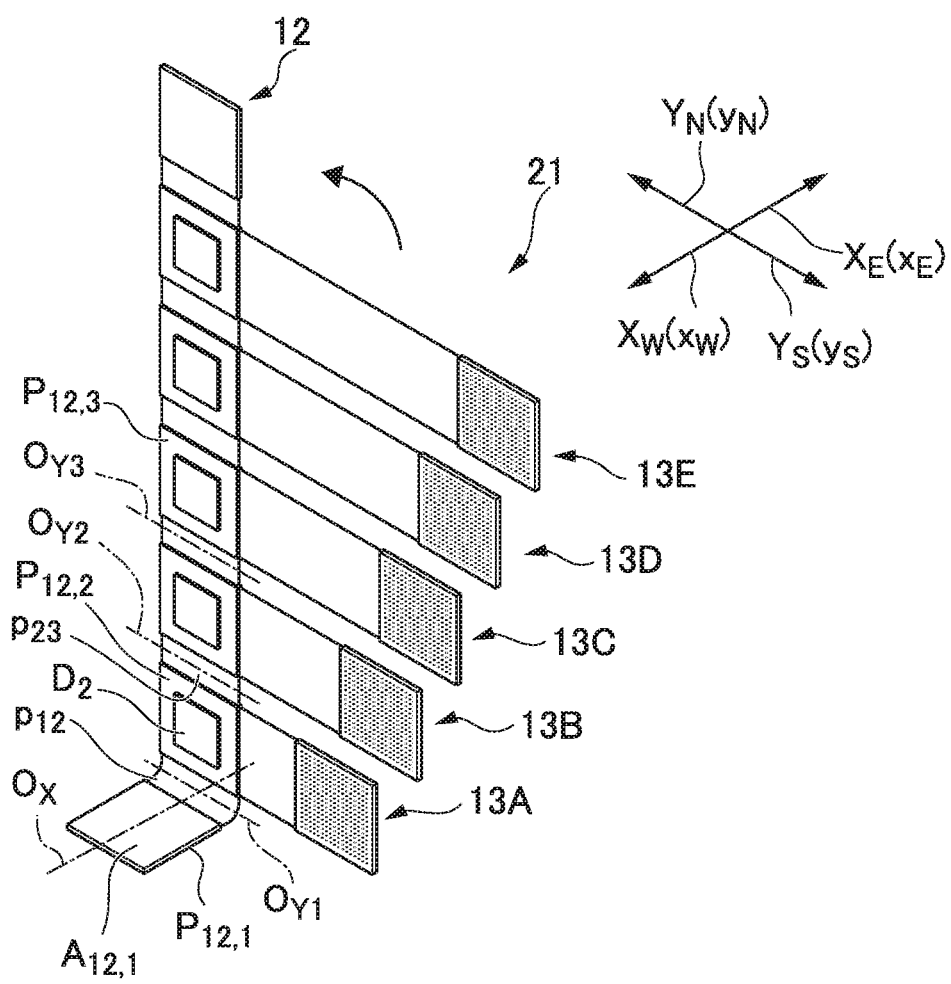
FIG. 13A is a process description diagram in the example of the method of manufacturing the electronic component of the second exemplary embodiment of the present invention.

FIG. 12 is a flowchart showing an example of the method of manufacturing the electronic component of the second exemplary embodiment of the present invention. FIGS. 13A, 13 B, 13 C and FIGS. 14A, 14 B are process description diagrams in the example of the method of manufacturing the electronic component of the second exemplary embodiment of the present invention.

To manufacture the electronic component 21A, the steps S1 to S5 shown in FIG. 12 are executed on the basis of the flowchart shown in FIG. 12.

Step S1 is a step for preparing the circuit substrate 21.

For example, the first substrate portion 12 is formed by connecting the first substrates $P_{12}$ with the first coupling portions $p_{mM}$. The second substrate portions 13A to 13E are then connected to the first substrates $P_{12, k}$ of the first substrate portion 12. Thereby, the substrate 11 is formed. However, the manufacturing sequence of the substrate 11 is not limited thereto.

After the substrate 11 is manufactured, the electronic devices $D_k$, $d_k$ are mounted on the first substrates $P_{12, k}$. Thereby, the circuit substrate 21 is prepared.

After Step S1, Step S2 is performed. Step S2 is the step for forming the first layered body 22.

For example, a material such as an adhesive agent or adhesive sheet that forms the joining layer 20 is disposed on the upper surface of the electronic devices $D_k$, $d_k$ of the circuit substrate 21. However, the material forming the joining layer 20 may be disposed on the upper surface of the electronic devices $D_k$, $d_k$ as necessary with each folding operation described below.

Subsequently, as shown in FIG. 13A, in the circuit substrate 21 in the unfolded state, the first coupling portion $p_{12}$ is folded about the axis $O_{Y1}$ that is perpendicular to axis $O_X$ and extends in direction $Y_N$. The folding direction is the direction in which for example the first coupling portion $p_{23}$ rises from the unfolded state and moves in direction $X_W$. At this time, by the use of a holding tool not illustrated, the portions excluding the first substrate $P_{12, 1}$ and the first coupling portion $p_{12}$ in the circuit substrate 21 may be totally rotated.

When the first substrate $P_{12, 2}$ has been rotated 180°, the upper surface of the electronic device $D_2$ abuts the first substrate region $A_{12, 1}$ of the first substrate $P_{12, 1}$. The first substrate $P_{12, 2}$ is thereby stacked on the first substrate $P_{12, 1}$.

Subsequently, the first coupling portion $p_{23}$ is folded about axis $O_{Y2}$ that is perpendicular to axis $O_X$ and extends in direction $Y_N$. The folding direction is the direction in which for example the first coupling portion $p_{34}$ rises from the horizontal state and moves in direction $X_E$.

Figure 13B:
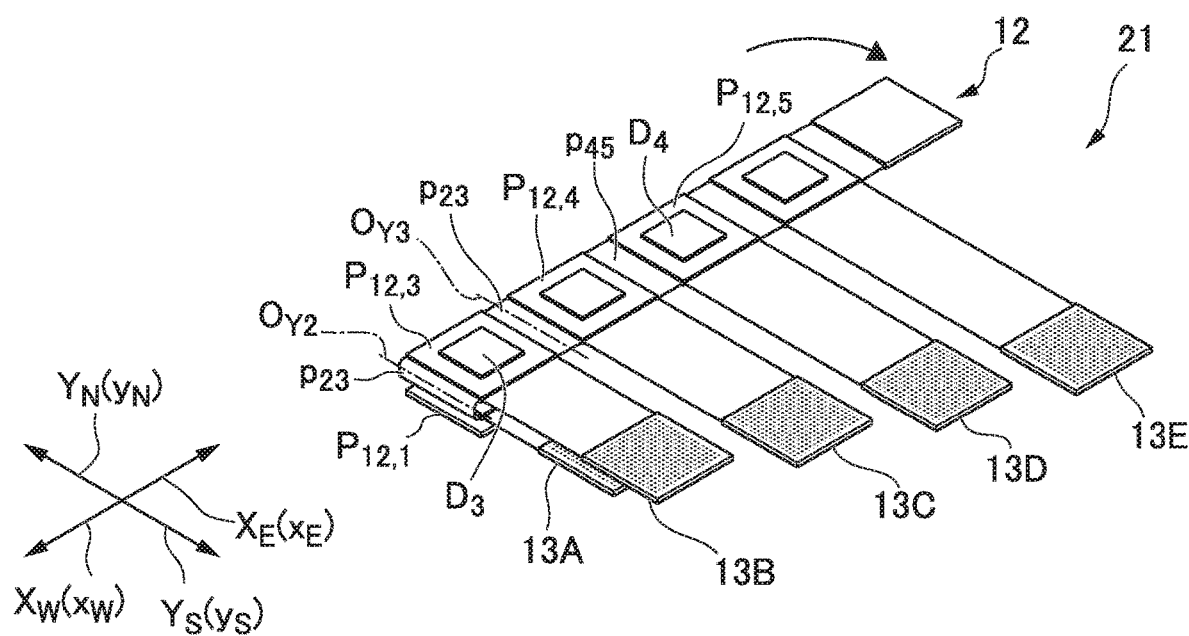
FIG. 13B is a process description diagram in the example of the method of manufacturing the electronic component of the second exemplary embodiment of the present invention.

As shown in FIG. 13B, when the first substrate $P_{12, 3}$ is rotated 180°, the upper surface of the electronic device $d_3$, not illustrated, abuts the upper surface of the electronic device $d_2$, not illustrated, on the first substrate $P_{12, 2}$. The first substrate $P_{12, 3}$ is thereby stacked on the first substrate $P_{12, 2}$.

Subsequently, the first coupling portion $p_{23}$ is folded about the axis $O_{Y3}$ that is perpendicular to axis $O_X$ and extends in direction $Y_N$. The folding direction is the direction in which for example the first coupling portion $p_{45}$ rises from the unfolded state and moves in direction $X_W$.

When the first substrate $P_{12,4}$ is rotated 180°, the upper surface of the electronic device $D_4$ abuts the upper surface of the electronic device $D_4$ on the first substrate $P_{12, 3}$. The first substrate $P_{12, 4}$ is thereby stacked on the first substrate $P_{12, 3}$.

Subsequently, in the same manner, the first coupling portion $p_{45}$ is folded about the axis $O_{Y4}$ that is perpendicular to axis $O_X$ and extends in direction $Y_N$. The folding direction is the direction in which for example the first coupling portion $p_{56}$ rises from the unfolded state and moves in direction $X_E$.

Figure 13C:
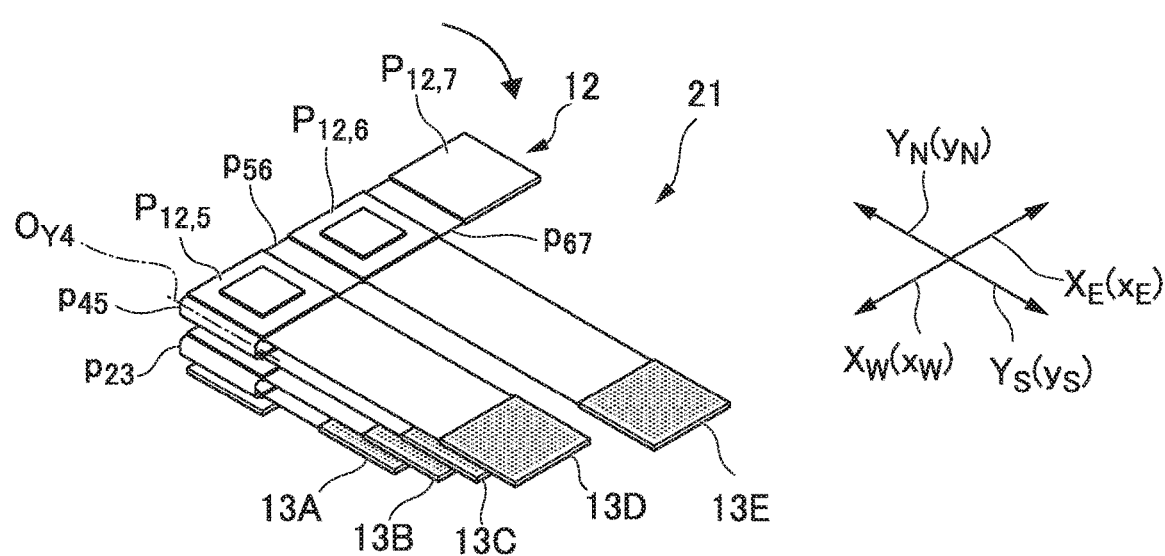
FIG. 13C is a process description diagram in the example of the method of manufacturing the electronic component of the second exemplary embodiment of the present invention.

In this way, when the first substrate $P_{12,5}$ is rotated 180°, as shown in FIG. 13C, the first substrate $P_{12, 5}$ is stacked on the first substrate $P_{12, 4}$ not illustrated.

Figure 14A:
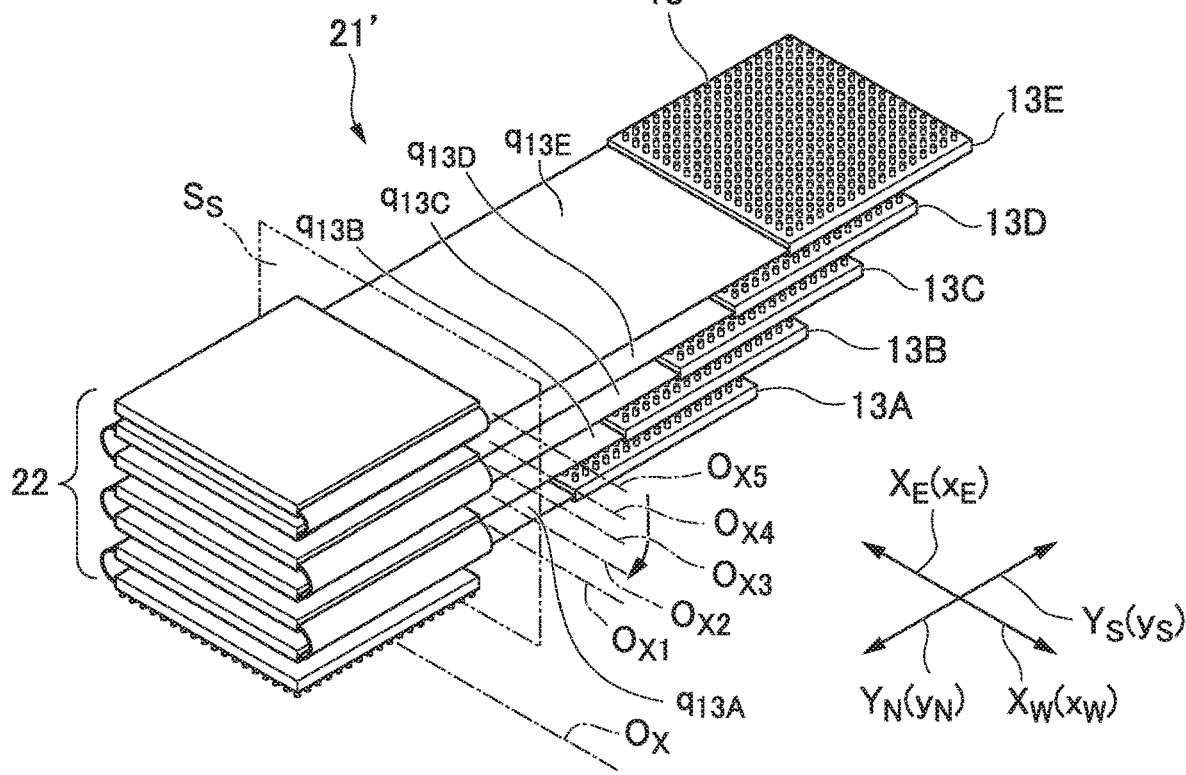
FIG. 14A is a process description diagram in the example of the method of manufacturing the electronic component of the second exemplary embodiment of the present invention.

Moreover, as shown in FIG. 14A, the first layered body 22 is formed by the first coupling portions $p_{56}$, $p_{67}$ being alternately folded in opposite directions, similarly to described above.

Hereinbelow, as shown in FIG. 14A, the layered body in which the second substrates $Q_{13A}$, $Q_{13B}$, $Q_{13C}$, $Q_{13D}$, $Q_{13E}$ extend in direction $y_S$ from the side surface $S_S$ of the first layered body 22 is called an intermediate layered body 21'.

Subsequently, the material forming the joining layer 20 is cured to mutually fix the relative positions of the first substrates $P_{12, i}$. However, when it is possible to maintain the relative mutual positions of the first substrates $P_{12, i}$ without curing the material forming the joining layer 20, the material forming the joining layer 20 need not be cured in this step.

This concludes Step S2.

The axes of folding the first coupling portions $p_{mM}$ such as axes $O_{Y1}$, $O_{Y2}$, $O_{Y3}$, and $O_{Y4}$ are axes that intersect the coupling paths of the first substrates $P_{12, i}$ along the axis $O_X$. The axes such as $O_{Y1}$, $O_{Y2}$, $O_{Y3}$, and $O_{Y4}$ are also called first axes.

After Step S2, Steps S3 and S4 are performed.

Step S3 is a step of extending the second substrates $Q_{13A}$, $Q_{13B}$, $Q_{13C}$, $Q_{13D}$, $Q_{13E}$ along the side surface of the first layered body 22.

Step S4 is a step for forming the second layered body 23.

Steps S3 and S4 may be performed in this order, or Step S4 may be performed in parallel with Step S3 after Step S3 is started.

Hereinbelow, as one example, an example of the case of Step S4 being performed in parallel with Step S3 after Step S3 is started will be described.

In Step S3, the second coupling portions $q_{13A}$, $q_{13B}$, $q_{13C}$, $q_{13D}$, $q_{13E}$ in the first layered body 22 of the intermediate layered body 21' are folded. The folding operations are performed about the axes $O_{X1}$, $O_{X2}$, $O_{X3}$, $O_{X4}$, $O_{X5}$, respectively (refer to FIG. 14A). The axes $O_{X1}$, $O_{X2}$, $O_{X3}$, $O_{X4}$, $O_{X5}$ are axes parallel with the axis $O_X$ and pass through the vicinity of the side surface of each first substrate $P_{12, k}$ in direction $y_S$.

The axes $O_{X1}$, $O_{X2}$, $O_{X3}$, $O_{X4}$, $O_{X5}$ are axes that intersect the connection direction of the second substrates $Q_{13A}$, $Q_{13B}$, $Q_{13C}$, $Q_{13D}$, $Q_{13E}$. The axes $O_{X1}$, $O_{X2}$, $O_{X3}$, $O_{X4}$, $O_{X5}$ are at times called second axes.

Step S3 is started by for example folding the second coupling portion $q_{13A}$ about the axis $O_{X1}$. The folding direction is the direction in which the second substrate $Q_{13A}$ is moved downward of the first substrate $P_{12, 1}$.

Figure 14B:
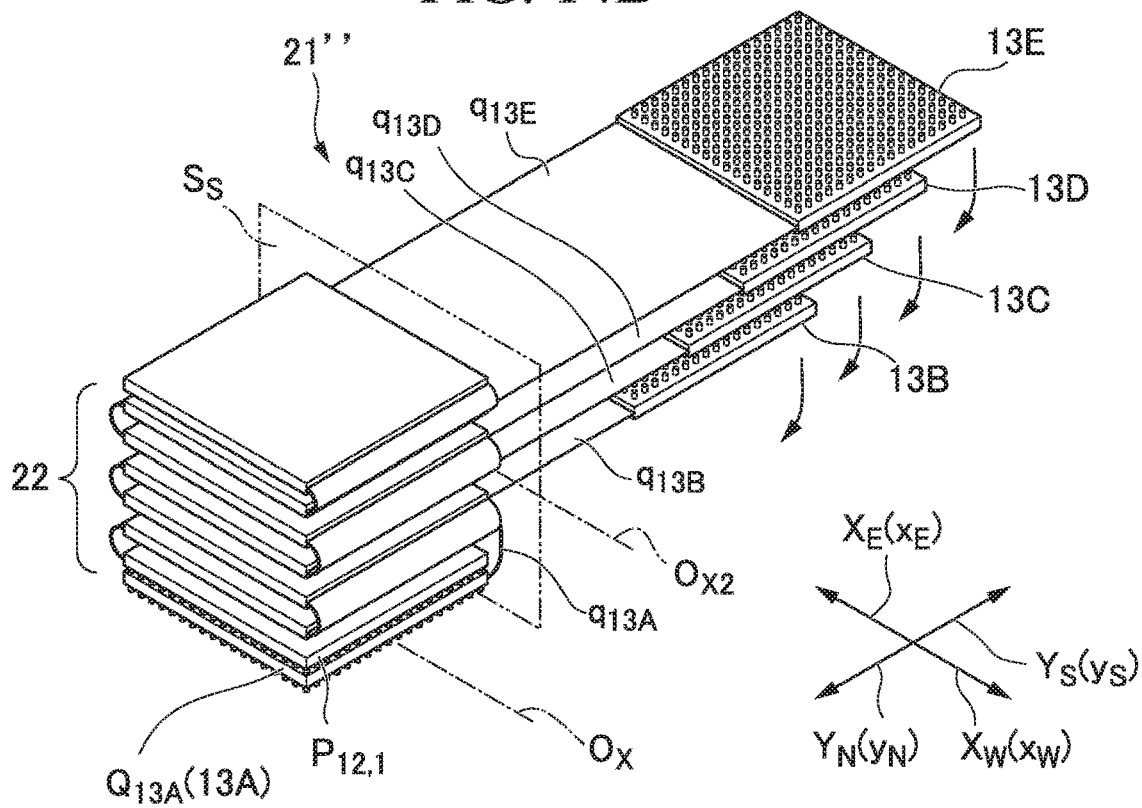
FIG. 14B is a process description diagram in the example of the method of manufacturing the electronic component of the second exemplary embodiment of the present invention.

FIG. 14B shows the appearance after the folding of the second coupling portion $q_{13A}$ is completed, with the second coupling portion $q_{13A}$ disposed along the side surface $S_S$ of the first layered body 22.

After the second coupling portion $q_{13A}$ is disposed along the side surface $S_S$ of the first layered body 22, the second coupling portion $q_{13A}$ is further folded in the vicinity of the connection position with the second substrate $Q_{13A}$. With the operation, Step S4 for forming the second layered body 23 is started.

The second substrate $Q_{13A}$ is arranged stacked in parallel with the first substrate $P_{12,\,1}$ on the lower side of the first substrate $P_{12,\,1}$. In this case, by providing a certain degree of slack in the length $L_{13A}$ of the second coupling portion $q_{13A}$ in advance, it is possible to adjust the position of the second substrate $Q_{13A}$ with respect to the first substrate $P_{12,\,1}$ in plan view.

The electrodes 15a, not illustrated, of the second substrate $Q_{13A}$ are aligned at positions abutting the solder balls 18 on the electrodes 14, not illustrated, of the first substrate $P_{12,\,1}$.

In this way, an intermediate layered body 21" is formed.

Afterward, the second coupling portion $q_{13B}$ is similarly folded about the axis $O_{X2}$. The second coupling portion $q_{13B}$, after being disposed along the side surface $S_S$ of the first layered body 22, is further folded in the vicinity of the connection position with the second substrate $Q_{13B}$. The second substrate $Q_{13B}$ is arranged stacked in parallel with the second substrate $Q_{13A}$ on the lower side of the second substrate $Q_{13A}$.

The electrodes 15a, not illustrated, of the second substrate $Q_{13B}$ are aligned at positions abutting the solder balls 18 on the electrodes 15A, not illustrated, of the second substrate $Q_{13A}$.

The folding operations of the second coupling portions $q_{13C}$, $q_{13D}$, $q_{13E}$, and the position alignment operations of the second substrates $Q_{13C}$, $Q_{13D}$, $Q_{13E}$ are similarly performed.

In this way, an intermediate layered body, not illustrated, in which the first layered body 22 and the second layered body 23 are stacked is formed. In this intermediate layered body, since the first layered body 22 and the second substrates $Q_{13A}$, $Q_{13B}$, $Q_{13C}$, $Q_{13D}$, $Q_{13E}$ are not mutually connected electrically, the intermediate layered body includes the circuit substrate 21 in a folded state.

This concludes Steps S3 and S4.

After Step S4, Step S5 is performed. Step S5 is a step for mutually connecting electrically the first layered body 22 and the second layered body 23.

The first layered body 22 and the second layered body 23 are mutually connected electrically by soldering using the solder balls 18 between the first substrate $P_{12,\,1}$ and the second layered body 23, and the solder balls 18 within the second layered body 23.

Step S5 is performed by the circuit substrate 21 being heated in the folded state formed in Step S4. When the soldering is completed, the electronic component 21A shown in FIG. 8 is formed.

This concludes Step S5.

In the above description of Step S5, the case is described of the electronic component 21A being manufactured from the folded-state circuit substrate 21. However, in Step S5, heat may also be applied in the state of the folded-state circuit substrate 21 being arranged on the master substrate 19. In this case, the formation of the electronic component 21A and the mounting of the electronic component 21A to the master substrate 19 are simultaneously performed in Step S5.

As described above, according to the substrate 11 and the circuit substrate 21, the first substrates $P_{12,\,i}$ and the second substrates $Q_{13A}$, $Q_{13B}$, $Q_{13C}$, $Q_{13D}$, $Q_{13E}$ are connected by the first coupling portions $p_{mM}$ and the second coupling portions $q_{13A}$, $q_{13B}$, $q_{13C}$, $q_{13D}$, $q_{13E}$. The first coupling portions $p_{mM}$ and the second coupling portions $q_{13A}$, $q_{13B}$, $q_{13C}$, $q_{13D}$, $q_{13E}$ are all foldable.

The first layered body 22 and the second layered body 23 are formed by the circuit substrate 21 being put in a folded state as described above.

The electronic component 21A is manufactured by the first layered body 22 and the second layered body 23 being electrically connected in the folded-state circuit substrate 21.

The electronic devices $D_k$, $d_k$ in the electronic component 21A of the present exemplary embodiment are mounted on the front and rear surfaces of the first substrates $P_{12,\,k}$. The electronic devices $D_k$, $d_k$ are arranged in the first layered body 22 in which the first substrates $P_{12,\,k}$ are stacked. Moreover, the first layered body 22 is stacked on the second layered body 23 having the same size in plan view. For this reason, compared to the case of the electronic devices $D_k$, $d_k$ being two-dimensionally mounted a substrate that cannot be folded, the electronic component 21A in plan view is reduced in size.

Moreover, in the electronic component 21A of the present exemplary embodiment, the wiring is divided between the first wiring 16 and the second wirings 17A to 17E.

The first wiring 16 disposed in the first substrate portion 12 is wiring that transmits common signals to the electronic devices $D_k$, $d_k$. The first wiring 16 has a wiring length corresponding to the length of the first substrate portion 12. However, there is no risk of degradation of the control signals and address signals transmitted in the first wiring 16 over a wiring length equal to the length of the first substrate portion 12.

Since the first wiring 16 disposed in the first substrate portion 12 passes through all of the first substrates $P_{12,\,i}$, the number and size of the lead wires in the first wiring 16 are constrained by the surface area of the first substrates $P_{12,\,i}$.

In the present exemplary embodiment, since the first wiring 16 transmits control signals and address signals, the number of lead wires is fixed regardless of the number of electronic devices $D_k$, $d_k$. For example, in the case of the electronic devices $D_k$, $d_k$ being RAM, the number of lead wires in the first wiring 16 may be 33.

For this reason, since it is possible to limit the surface area for wiring of the first substrates $P_{12,\,i}$, the surface area of the first substrates $P_{12,\,i}$ needs only be slightly larger than the mounting area of the electronic devices $D_k$, $d_k$. This point enables downsizing of the electronic component 21A.

By the reduction in size of the electronic component 21A, it is possible to enhance the mounting density also from the point that the mounting space of the electronic component 21A can be reduced.

In contrast, when also transmitting data signals in the first wiring 16, the number of lead wires for data signals is for example 22. In particular, since the number of lead wires formed in the first substrate $P_{12,\,1}$ thereby becomes 55, an increase in the surface area of the first substrate $P_{12,\,1}$ results.

The second wirings 17A to 17E arranged in the second substrate portions 13A to 13E are dedicated lead wires extended from the electronic devices $D_k$, $d_k$ on the first substrates $P_{12,\,k}$.

As a result, it is possible to independently transmit data signals related to each of the electronic devices $D_k$, $d_k$. Since parallel data transmission thereby becomes possible, the actual transmission speed is increased.

The second wirings 17A to 17E extend through the second coupling portions $q_{13A}$, $q_{13B}$, $q_{13C}$, $q_{13D}$, $q_{13E}$ to the second substrates $Q_{13A}$, $Q_{13B}$, $Q_{13C}$, $Q_{13D}$, $Q_{13E}$. For this reason, it is possible to form the second wirings 17A to 17E within the range of the width $w_x$ of the second substrates $Q_{13A}$, $Q_{13B}$, $Q_{13C}$, $Q_{13D}$, $Q_{13E}$. For example, if the second wirings 17A to 17E each have 22 lead wires, it is possible to secure a sufficient wiring width as needed. For this reason, the wire resistance is reduced, and signal loss is inhibited with the second wirings 17A to 17E. Thereby, high-speed transmission is possible.

Moreover, since it is possible to widen the width of the wiring, it is possible to inhibit damage to the lead wires due to bending.

Furthermore, as described above each lead wire length of the second wirings 17A to 17E can be made shorter than the lead wire length of the first wiring 16, even in the case of the second wiring 17E having the longest length. In view of this aspect as well, it is possible to reduce the wire resistance of the second wirings 17A to 17E.

In the electronic component 21A, since the wiring is divided into the first wiring 16 and the second wirings 17A to 17E, the number of lead wires present in each of the first coupling portions $p_{mM}$ and the second coupling portions $q_{13A}$, $q_{13B}$, $q_{13C}$, $q_{13D}$, $q_{13E}$ is reduced. For this reason, compared to the case of a greater number of wires being disposed, the flexibility of the first coupling portions $p_{nM}$ and the second coupling portions $q_{13A}$, $q_{13B}$, $q_{13C}$, $q_{13D}$, $q_{13E}$ is increased. As a result, during the manufacturing process, the first coupling portions $p_{mM}$ and the second coupling portions $q_{13A}$, $q_{13B}$, $q_{13C}$, $q_{13D}$, $q_{13E}$ become easier to bend. As a result, manufacturing of the electronic component 21A becomes easier.

Moreover, due to the increased flexibility, it is possible to reduce the curvature radius during bending of the first coupling portions $p_{mM}$ and the second coupling portions $q_{13A}$, $q_{13B}$, $q_{13C}$, $q_{13D}$, $q_{13E}$. For this reason, it is possible to reduce the protrusion amount of the first coupling portions $p_{mM}$ and the second coupling portions $q_{13A}$, $q_{13B}$, $q_{13C}$, $q_{13D}$, $q_{13E}$ from the first layered body 22 and the second layered body 23. In view of this aspect as well, reduction in size of the electronic component 21A is possible.

With the substrate 11, the circuit substrate 21, and the electronic component 21A of the present exemplary embodiment described above, even when the mounted quantity of electronic devices is increased, it is possible to achieve a mounting space savings, and manufacturing is also easy.

Third Exemplary Embodiment

The third exemplary embodiment of the electronic component of the present invention will be described.

Figure 15:
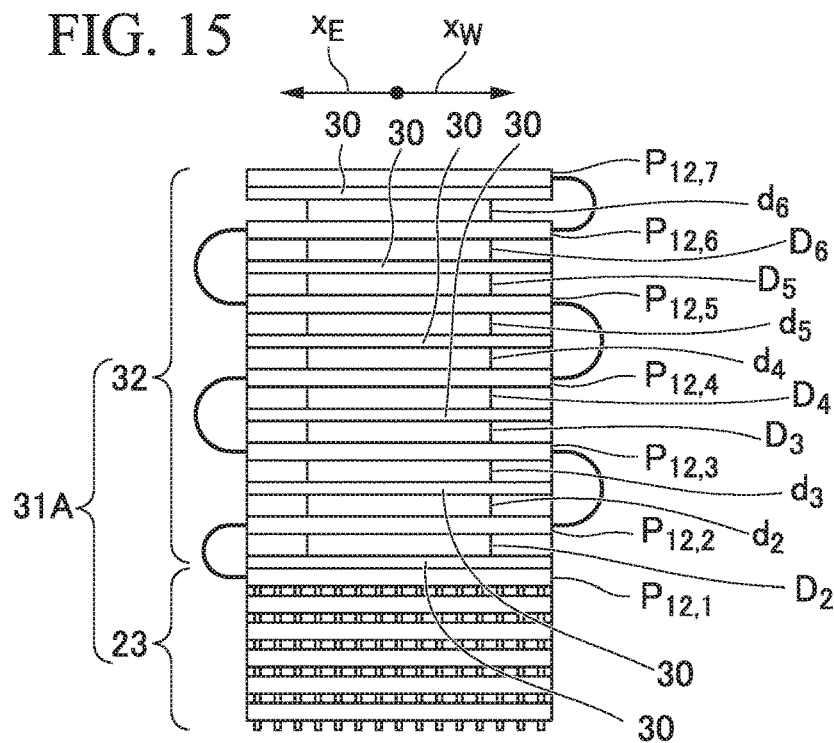
FIG. 15 is a schematic front view showing an example of the electronic component of the third exemplary embodiment of the present invention.
Figure 16:
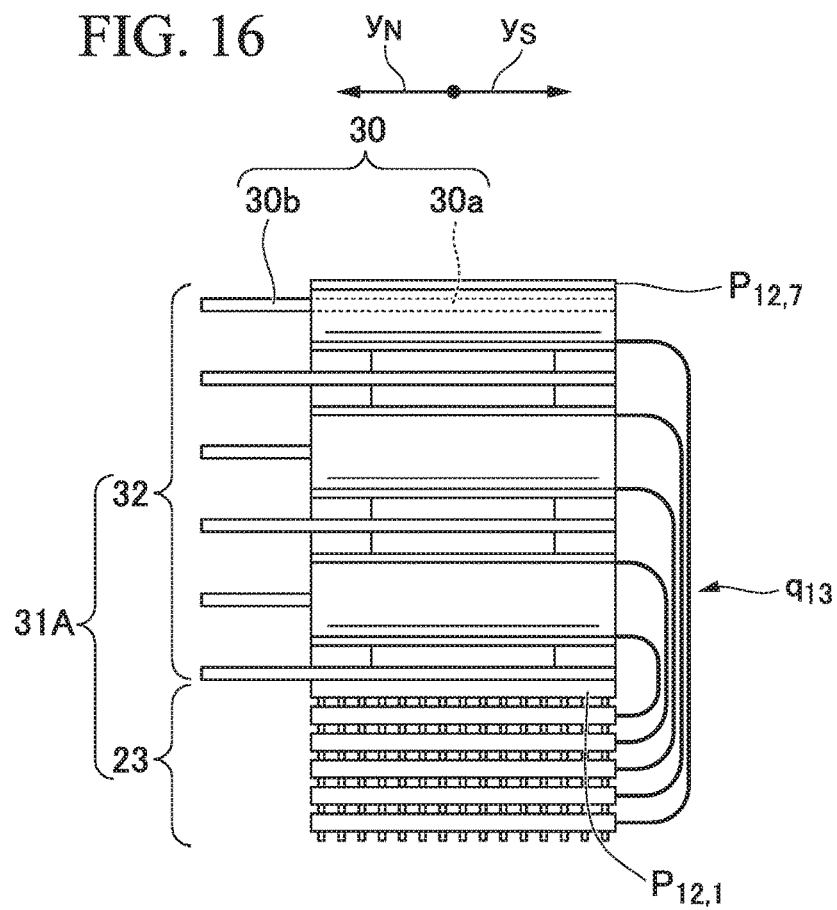
FIG. 16 is a schematic side view showing an example of the electronic component of the third exemplary embodiment of the present invention.

FIG. 15 is a schematic front view showing an example of the electronic component of the third exemplary embodiment of the present invention. FIG. 16 is a schematic side view of the same.

As shown in FIGS. 15 and 16, an electronic component 31A of the present exemplary embodiment includes a first layered body 32 in place of the first layered body 22 in the electronic component 21A of the second exemplary embodiment.

The first layered body 32 is constituted by adding a heatsink 30 to the first layered body 22 in the second exemplary embodiment.

Hereinbelow, the third exemplary embodiment will be described focusing on the points of difference with the second exemplary embodiment.

The heatsink 30 is constituted with a metal plate having good thermal conductivity, such as a copper plate or an aluminum plate. The size of the heatsink 30 may be width $w_x$ or less and length $w_y$ or greater.

The heatsink 30 shown in FIGS. 15 and 16 is constituted with a metal plate that is rectangular in plan view having width $w_x$ and length $w_y + \Delta$ ($\Delta$ being 0 or more).

The heatsink 30 is inserted between the first substrate $P_{12, 1}$ and the electronic device $D_2$, between the electronic devices $d_2$ and $d_3$, between the electronic devices $D_3$ and $D_4$, between the electronic devices $d_4$ and $d_5$, between the electronic devices $D_5$ and $D_6$, and between the electronic device $d_6$ and the first substrate $P_{12, 7}$.

At each insertion position, the heatsink 30 is joined by a thermally conductive adhesive agent to the first substrate $P_{12, 1}$, the electronic devices $D_k$, $d_k$, and the first substrate $P_{12, 7}$, respectively.

Each heatsink 30 has a layered body insertion portion 30a that has a size of $w_x \times w_y$ and an external projection portion 30b having a size of $w_x \times \Delta$.

The layered body insertion portion 30a of each heatsink 30 is arranged at a position that overlaps the first substrate $P_{12, i}$ in plan view. As shown in FIG. 16, the external projection portion 30b of each heatsink 30 projects from the side surface on the direction $y_N$ side further to the outside than each first substrate $P_{12, i}$.

In this way, the first layered body 32 is constituted by a plurality of the heatsinks 30 being inserted in the first layered body 22 of the second exemplary embodiment.

Such an electronic component 31A is manufactured similarly to the second exemplary embodiment above except for sandwiching the heatsink 30 in turns when folding the circuit substrate 21 in the same manner as in the second exemplary embodiment.

The electronic component 31A of the present exemplary embodiment is constituted by the heatsink 30 being added to the first layered body 22 in the second exemplary embodiment. For this reason, similarly to the second exemplary embodiment, it is possible to achieve a mounting space savings even if the mounted quantity of electronic devices is increased, and manufacturing is also easy.

In particular, since the present exemplary embodiment is provided with the heatsink 30, the heat discharging efficiency from the electronic devices $D_k$, $d_k$ in the first layered body 32 improves. For this reason, even if many electronic devices are included, a rise in temperature of the electronic devices is inhibited. As a result, even if the mounted quantity of electronic devices in the electronic component 31A is increased, more stable operation is possible.

Fourth Exemplary Embodiment

The electronic component of the fourth exemplary embodiment of the present invention will be described.

Figure 17:
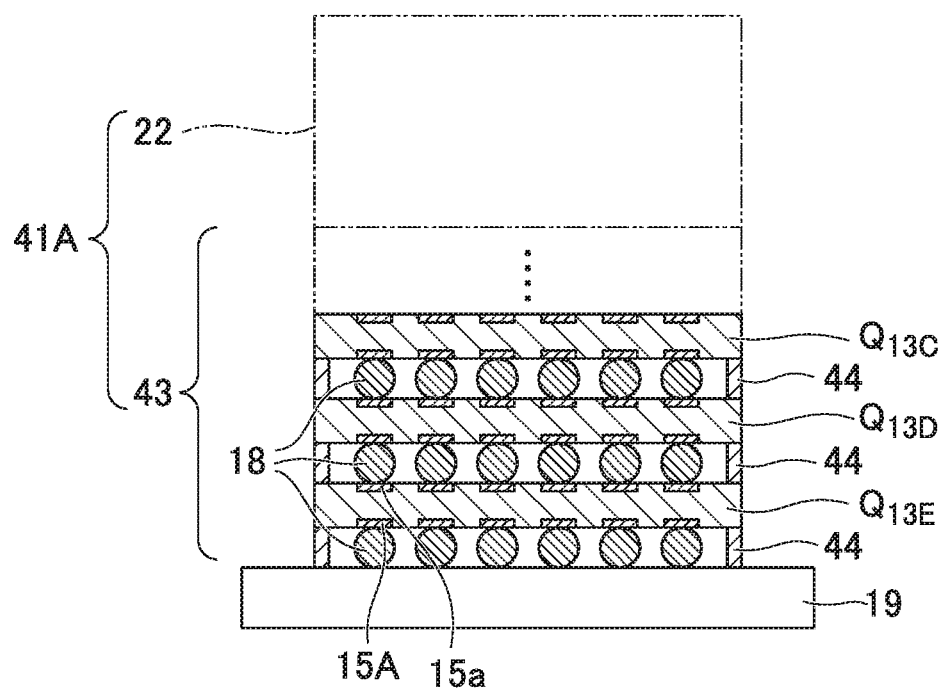
FIG. 17 is a schematic front view showing an example of the electronic component of the fourth exemplary embodiment of the present invention.

FIG. 17 is a schematic front view showing an example of the electronic component of the fourth exemplary embodiment of the present invention.

As shown in FIG. 17, an electronic component 41A of the present exemplary embodiment includes a second layered body 43 in place of the second layered body 23 in the electronic component 21A of the second exemplary embodiment.

The first layered body 42 is constituted by adding a stopper 44 to the second layered body 23 in the second exemplary embodiment.

Hereinbelow, the fourth exemplary embodiment will be described focusing on the points of difference with the second exemplary embodiment.

As shown schematically in FIG. 17, the stopper 44 regulates the opposing interval between the second substrates $Q_{13E}$, $Q_{13D}$, $Q_{13C}$, $Q_{13B}$, $Q_{13A}$ included in the second layered body 43 (the second substrates $Q_{13B}$, $Q_{13A}$ are omitted in the figure). During the melting of the solder balls 18, the stopper 44 regulates the opposing interval between the second substrates so that defective soldering does not occur due to the solder balls 18 being overly crushed. The opposing interval between the second substrates secured by the stopper 44 is a height of around 0.5 mm during typical BGA solder bonding, when the solder ball pitch is for example 1 mm. The opposing interval between the second substrates is set so as to be able to secure the interval for solder bonding and prevent the melting together of adjacent solder joints when solder balls are crushed. For example, the stopper 44 thickness may be 0.3 mm or more and 0.4 mm or less.

Provided the stopper 44 is capable of regulating the opposing distance between second substrates, the shape and material thereof are not particularly limited.

For example, the stopper 44 may be formed in a frame shape that encloses the solder balls 18. The stopper 44 may also be constituted from columnar members or wall-like members that are arranged spaced apart in the circumferential direction at the periphery of each substrate.

As the material of the stopper 44, a resin material, a metallic material or the like having heat resistance to the temperature at the time of soldering may be used.

The arrangement means of the stopper 44 is not particularly limited.

For example, among the second substrates $Q_{13A}$, $Q_{13B}$, $Q_{13C}$, $Q_{13D}$, $Q_{13E}$ in the substrate 11 or circuit substrate 21, the stopper 44 may be provided by being affixed in the substrate region where the solder balls 18 are provided.

For example, in the manufacturing process of the electronic component 41A, the stopper 44 may be arranged between the second substrates when forming the second layered body 43.

The electronic component 41A is manufactured similarly to the second exemplary embodiment, other than arranging the stoppers 44 until forming the second layered body 43.

The electronic component 41A of the present exemplary embodiment is constituted by the stopper 44 being added to the second layered body 23 in the second exemplary embodiment. For this reason, similarly to the second exemplary embodiment, it is possible to achieve a mounting space savings even if the mounted quantity of electronic devices is increased, and manufacturing is also easy.

In particular, since the present exemplary embodiment is provided with the stopper 44, when electrically connecting the first layered body 22 and the second layered body 43, the solder balls 18 are not excessively crushed. For this reason, it is possible to prevent defective soldering. As a result, even if the mass of the first layered body 22 increases due to for example an increase in the number of electronic devices, the electronic device 41A is easily manufactured.

Fifth Exemplary Embodiment

The fifth exemplary embodiment of the electronic component of the present invention will be described.

Figure 18:
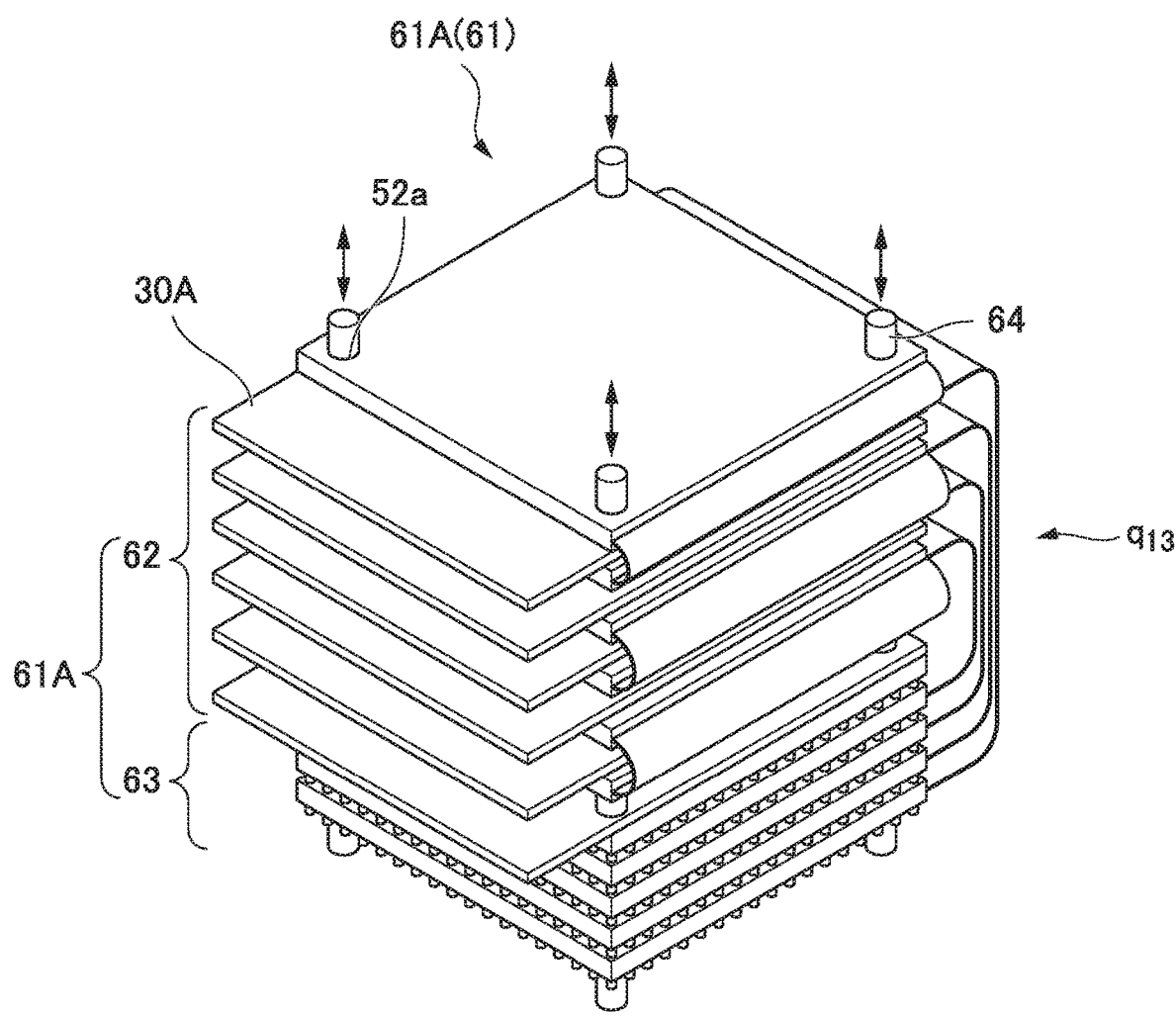
FIG. 18 is a schematic perspective view showing an example of the electronic component of the fifth exemplary embodiment of the present invention.
Figure 19:
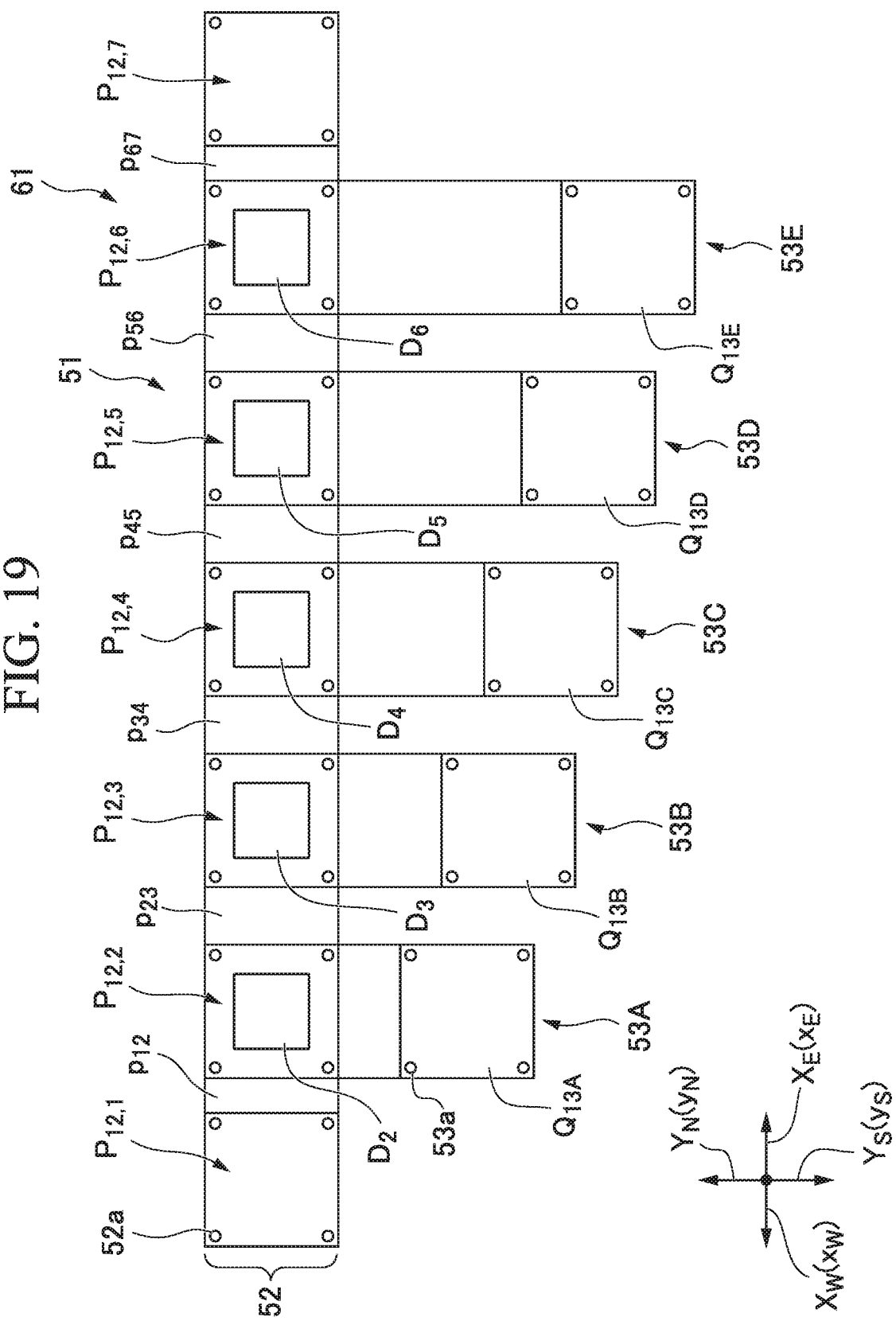
FIG. 19 is a schematic plan view showing an example of the substrate of the fifth exemplary embodiment of the present invention.
Figure 20:
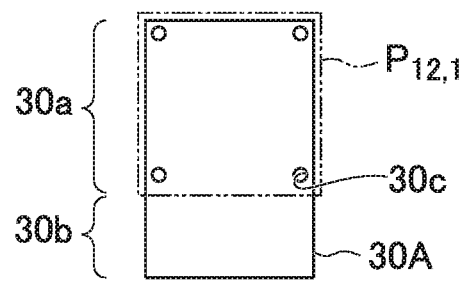
FIG. 20 is a schematic plan view of the heatsink used in one example of the electronic component of the fifth exemplary embodiment of the present invention.

FIG. 18 is a schematic perspective view showing an example of the electronic component of the fifth exemplary embodiment of the present invention. FIG. 19 is a schematic plan view of the same. FIG. 20 is a schematic plan view of the heatsink used in one example of the electronic component of the fifth exemplary embodiment of the present invention.

As shown in FIG. 18, an electronic component 61A of the present exemplary embodiment includes a first layered body 62 and a second layered body 63 in place of the first layered body 32 and the second layered body 23 in the electronic component 31A of the third exemplary embodiment, with guide rods 64 being added.

The first layered body 62 and the second layered body 63 are formed by a circuit substrate 61 of the present exemplary embodiment being folded, in place of the circuit substrate 21 of the third exemplary embodiment.

Hereinbelow, the fifth exemplary embodiment will be described focusing on the points of difference with the third exemplary embodiment.

FIG. 19 schematically shows the circuit substrate 61 in the unfolded state. For simplicity, illustration of some portions of the constitution similar to the circuit substrate 21 is omitted in FIG. 19.

The circuit substrate 61 includes a first substrate portion 52 and second substrate portions 53A, 53B, 53C, 53D, 53E in place of the first substrate portion 12, and the second substrate portions 13A to 13E in the circuit substrate 21 of the second exemplary embodiment. For simplicity hereinbelow, the second substrate portions 53A, 53B, 53C, 53D, 53E are at times denoted as second substrate portions 53A to 53E.

The first substrate portion 52 differs from the first substrate portion 12 on the point of a plurality of through holes 52a being formed in the first substrates $P_{12, i}$.

The second substrate portions 53A to 53E differ from the second substrate portions 13A to 13E on the point of a plurality of through holes 53a being formed in each of the second substrates $Q_{13A}$, $Q_{13B}$, $Q_{13C}$, $Q_{13D}$, $Q_{13E}$.

For this reason, the circuit substrate 61 can be put in a folded state and an unfolded state similarly to the circuit substrate 21 of the second exemplary embodiment.

In the present exemplary embodiment, as an example, four through holes 52a, 53a are formed in each substrate. The internal diameters of the through holes 52a, 53a are all the same.

The positions in plan view of the through holes 52a, 53a are provided to agree in the folded state of the circuit substrate 61. For example, the through holes 52a, 53a are provided in the same positional relationship with respect to the corner portions of the substrates in which the through holes 52a, 53a are formed.

As shown in FIG. 18, the first layered body 62 includes a heatsink 30A in place of the heatsink 30 of the third exemplary embodiment.

As shown in FIG. 20, the heatsink 30A differs from the heatsink 30 on the point of a plurality of through holes 30c being formed in the layered body insertion portion 30a of each heatsink 30A.

In the present exemplary embodiment, four through holes 30c are formed in the heatsink 30.

The internal diameter of the through hole 30c is the same as the through hole 52a. When inserted between the substrates in the folded state of the circuit substrate 61, the through hole 30c is provided so that the position in plan view agrees with the through hole 52a.

As shown in FIG. 18, the guide rod 64 has an outer diameter that enables insertion in the through holes 52a, 30c, 53a in the circuit substrate 51 in a folded state (the illustration of the through holes 30c, 53a are omitted). Moreover, the guide rod 64 has a length equal to or greater than the height of the electronic component 61A.

As described below, the guide rod 64 is capable of moving in the insertion direction during the manufacturing process of the electronic component 61A.

In the present exemplary embodiment, the guide rod 64 is fixed to at least one of the first layered body 62 and the second layered body 63 in the completed electronic component 61A. However, the guide rod 64 may also be detachably fixed to the completed electronic component 61A.

Examples of the fixing means of the guide rod 64 include adhesion and a retaining ring.

The method of manufacturing the electronic component 61A of the present exemplary embodiment will be described.

Figure 21:
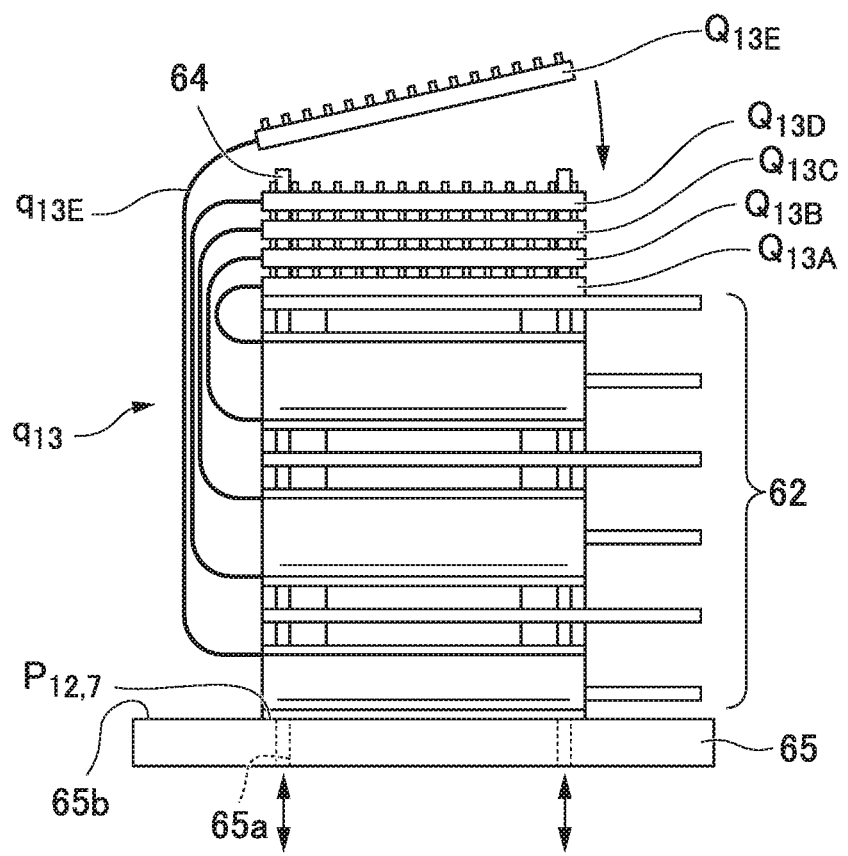
FIG. 21 is a process description diagram showing an example of the method of manufacturing the electronic component of the fifth exemplary embodiment of the present invention.

FIG. 21 is a process description figure showing an example of the method of manufacturing the electronic component of the fifth exemplary embodiment of the present invention.

To manufacture the electronic component 61A, the steps S11 to S15 shown in FIG. 12 are executed on the basis of the flowchart shown in FIG. 12.

The method of manufacturing the electronic component of the present exemplary embodiment differs from the method of manufacturing the electronic component of the second exemplary embodiment on the point of positioning in plan view being performed by the guide rod 64.

The description below will focus on the points of difference with the second exemplary embodiment.

Step S11 is a step for preparing the circuit substrate 61.

For example, the through holes 52a, 53a are formed in the substrate 11. Afterward, the circuit substrate 61 is prepared similarly to the second exemplary embodiment.

This concludes Step S11.

After Step S11, Step S12 is performed. Step S12 is a step for forming the first layered body 62.

As shown in FIG. 21, the guide rod 64 and an assembly base 65 are used in Step S12. Through holes 65a are formed in the assembly base 65 in the same number and at the same arrangement positions as the through holes 52a. The guide rod 64 is inserted in each through hole 65a.

The guide rod 64 is supported by a driving device, not illustrated, so that the projection amount from a surface 65b of the assembly base 65 can be changed.

First, each guide rod 64 is projected from the surface 65b up to a height of at least the thickness of the first substrate $P_{12, 7}$. Then, the first substrate $P_{12, 7}$ is placed on the surface 65b so that each guide rod 64 is inserted in the through hole 52a. Thereby, the position in the horizontal direction of the first substrate $P_{12, 7}$ is determined.

Afterward, as needed, the heatsink 30A is placed on the first substrate $P_{12, 7}$ in the state of the projection amount of the guide rods 64 having been increased. The heatsink 30A is positioned in the horizontal direction by the guide rods 64 being inserted in the respective through holes 30c.

Afterward, as needed, the first coupling portion $p_{67}$ is folded in the state of the respective projection amounts of the guide rods 64 having been increased. When the rotation amount of the first substrate $P_{12, 6}$ approaches 180°, the guide rods 64 can be inserted in the respective through holes 52a of the first substrate $P_{12, 6}$. The first substrate $P_{12, 6}$ is positioned as needed in the horizontal direction so that the guide rods 64 are inserted in the respective through holes 52a, and thereby stacked on the first substrate $P_{12, 7}$.

Thereby, the first substrate $P_{12, 6}$ is stacked on the first substrate $P_{12, 7}$ in a state positioned in the horizontal direction.

In this way, the placement of the heatsink 30A and the folding of the remaining first coupling portions $p_{mM}$ are successively repeated. As a result, as shown in FIG. 21, the first layered body 62 is formed in the state of being skewered by the guide rods 64.

This concludes Step S12.

After Step S12, Steps S13 and S14 are performed.

Steps S13 and S14 are performed similarly to Steps S3 and S4 in the second exemplary embodiment, except for the point of the guide rods 64, which are projected from below, being inserted into the through holes 53a in the second substrates $Q_{13A}$, $Q_{13B}$, $Q_{13C}$, $Q_{13D}$, $Q_{13E}$, similarly to Step S11.

That is, in Steps S13 and S14, the positioning operation of the second substrates $Q_{13A}$, $Q_{13B}$, $Q_{13C}$, $Q_{13D}$, $Q_{13E}$ is performed using the guide rods 64.

FIG. 21 illustrates the appearance after the folding of the second coupling portion $q_{13E}$ and immediately before the second substrate $Q_{13E}$ is stacked on the second substrate $Q_{13D}$.

This concludes Steps S13 and S14.

After Step S14, Step S15 is performed. Step S15 is a step in which the first layered body 62 and the second layered body 63 are mutually connected electrically.

Step S15 is performed similarly to Step S5 in the second exemplary embodiment.

In doing so, the electrical connection may be performed with the circuit substrate 61, in a folded state, removed from the assembly base 65 together with the guide rods 64. Alternatively, the electrical connection may be performed in the state of the circuit substrate 61, in a folded state, positioned on the assembly base 65. In either case, the guide rods 64 are inserted in the through holes 52a, 30c, 53a. For this reason, the positional relation of the first layered body 62 and the second layered body 63 in plan view is maintained similarly to when assembled.

When the soldering is completed, anchoring of the guide rods 64 is performed as needed. Thereby, the electronic component 61A as shown in FIG. 18 is formed.

This concludes Step S15.

As described above, the electronic component 61A, which is approximately similar to the electronic component 31A of the third exemplary embodiment, is manufactured by the circuit substrate 61, the heatsink 30A, and the guide rods 64.

The electronic component 61A has the same action as the electronic component 31A of the third exemplary embodiment.

Moreover, since the positioning in the horizontal direction of the substrates and heatsinks 30A is easily performed with the guide rods 64 during manufacture, manufacturing of the electronic component 61A is easier.

Since the electronic component 61A includes the guide rods 64, mounting to the master substrate 19 is easier.

For example, by setting the projection amount of the guide rod 64 from the second substrate $Q_{13E}$ to a suitable value, it is possible to impart the same function as the stopper 44 in the fourth exemplary embodiment to the guide rod 64.

For example, the guide rods 64 can be utilized as projections for positioning of the electronic component 61A on the master substrate 19 by concave portions or through holes capable of engagement with the guide rods 64 being provided in the master substrate 19.

Sixth Exemplary Embodiment

The sixth exemplary embodiment of the electronic component of the present invention will be described.

Figure 22:
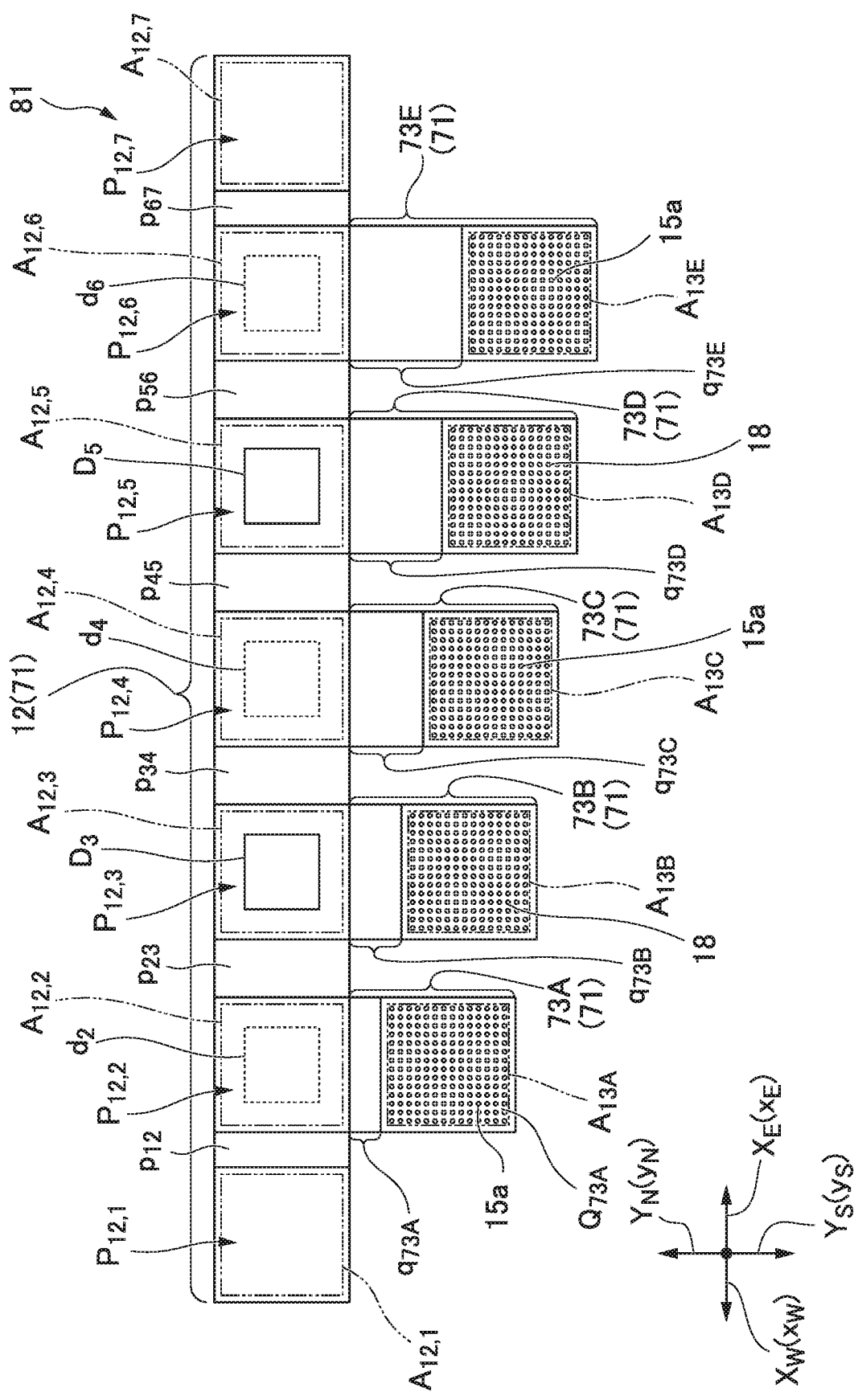
FIG. 22 is a schematic plan view showing an example of the circuit substrate of the sixth exemplary embodiment of the present invention.

FIG. 22 is a schematic plan view showing an example of the circuit substrate of the sixth exemplary embodiment of the present invention.

As shown in FIG. 22, a circuit substrate 81 of the present exemplary embodiment is constituted by providing a substrate 71 in place of the substrate 11 in the circuit substrate 21 of the second exemplary embodiment, and eliminating the electronic devices $D_2$, $d_3$, $D_4$, $d_5$, $D_6$.

The substrate 71 includes second substrate portions 73A, 73B, 73C, 73D, 73E in place of the second substrate portions 13A, 13B, 13C, 13D, 13E of the substrate 11 of the second exemplary embodiment. For simplicity, the second substrate portions 73A, 73B, 73C, 73D, 73E are at times denoted as second substrate portions 73A to 73E.

Hereinbelow, the sixth exemplary embodiment will be described focusing on the points of difference with the second exemplary embodiment.

The circuit substrate 81 is used for manufacturing a stacked-type electronic component in which an electronic device is mounted on each of the first substrates $P_{12,\,k}$. In the present exemplary embodiment, the electronic devices $d_2$, $D_3$, $d_4$, $D_5$, $d_6$ are mounted on the first substrates $P_{12,\,k}$.

In the folded state, the gaps between the first substrates $P_{12,\,k}$ may be reduced by the portions corresponding to the mounting heights of the electronic devices $D_2$, $d_3$, $D_4$, $d_5$, $D_6$ that are eliminated.

The second substrate portion 73A includes a second coupling portion $q_{73A}$ and a second substrate $Q_{73A}$ in place of the second coupling portion $q_{13A}$ and the second substrate $Q_{13A}$.

The second coupling portion $q_{73A}$ differs from the second coupling portion $q_{13A}$ on the point of the length being $L_{73A}$ and the point of wiring that carries data signals to the electronic device $d_2$ being provided.

The length $L_{73A}$ is the length obtained by subtracting the mounting height $h_{D2}$ from length $L_{13A}$.

The second substrate $Q_{73A}$ differs from the second substrate $Q_{13A}$ in terms of the number solder balls 18 and electrodes 15A, not illustrated, and 15a in accordance with the reduction of lead wires.

Similarly, the second substrate portion 73X (X=B, C, D, E. The same applies hereinbelow.) includes a second coupling portion $q_{73X}$, and a second substrate $Q_{73X}$ in place of the second coupling portion $q_{13X}$ and the second substrate $Q_{13X}$.

The second coupling portion $q_{73X}$ differs from the second coupling portion $q_{13X}$ on the point of the length being $L_{73X}$ and the number of lead wires.

The length $L_{73X}$ is the length obtained by subtracting the mounting heights of the eliminated electronic devices from the length $L_{13X}$.

The second substrate $Q_{73X}$ differs from the second substrate $Q_{13X}$ in terms of the number of solder balls 18 and electrodes 15A and 15a in accordance with the reduction of lead wires.

According to the circuit substrate 61, since the lengths of the second coupling portions $q_{13A}$, $q_{13B}$, $q_{13C}$, $q_{13D}$, $q_{13E}$ are optimized, in accordance with the eliminated electronic devices, when put in the folded state, the protrusion amount of the second coupling portions $q_{13A}$, $q_{13B}$, $q_{13C}$, $q_{13D}$, $q_{13E}$ can be inhibited. For this reason, according to the circuit substrate 61, it is possible to reduce the size of an electronic component that uses the circuit substrate 61.

Seventh Exemplary Embodiment

The circuit substrate, electronic component, and electronic component assembly of the seventh exemplary embodiment of the present invention will be described.

Figure 23:
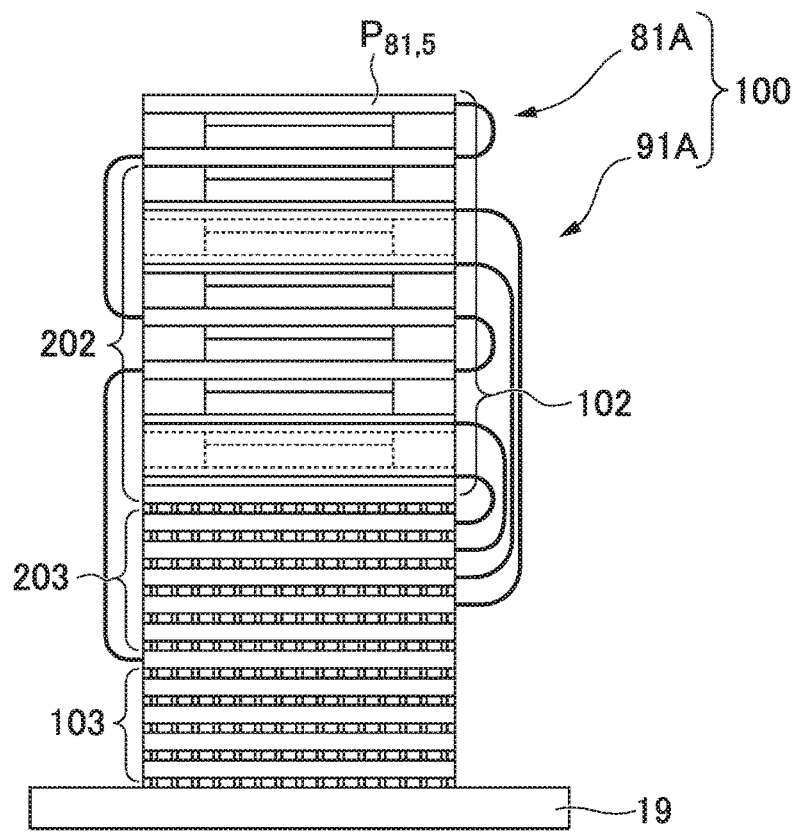
FIG. 23 is a schematic front view showing an example of the electronic component assembly of the seventh exemplary embodiment of the present invention.
Figure 24:
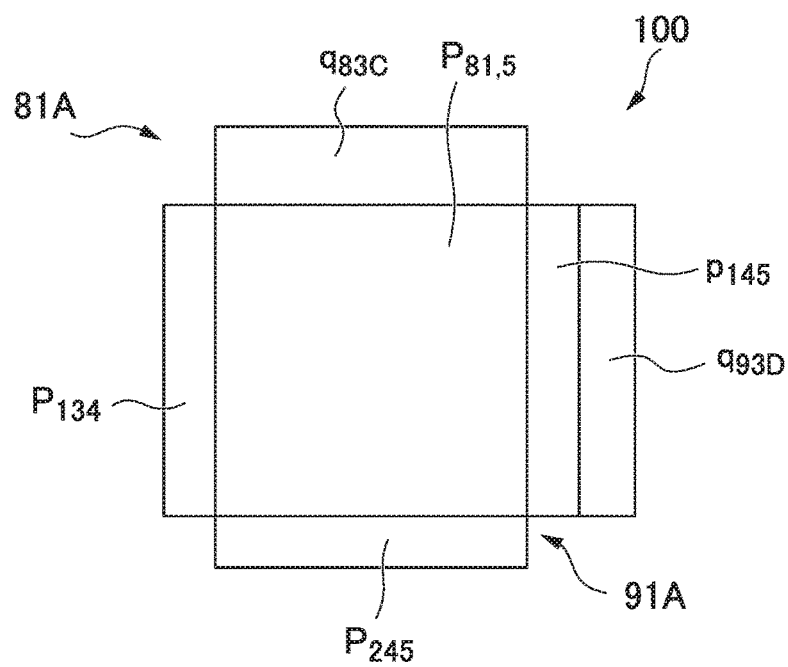
FIG. 24 is a schematic plan view showing an example of the electronic component assembly of the seventh exemplary embodiment of the present invention.
Figure 25A:
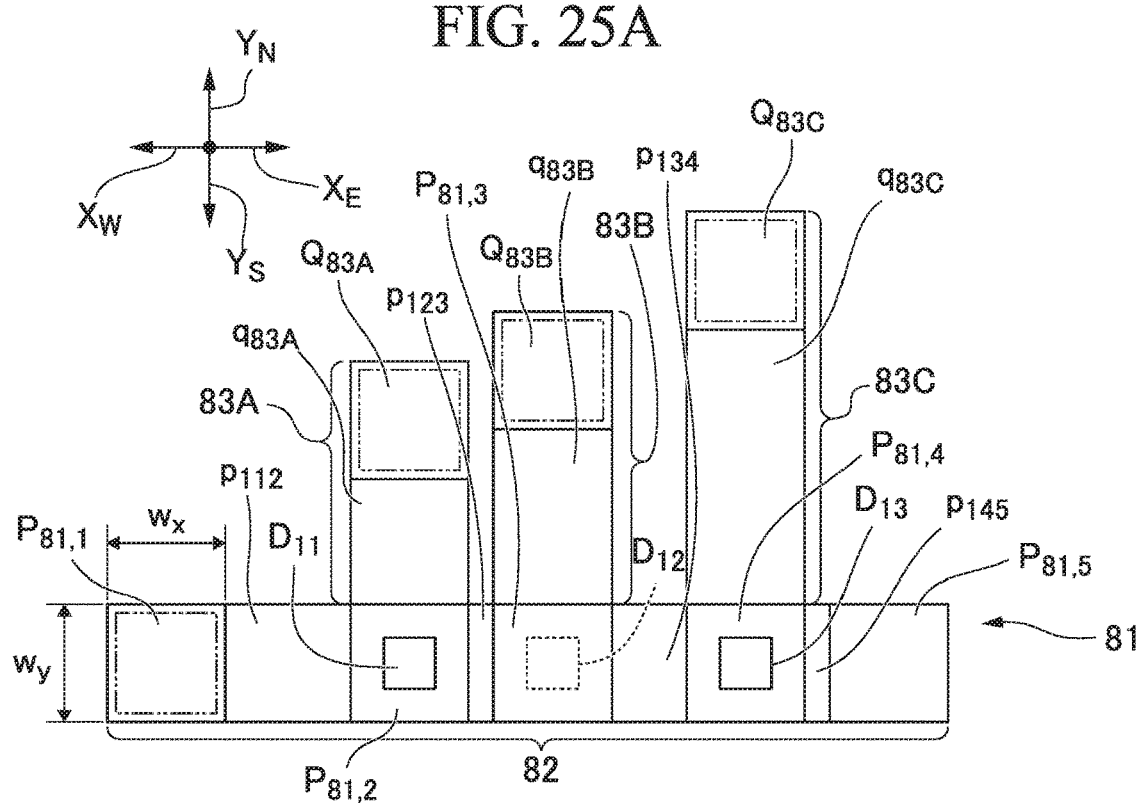
FIG. 25A is a schematic plan view showing an example of the circuit substrate used for the electronic component assembly of the seventh exemplary embodiment of the present invention.
Figure 25B:
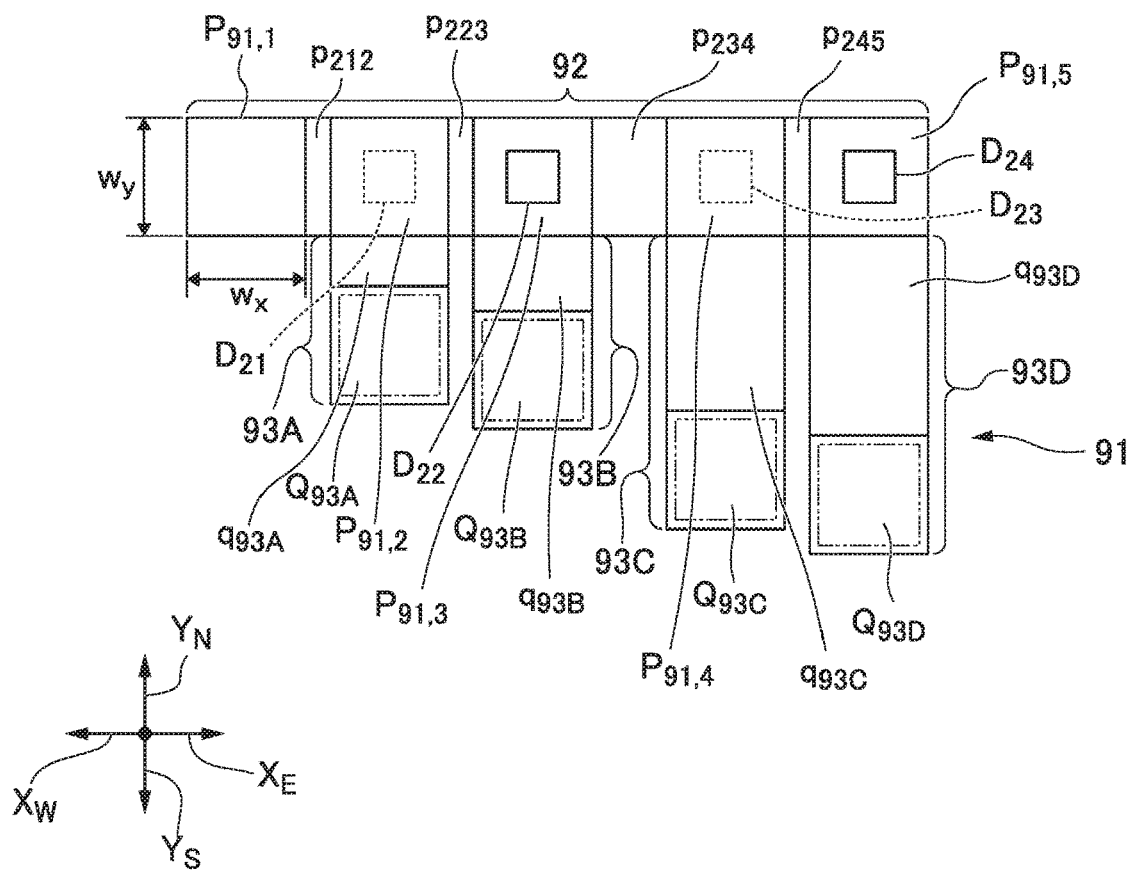
FIG. 25B is a schematic plan view showing an example of the circuit substrate used for the electronic component assembly of the seventh exemplary embodiment of the present invention.
Figure 26:
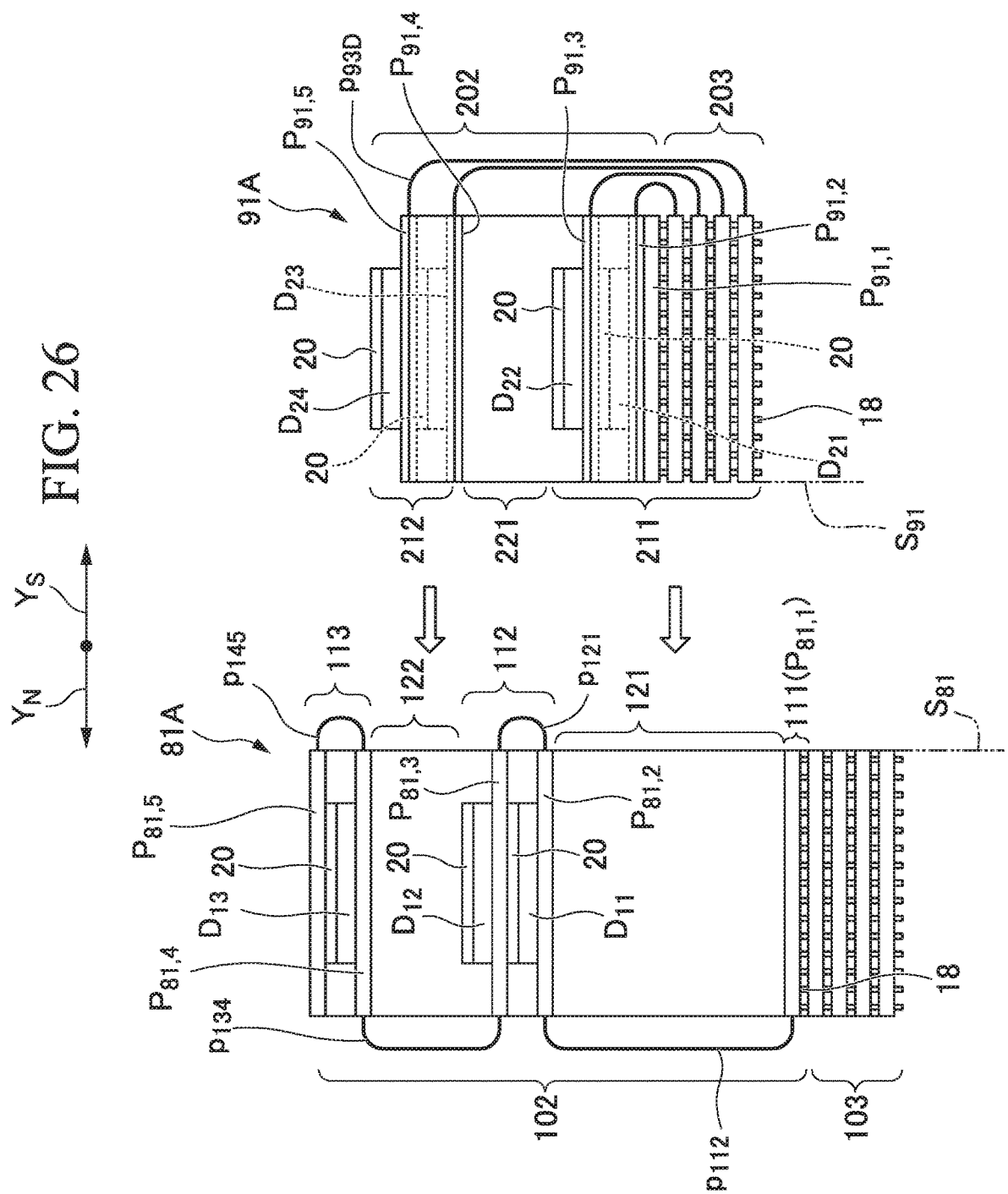
FIG. 26 is a process description diagram showing an example of the method of manufacturing the electronic component assembly of the seventh exemplary embodiment of the present invention.

FIG. 23 is a schematic front view showing an example of the electronic component assembly of the seventh exemplary embodiment of the present invention. FIG. 24 is a schematic plan view showing an example of the electronic component assembly of the seventh exemplary embodiment of the present invention. FIGS. 25A and 25B are schematic plan views showing an example of the circuit substrate used for the electronic component assembly of the seventh exemplary embodiment of the present invention. FIG. 26 is a process description figure showing an example of the method of manufacturing the electronic component assembly of the seventh exemplary embodiment of the present invention.

As shown in FIGS. 23 and 24, an electronic component assembly 100 of the present invention is constituted by the assembly of a first electronic component 81A and a second electronic component 91A.

The first electronic component 81A includes a first layered body 102 and a second layered body 103.

The second electronic component 91A includes a first layered body 202 and a second layered body 203.

In the electronic component assembly 100, the first layered bodies 102 and 202 and the second layered bodies 103 and 203 are stacked in the state of being mutually interlaced.

FIGS. 25A and 25B show the circuit substrates 81 and 91 in the unfolded state for manufacturing the first electronic component 81A and the second electronic 91A.

The circuit substrate 81 includes a first substrate portion 82 and second substrate portions 83A, 83B, 83C.

In the first substrate portion 82, the first substrates $P_{81,\,j}$ (j=1, . . . , 5. The same applied hereinbelow.) are arrayed in the order of the subscript j in the direction $X_E$. The shape and material of the first substrates $P_{81,\,j}$ are the same as the first substrates $P_{12,\,i}$ in the second exemplary embodiment.

The first substrates $P_{81,\,1}$, $P_{81,\,2}$ are connected by a first coupling portion $p_{112}$. The first substrates $P_{81,\,2}$, $P_{81,\,3}$ are connected by a first coupling portion $p_{123}$. The first substrates $P_{81,\,3}$, $P_{81,\,4}$ are connected by a first coupling portion $p_{134}$. The first substrates $P_{81,\,4}$, $P_{81,\,5}$ are connected by a first coupling portion $p_{145}$.

Electronic devices $D_{11}$, $D_{12}$, $D_{13}$ are respectively mounted on the facing surface, rear surface, and facing surface, in the figure, of the first substrates $P_{81,\,2}$, $P_{81,\,3}$, $P_{81,\,4}$. The same constitution as that of the electronic device $D_2$ in the second exemplary embodiment may for example be used for the electronic devices $D_{11}$, $D_{12}$, $D_{13}$.

The first substrates $P_{81,\,1}$ and $P_{81,\,5}$ have the same constitution as the first substrates $P_{12,\,2}$ and $P_{12,\,7}$ in the second exemplary embodiment, respectively. The number of electrodes 15a, 15A, not illustrated, in the first substrate $P_{81,\,1}$ may differ from the first substrate $P_{12,\,2}$.

The first coupling portions $p_{112}$, $p_{123}$, $p_{112}$, $p_{134}$, $p_{145}$ are constituted similarly to the first coupling portion $p_{12}$ in the second exemplary embodiment, other than the lengths in the direction $X_E$ being different.

The length of the first coupling portion $p_{112}$ is a length that enables the formation of a gap 121 described below (refer to FIG. 26).

The length of the first coupling portion $p_{123}$ is longer than the sum of the connection heights with the first substrates $P_{81,2}$, $P_{81,3}$ and the mounting height of the electronic device $D_{11}$.

The length of the first coupling portion $p_{134}$ is a length that enables the formation of a gap 122 described below (refer to FIG. 26).

The length of the first coupling portion $p_{145}$ is longer than the sum of the connection heights with the first substrates $P_{81,4}$, $P_{81,5}$ and the mounting height of the electronic device $D_{13}$.

The second substrate portion 83A (83B, 83C) is connected to the side portion of the first substrate $P_{81,2}$ ($P_{81,3}$, $P_{81,4}$) on the direction $Y_N$ side. The second substrate portion 83A (83B, 83C) extends in the direction $Y_N$.

The second substrate portion 83A (83B, 83C) is provided, in the direction $Y_N$, with a second coupling portion $q_{83A}$ ($q_{83B}$, $q_{83C}$) and a second substrate $Q_{83A}$ ($Q_{83B}$, $Q_{83C}$) in this order.

The second coupling portion $q_{83A}$ ($q_{83B}$, $q_{83C}$) is constituted similarly to the second coupling portion $q_{134}$ in the second exemplary embodiment, other than the length in the direction $Y_N$ differing.

The lengths in the direction $Y_N$ of the second coupling portions $q_{83A}$, $q_{83B}$, $q_{83C}$ are lengths that can be stacked in this order below the first substrate $P_{81,1}$ in the folded state. The lengths in the direction $Y_N$ of the second coupling portions $q_{83A}$, $q_{83B}$, $q_{83C}$ are progressively longer in this order in direction $X_E$.

The second substrates $Q_{83A}$, $Q_{83B}$, $Q_{83C}$ are constituted similarly to the second substrates $Q_{13A}$, $Q_{13B}$, $Q_{13C}$ in the second exemplary embodiment, except for the number of electrodes.

Although omitted in the figure, the same wiring as the first wiring 16 in the second exemplary embodiment is provided in the first substrate portion 82, excluding the number of lead wires. The same wirings as the first wirings 17A, 17B, 17C in the second exemplary embodiment are provided in the second substrates 83A, 83B, 83C, excluding the number of lead wires.

The circuit substrate 91 includes the first substrate portion 92 and the second substrate portions 93A, 93B, 93C, 93D.

In the first substrate portion 92, the first substrates $P_{91,j}$ are arrayed in the order of the subscript j in the direction $X_E$. The shape and material of the first substrates $P_{91,j}$ are the same as the first substrates $P_{12,i}$ in the second exemplary embodiment.

The first substrates $P_{91,1}$, $P_{91,2}$ are connected by the first coupling portion $p_{212}$. The first substrates $P_{91,2}$, $P_{91,3}$ are connected by the first coupling portion $p_{223}$. The first substrates $P_{91,3}$, $P_{91,4}$ are connected by the first coupling portion $p_{234}$. The first substrates $P_{91,4}$, $P_{91,5}$ are connected by the first coupling portion $p_{245}$.

Electronic devices $D_{21}$, $D_{22}$, $D_{23}$, $D_{24}$ are respectively mounted on the rear surface, facing surface, rear surface, and facing surface, in the figure, of the first substrates $P_{91,2}$, $P_{91,3}$, $P_{91,4}$, $P_{91,5}$. For example, the same constitution as that of the electronic device $D_2$ in the second exemplary embodiment may be used for the electronic devices $D_{21}$, $D_{22}$, $D_{23}$, $D_{24}$.

The first substrate $P_{91,1}$ has the same constitution as the first substrate $P_{12,1}$ in the second exemplary embodiment. However, the number of electrodes 14, not illustrated, in the first substrate $P_{91,1}$ may differ from the first substrate $P_{12,1}$. The assignment of pins to electrodes is carried out so as to match the pin assignment of the first layered body 102 in the first electronic component 81A when assembled.

The first coupling portions $p_{212}$, $p_{223}$, $p_{234}$, $p_{245}$ are constituted similarly to the first coupling portion $p_{12}$ in the second exemplary embodiment, other than the lengths in the direction $X_E$ being different.

The length of the first coupling portion $p_{212}$, is longer than the sum of the connection heights with the first substrates $P_{91,1}$, $P_{91,2}$.

The length of the first coupling portion $p_{223}$ is longer than the sum of the connection heights with the first substrates $P_{91,2}$, $P_{91,3}$ and the mounting height of the electronic device $D_{21}$.

The length of the first coupling portion $p_{234}$ is a length that enables the formation of a gap 221 described below (refer to FIG. 26).

The length of the first coupling portion $p_{245}$ is longer than the sum of the connection heights with the first substrates $P_{91,4}$, $P_{91,5}$ and the mounting height of the electronic device $D_{23}$.

The second substrate portion 93A (93B, 93C, 93D) is connected to the side portion of the first substrate $P_{91,2}$ ($P_{91,3}$, $P_{91,4}$, $P_{91,5}$) on the direction $Y_S$ side. The second substrate portion 93A (93B, 93C, 93D) extends in the direction $Y_S$.

The second substrate portion 93A (93B, 93C, 93D) is provided, in the direction $Y_S$, with a second coupling portion $q_{93A}$ ($q_{93B}$, $q_{93C}$, $q_{93D}$) and a second substrate $Q_{93A}$ ($Q_{93B}$, $Q_{93C}$, $Q_{93D}$) in this order.

The second coupling portion $q_{93A}$ ($q_{93B}$, $q_{93C}$, $q_{93D}$) is constituted similarly to the second coupling portion $q_{134}$ in the second exemplary embodiment, other than the length in the direction $Y_S$ differing.

The lengths in the direction $Y_S$ of the second coupling portions $q_{93A}$, $q_{93B}$, $q_{93C}$, $q_{93D}$ are lengths that can be stacked in this order below the first substrate $P_{91,1}$ in the folded state. The lengths in the direction $Y_S$ of the second coupling portions $q_{93A}$, $q_{93B}$, $q_{93C}$, $q_{93D}$ are progressively longer in this order in direction $X_E$.

The second substrates $Q_{93A}$, $Q_{93B}$, $Q_{93}$c, $Q_{93D}$ are constituted similarly to the second substrates $Q_{13A}$, $Q_{13B}$, $Q_{13C}$, $Q_{13D}$ in the second exemplary embodiment, except for the number of electrodes. However, the assignment of pins to electrodes is carried out so as to match the pin assignment of the second layered body 103 in the first electronic component 81A when assembled.

Although omitted in the figure, the same wiring as the first wiring 16 in the second exemplary embodiment is provided in the first substrate portion 92, excluding the number of lead wires. The same wirings as the first wirings 17A, 17B, 17C, 17D in the second exemplary embodiment are provided in the second substrates 93A, 93B, 93C, 93D excluding the number of lead wires.

As shown in FIG. 26, by putting the circuit substrates 81, 91 in folded states, the first electronic component 81A and the second electronic component 91A are obtained. However, gaps 121, 122 (221) are formed in the first layered body 102 (202) in the first electronic component 81A (second electronic component 91A), unlike the first layered body 22 in the second exemplary embodiment.

The directions $Y_N$, $Y_S$ shown in FIG. 26 are the same as the directions $Y_N$, $Y_S$ in the circuit substrates 81, 91 depicted in the unfolded state in FIGS. 25A, 25B.

The gap 121 is a layer-shaped gap that is sandwiched by layered portions 111, 112.

The layered portion 111 includes the first substrate $P_{81,1}$. The layered portion 112 includes the first substrates $P_{81,2}$, $P_{81,3}$ and the electronic devices $D_{11}$, $D_{12}$.

Here, unless otherwise stated, the solder balls 18 and joining layers 20 respectively provided in the substrates and electronic devices are included in the layered portions 111, 112 (with the same being true for subsequent layered portions).

The gap 122 is a layer-shaped gap that is sandwiched by layered portions 112, 113.

The layered portion 113 includes the first substrates $P_{81,4}$, $P_{81,5}$ and the electronic device $D_{13}$.

The gaps 121, 122 open to at least the side surface $S_{81}$ facing the direction $Y_S$. The opening width of the gaps 121, 122, in the depth direction of the figure, is equivalent to the dimension $w_x$ of the first substrate $P_{81,j}$ in the depth direction of the figure.

The gap 221 opens to at least the side surface $S_{91}$ facing the direction $Y_N$. The opening width of the gap 221, in the depth direction of the figure, is equivalent to the dimension $w_x$ of the first substrate $P_{91,j}$ in the depth direction of the figure.

The gap 221 is a layer-shaped gap that is sandwiched by layered portions 211, 212.

The layered portion 211 includes the second layered body 203, the first substrates $P_{91,1}$, $P_{91,2}$, $P_{91,3}$, and the electronic devices $D_{21}$, $D_{22}$. The layered portion 112 includes the first substrates $P_{81,2}$, $P_{81,3}$ and the electronic devices $D_{11}$, $D_{12}$.

The layered portion 212 includes the first substrates $P_{91,4}$, $P_{91,5}$ and the electronic devices $D_{23}$, $D_{24}$.

The thickness of the gap 121 (the smallest gap that is formed when the layered portions 111, 112 are separated to a maximum degree) is the size that enables insertion in the direction $Y_N$ of the layered portion 211.

The thickness of the gap 122 (the smallest gap that is formed when the layered portions 112, 113 are separated to a maximum degree) is the size that enables insertion in the direction $Y_N$ of the layered portion 212.

The first electronic component 81A and second electronic component 91A having such constitutions are manufactured similarly to the electronic component 21A of the second exemplary embodiment.

In the present exemplary embodiment, the gaps 121, 122, 221 need to be formed when putting the circuit substrates 81, 91 into a folded state. For that reason, the circuit substrates 81, 91 may be folded in the state of for example gap regulating members having the same thickness as the gaps 121, 122, 221 being sandwiched between the layered portions. The gap regulating members are sandwiched between the layered portions in the same manner that the heatsink 30 is sandwiched in the manufacturing step of the third exemplary embodiment.

The gap regulating members are removed before assembling the electronic component assembly 100.

To assemble the electronic component assembly 100, the first electronic component 81A and the second electronic component 91A are oppositely arranged so that the respective side surfaces $S_{81}$, $S_{91}$ face each other. Then, the first electronic component 81A and the second electronic component 91A undergo relative displacement so as to approach each other from opposite directions, whereby the layered portions 211, 212 are respectively inserted in the gaps 121, 122.

After the completion of the insertion, a step of electrically connecting the first electronic component 81A and the second electronic component 91A to each other is carried out. For example, upon the curing of each adhesive layer 20, the first layered bodies 102, 202 are connected to each other. For example, the second layered body 203 is electrically connected with the second layered body 103 via the first substrate $P_{81,1}$ by soldering of the solder balls 18.

This concludes the manufacturing of the electronic component assembly 100.

The electronic component assembly 100 of the present exemplary embodiment is constituted by the first electronic component 81A and the second electronic component 91A.

According to the first electronic component 81A and the second electronic component 91A of the present exemplary embodiment, similarly to the second exemplary embodiment, it is possible to achieve a mounting space savings even if the mounted quantity of electronic devices is increased, and manufacturing is also easy.

In particular, in the present exemplary embodiment, wires common to all the electronic devices are distributed between the first electronic component 81A and the second electronic component 91A. For this reason, compared to the case of for example mounting the same number of electronic devices as the electronic component assembly 100 on a single substrate, arrangement of wires common to the electronic devices is easy. As a result, a reduction in the size of the electronic component assembly 100 is possible. Alternatively, according to the electronic component assembly 100, compared to the case of mounting electronic devices on one substrate, it becomes possible to mount more electronic devices on the same mounting surface area.

Moreover, according to the electronic component assembly 100 it is possible to reduce the wiring length of wires common to the electronic devices.

In particular, according to the electronic component assembly 100, since the wiring substrate folding step is performed separately on the wiring circuit substrates 81, 91, compared to the case of folding a wiring substrate in which the same number of electronic devices are mounted on a single substrate, manufacturing is easier.

Eighth Exemplary Embodiment

The substrate of the eighth exemplary embodiment of the present invention will be described.

Figure 27:
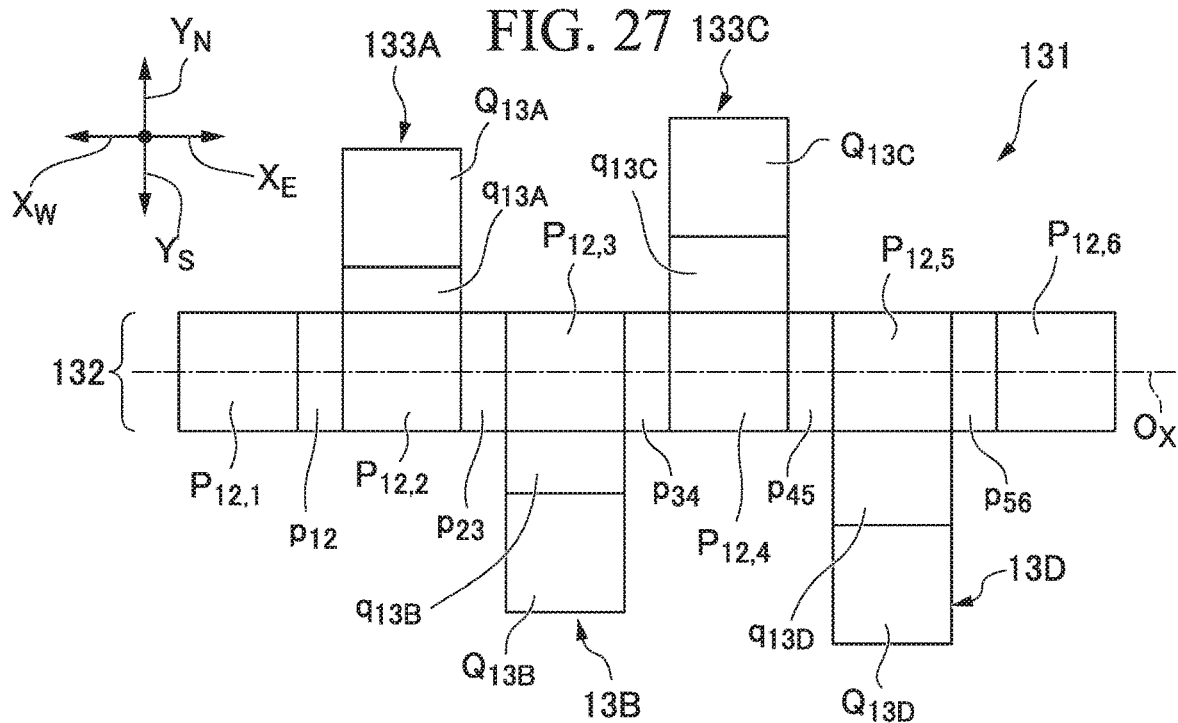
FIG. 27 is a schematic plan view showing an example of the substrate of the eighth exemplary embodiment of the present invention.

FIG. 27 is a schematic plan view showing an example of the substrate of the eighth exemplary embodiment of the present invention.

The present exemplary embodiment is a modification of the constitution of the substrate 11 of the second exemplary embodiment. For this reason, only the points of difference with the second exemplary embodiment will be described, focusing on the arrangement of the first substrate and the second substrate.

As shown in FIG. 27, a substrate 131 of the present exemplary embodiment includes a first substrate portion 132, and second substrate portions 133A, 13B, 133C and 13D.

The first substrate portion 132 is constituted by eliminating the first coupling portion $p_{67}$ and the first substrate $P_{12,7}$ of the first substrate portion 12 in the second exemplary embodiment.

The second substrate portion 133A is constituted by inverting the connection direction of the second substrate portion 13A in the second exemplary embodiment. That is, the second substrate portion 133A is connected to the side portion of the first substrate $P_{12,2}$ in the direction $Y_N$, with the direction $Y_N$ serving as the connection direction.

The second substrate portion 133A includes a second coupling portion $q_{13A}$ and a second substrate $Q_{13A}$, similarly to the second exemplary embodiment.

The second substrate portion 133C is constituted by inverting the connection direction of the second substrate portion 13C in the second exemplary embodiment. That is, the second substrate portion 133C is connected to the side portion of the first substrate $P_{12, 4}$ in the direction $Y_N$, with the direction $Y_N$ serving as the connection direction.

With the substrate 131 having such a constitution, it is possible to constitute a circuit substrate in which the electronic devices $D_k$, $d_k$ are mounted on the first substrates $P_{12, k}$. This circuit substrate can form a folded state similarly to the second exemplary embodiment. However, in this case while the second coupling portions $q_{13B}$, $q_{13D}$ project in the direction $Y_S$, the second coupling portions $q_{13A}$, $q_{13C}$ project in the direction $Y_N$.

The present exemplary embodiment is an example that indicates being able to appropriately change the connection direction of the second substrates when the coupling path of the first substrates follows a straight line.

Ninth Exemplary Embodiment

The substrate of the ninth exemplary embodiment of the present invention will be described.

Figure 28:
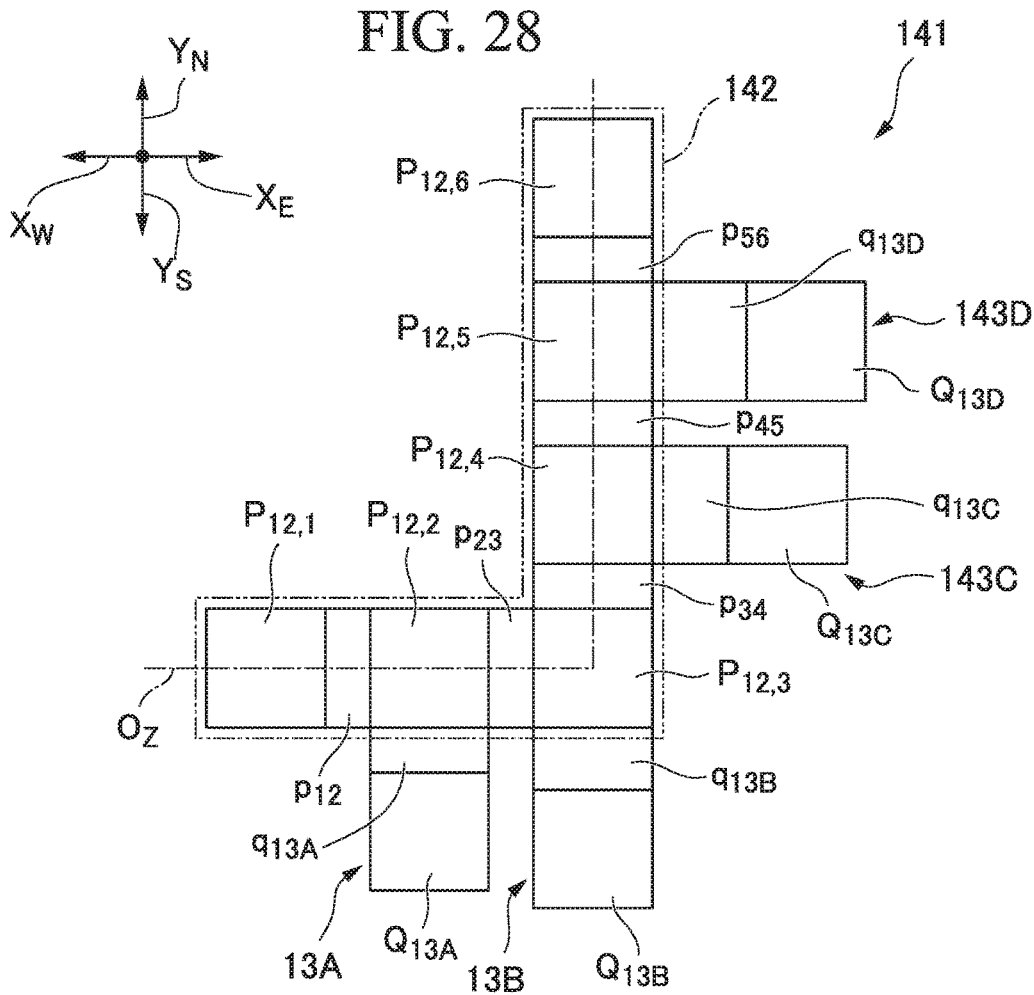
FIG. 28 is a schematic plan view showing an example of the substrate of the ninth exemplary embodiment of the present invention.

FIG. 28 is a schematic plan view showing an example of the substrate of the ninth exemplary embodiment of the present invention.

As shown in FIG. 28, a substrate 141 of the present exemplary embodiment includes a first substrate portion 142 and second substrate portions 13A, 13B, 143C, 143D in place of the first substrate portion 132 and the second substrate portions 133A, 133C, 13D in the substrate 131 of the eighth exemplary embodiment.

Hereinbelow, the ninth exemplary embodiment will be described, focusing on the points of difference with the eighth exemplary embodiment.

In the first substrate portion 142, a first substrate $P_{12, 1}$, a first coupling portion $p_{12}$, a first substrate $P_{12, 2}$, and a first coupling portion $p_{23}$ are arranged in this order in the direction $X_E$. Moreover, in the first substrate portion 142, a first substrate $P_{12, 3}$, a first coupling portion $p_{34}$, a first substrate $P_{12, 4}$, a first coupling portion $p_{45}$, a first substrate $P_{12, 5}$, a first coupling portion $p_{56}$, and a first substrate $P_{12, 6}$ are arranged in this order in the direction $Y_N$.

For this reason, in the first substrate portion 142, the first substrates $P_{12, k}$ are mutually coupled along a coupling path that follows the L-shaped axis $O_Z$ that extends in the direction $X_E$ and the direction $Y_N$. The axis $O_Z$ is also called the first axis.

The second substrate portion 143C (143D) includes the same constitution as the second substrate portion 13C (13D) in the second exemplary embodiment. However, the second substrate portion 143C (143D) is extended in the direction $X_E$, which intersects the axis $O_Z$ passing through the first substrate $P_4$ ($P_5$). The second substrate portion 143C (143D) is connected to the side portion of the first substrate $P_{12, 4}$ ($P_{12, 5}$) on the direction $X_E$ side, with the direction $X_E$ serving as the connection direction.

With the substrate 141 having such a constitution, it is possible to constitute a circuit substrate in which the electronic devices Dk, dk are mounted on the first substrates $P_{12, k}$. This circuit substrate can form a folded state similarly to the second exemplary embodiment. However, in this case while the second coupling portions $q_{13A}$, $q_{13B}$ project to the direction $Y_S$, the second coupling portions $q_{13C}$, $q_{13D}$ project to the direction $X_E$.

The present exemplary embodiment is an example that indicates being able to appropriately change the connection direction of the second substrates when the coupling path of the first substrates follows a broken line.

Tenth Exemplary Embodiment

The substrate of the tenth exemplary embodiment of the present invention will be described.

Figure 29:
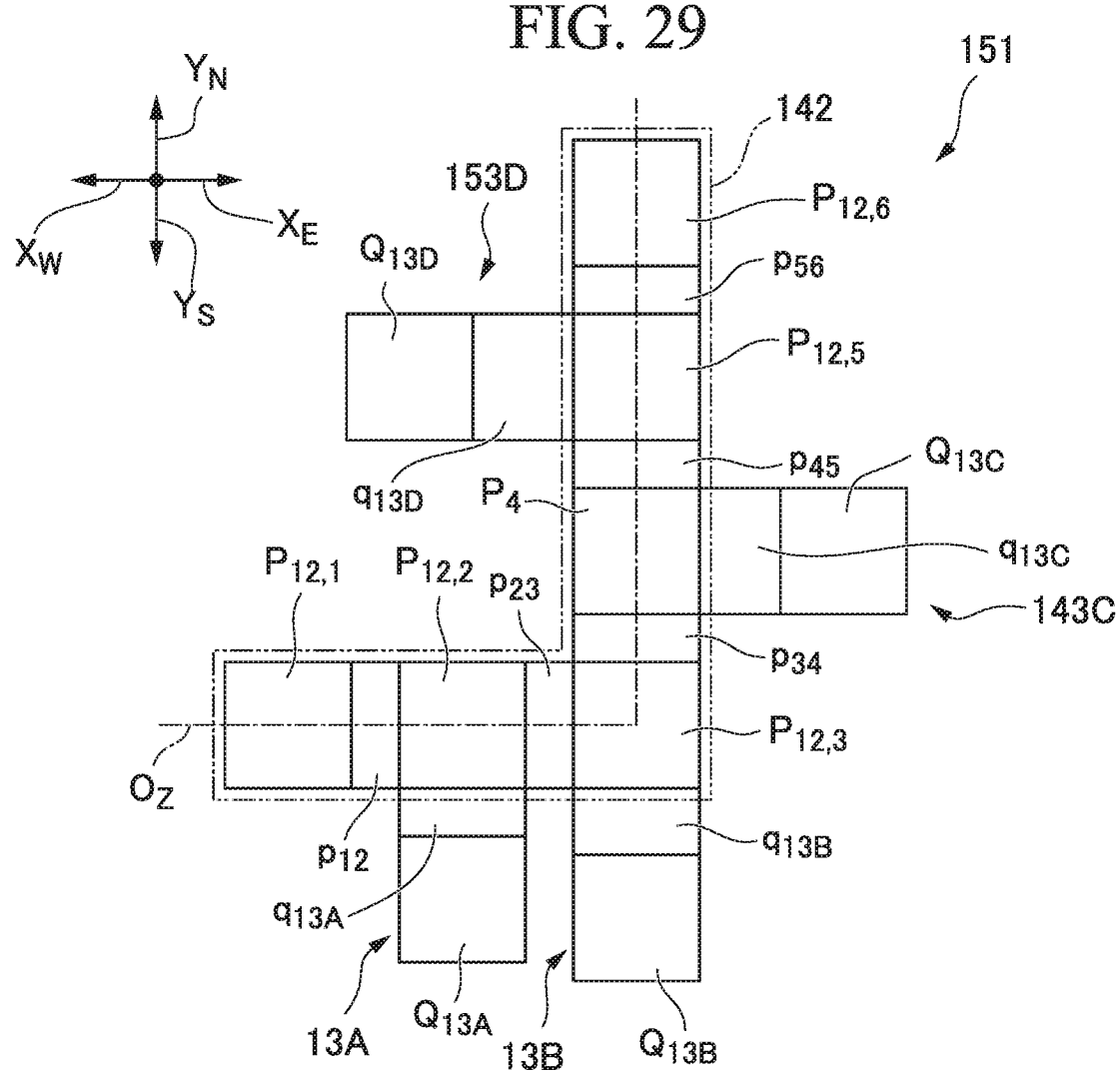
FIG. 29 is a schematic plan view showing an example of the substrate of the tenth exemplary embodiment of the present invention.

FIG. 29 is a schematic plan view showing an example of the substrate of the tenth exemplary embodiment of the present invention.

As shown in FIG. 29, a substrate 151 of the present exemplary embodiment includes a first substrate portion 153D in place of the first substrate portion 143D in the substrate 141 of the ninth exemplary embodiment.

Hereinbelow, the tenth exemplary embodiment will be described, focusing on the points of difference with the ninth exemplary embodiment.

The connection direction of the second substrate portion 153D differs from the second substrate portion 143D in the ninth exemplary embodiment. The second substrate portion 153D is extended in the direction $X_W$, which intersects the axis $O_Z$ passing through the first substrate $P_{12, 5}$. The second substrate portion 153D is connected to the side portion of the first substrate $P_{12, 5}$ on the direction $X_W$ side, with the direction $X_W$ serving as the connection direction.

With the substrate 151 having such a constitution, it is possible to constitute a circuit substrate in which the electronic devices Dk, dk are mounted on the first substrates $P_{12, k}$. This circuit substrate can form a folded state similarly to the second exemplary embodiment. However, in this case while the second coupling portions $q_{13A}$, gin project to the direction $Y_S$, the second coupling portions $q_{13C}$, $q_{13D}$ respectively project to the directions $X_E$ and $X_W$.

The present exemplary embodiment is an example that indicates being able to appropriately change the connection direction of the second substrates when the coupling path of the first substrates follows a broken line.

The arrangement of the electronic devices in the description of each exemplary embodiment is merely exemplary. Modifications, additions and deletions are possible as needed with respect to the arrangement of electronic devices. For example, electronic devices may also for example be mounted on the first substrates $P_{2,1}$, $P_{12, 1}$. For example, a first substrate in which an electronic device is mounted on both surfaces, and a first substrate in which an electronic device is mounted on one surface may be mixed together among the substrates.

In the descriptions of the exemplary embodiments, examples are described in which soldering is used as the electrical connection means of the first substrate and the second substrate. However, soldering is exemplary of the electrical connection means of the first substrate and the second substrate and not to be considered as limiting. For example, an electrically conductive adhesive may be used in place of soldering.

In the description of the second exemplary embodiment, the example is described of an electronic device being joined with the joining layer 20. Provided the folded state is maintained in the first layered body, an electronic device need not be joined with the joining layer 20. For example, if a presser is provided in the stacking direction of the first layered body, the folded state may be maintained. Examples of the pressing means include for example a screw stop, a clamper, and the like.

In the description of the third exemplary embodiment, the example is described of the guide rods 64 being affixed to the electronic component 61A. However, the guide rods 64 may be removed after the first layered body 62 and the second layered body 63 are mutually connected. That is, the electronic component 61A may be an electronic component in which the circuit substrate 61 is constituted in a folded state. In this case, the guide rods 64 may be used only for the manufacturing step of such an electronic component.

In the description of the third exemplary embodiment, the example is described of the guide rods 64 being inserted in the through holes 52a, 53a, 30c. However, a U-shaped groove, C-shaped groove, or V-shaped groove capable of engaging the guide rode 64 may be used in place of the through holes 52a, 53a, 30c.

In the description of the ninth and tenth exemplary embodiments, the example is described of the coupling path of the first substrate being an L-shaped broken line. However, the broken-line coupling path is not limited to an L shape. For example, the broken-line coupling path may have a zigzag shape.

While preferred exemplary embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An electronic component comprising:
    a plurality of first substrates that are connected in series along a coupling path;
    a second substrate that is connected with one first substrate of the plurality of first substrates;
    a first coupling portion that is configured to be bendable and couples two adjacent first substrates of the plurality of first substrates; and
    a second coupling portion that is configured to be bendable and couples the one first substrate and the second substrate,
    wherein the second substrate is in line with the one first substrate along a connection direction intersecting the coupling path,
    wherein the plurality of first substrates and the second substrate are configured to be foldable such that they are stacked,
    wherein at least one first substrate of the plurality of first substrates is configured such that an electronic device is capable of mounting on the at least one first substrate, and
    wherein the second coupling portion comprises a plurality of second coupling portions, and a length of a plurality of the second coupling portions gradually changes along the coupling path.

2. The electronic component according to claim 1, wherein the coupling path extends in a straight line.

3. The electronic component according to claim 2, wherein the second substrate comprises a plurality of second substrate, and each of the plurality of second substrates is connected with one of the plurality of the first substrates and is in line with the one of the plurality of first substrates along the connection direction.

4. The electronic component according to claim 1, wherein the second substrate comprises an electrode portion.

5. The electronic component according to claim 1,
    wherein each of the plurality of first substrates and the second substrate comprises a plurality of through holes extends in a thickness direction thereof, and
    in a state of the plurality of first substrates and the second substrate being folded so as to be stacked, the plurality of through holes of each of the plurality of first substrates and the second substrate overlap with each other in a stacking direction.

6. The electronic component according to claim 1, further comprising:
    an electronic device mounted on the first substrate.

7. The electronic component according to claim 6,
    wherein a circuit substrate is constituted at least by the plurality of first substrates, the second substrate, and the electronic device, and
    the circuit substrate is folded.

8. The electronic component according to claim 7,
    wherein each of the plurality of first substrates comprises a first wiring that transmits an address signal to the electronic device, and
    the second substrate comprises a second wiring for data communication with the electronic device.

9. An electronic component comprising:
    a plurality of first substrates that are connected in series along a coupling path;
    a second substrate that is connected with one first substrate of the plurality of first substrates; and
    an electronic device mounted on the first substrate,
    wherein the second substrate is in line with the one first substrate along a connection direction intersecting the coupling path,
    wherein the plurality of first substrates and the second substrate are configured to be foldable such that they are stacked,
    wherein a circuit substrate is constituted at least by the plurality of first substrates, the second substrate, and the electronic device,
    wherein the circuit substrate is folded,
    wherein a first layered body is constituted by the plurality of first substrates that are stacked in a stacking direction,
    wherein the second substrate comprises a plurality of the second substrates, and a second layered body is constituted by the plurality of the second substrates that are stacked, and
    wherein the circuit substrate is folded into a shape in which the second layered body is stacked on one end of the first layered body in the stacking direction.

10. The electronic component according to claim 9, wherein the second layered body comprises an interval maintaining member that is arranged between the second substrates arranged in a mutually stacked state and maintains an interval between the second substrates arranged in the mutually stacked state.

11. An electronic component comprising:
    a plurality of first substrates that are connected in series along a coupling path;
    a second substrate that is connected with one first substrate of the plurality of first substrates;
    a first coupling portion that is configured to be bendable and couples two adjacent first substrates of the plurality of first substrates;
    a second coupling portion that is configured to be bendable and couples the one first substrate and the second substrate; and
    an electronic device mounted on the first substrate,
    wherein the second substrate is in line with the one first substrate along a connection direction intersecting the coupling path, wherein the plurality of first substrates and the second substrate are configured to be foldable such that they are stacked, wherein at least one first substrate of the plurality of first substrates is configured such that an electronic device is capable of mounting on the at least one first substrate, wherein a circuit substrate is constituted at least by the plurality of first substrates, the second substrate, and the electronic device, wherein a first layered body is constituted by the plurality of first substrates that are stacked in a stacking direction, wherein the second substrate comprises a plurality of the second substrates, and a second layered body is constituted by the plurality of the second substrates that are stacked, wherein the circuit substrate is folded into a shape in which the second layered body is stacked on one end of the first layered body in the stacking direction, and wherein the second coupling portion faces one side surface of the first layered body and the second layered body.

* * * * *